United States Patent
Wakisaka et al.

(10) Patent No.: US 6,845,117 B2
(45) Date of Patent: Jan. 18, 2005

(54) SEMICONDUCTOR LASER DEVICE, SEMICONDUCTOR LASER MODULE, AND OPTICAL FIBER AMPLIFIER USING THE DEVICE OR MODULE

(75) Inventors: Tsuyoshi Wakisaka, Tokyo (JP); Naoki Tsukiji, Tokyo (JP); Junji Yoshida, Tokyo (JP); Toshio Kimura, Tokyo (JP); Shu Namiki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/287,037

(22) Filed: Nov. 4, 2002

(65) Prior Publication Data

US 2003/0086174 A1 May 8, 2003

(30) Foreign Application Priority Data

| Nov. 2, 2001 | (JP) | ................................... | 2001-338478 |
| Nov. 2, 2001 | (JP) | ................................... | 2001-338479 |
| Nov. 14, 2001 | (JP) | ................................... | 2001-349301 |
| Feb. 19, 2002 | (JP) | ................................... | 2002-042240 |
| Mar. 19, 2002 | (JP) | ................................... | 2002-077353 |
| Oct. 24, 2002 | (JP) | ................................... | 2002-310170 |
| Oct. 25, 2002 | (JP) | ................................... | 2002-310961 |

(51) Int. Cl.[7] ............................................. H01S 5/00
(52) U.S. Cl. ............................ 372/46; 372/45; 372/96
(58) Field of Search ............................ 372/45, 46, 96

(56) References Cited

U.S. PATENT DOCUMENTS

| 4,178,604 | A | * | 12/1979 | Nakamura et al. | ............ 372/96 |
| 5,659,562 | A | * | 8/1997 | Hisa | .............................. 372/96 |
| 6,175,581 | B1 | * | 1/2001 | Sato | .............................. 372/96 |
| 6,384,963 | B2 | | 5/2002 | Ackerman et al. | |
| 6,608,855 | B1 | * | 8/2003 | Hwang et al. | ................. 372/96 |

FOREIGN PATENT DOCUMENTS

| JP | 5-145194 | 6/1993 |
| JP | 10-79551 | 3/1998 |
| JP | 2000-332332 | 11/2000 |

OTHER PUBLICATIONS

P. Vavassori, et al., Technical Digest on Optical Amplifiers and their Applications, 3 pages, "New EDFA Pumping Scheme Insensitive to 980 NM Diode Lasers Temperature Variation", Jul. 2001.

* cited by examiner

*Primary Examiner*—Don Wong
*Assistant Examiner*—Cornelius H. Jackson
(74) *Attorney, Agent, or Firm*—Oblon, Spivak, McClelland, Maier & Neustadt, P.C.

(57) ABSTRACT

An n-side electrode, an n-substrate, an n-buffer layer, a GRIN-SCH-MQW active layer, a p-spacer, a p-cladding layer, a p-contact layer, and a p-side electrode are laminated one on top another in that order. Above the n-buffer layer, the GRIN-SCH-MQW layer and the p-spacer layer occupy a narrower area than the n-substrate in a direction that is at right angles to the laser emission direction, wherein the remaining area is occupied by a p-blocking layer and an n-blocking layer. Within the p-spacer layer are embedded a first diffraction grating and a second diffraction grating. Between the first and the second diffraction grating and the p-side electrode is provided a current non-injection area.

28 Claims, 64 Drawing Sheets

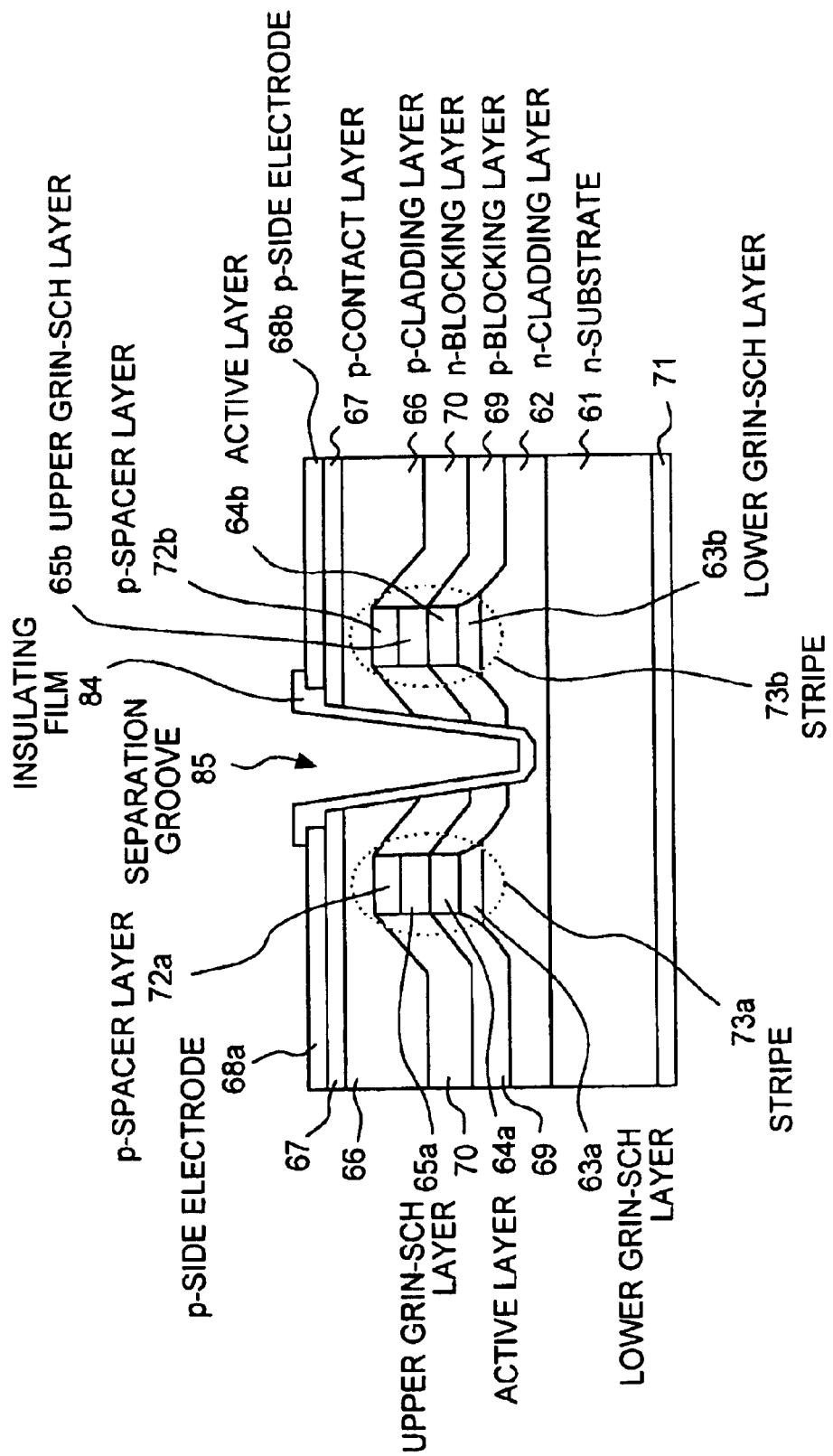

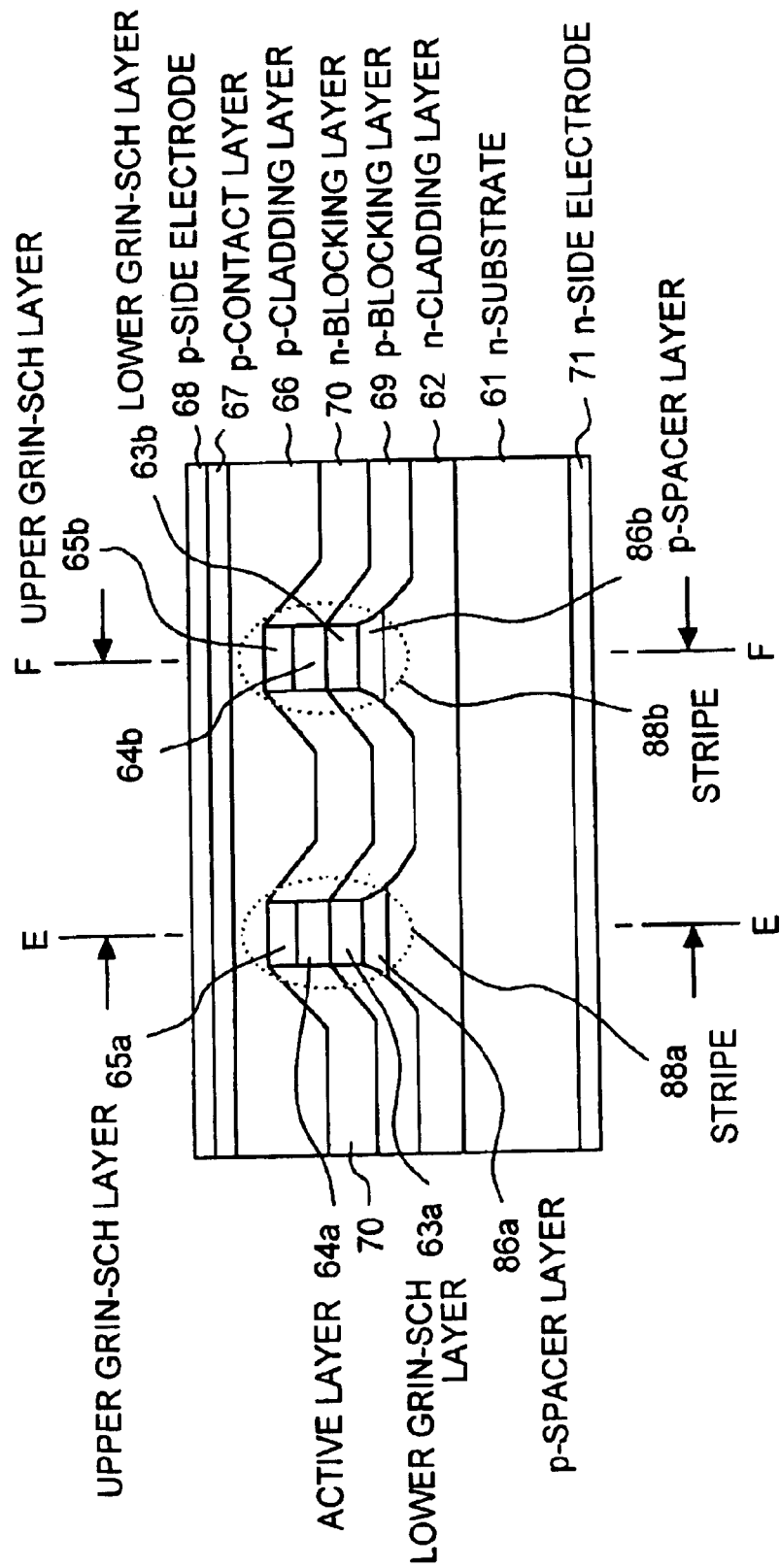

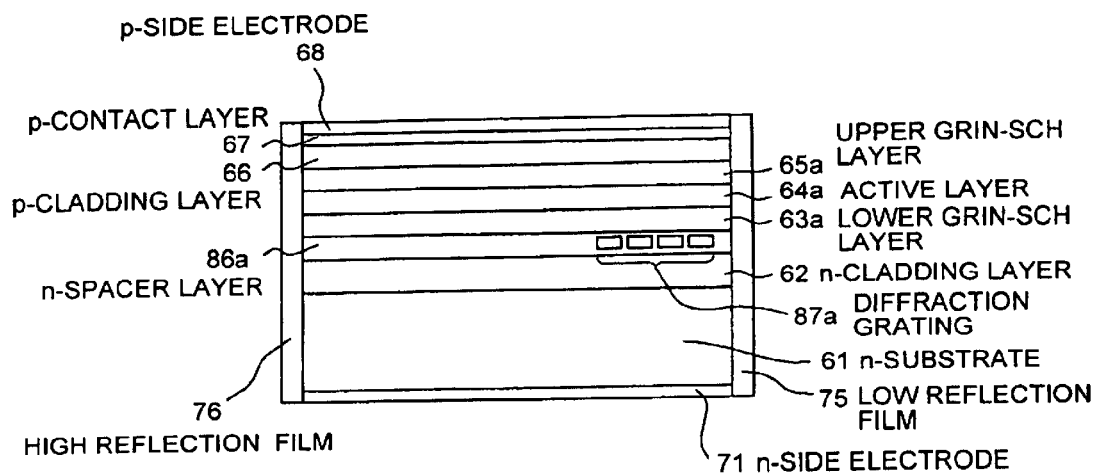
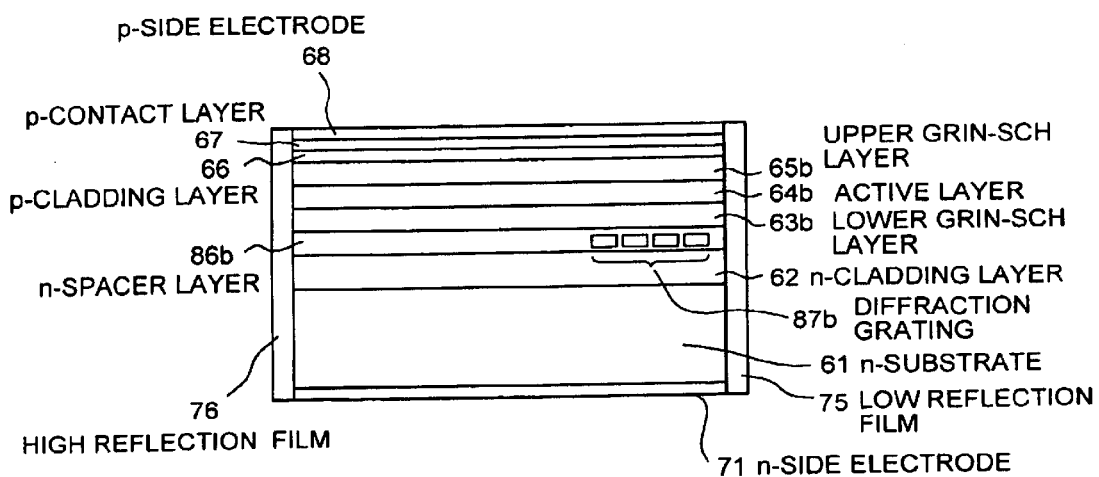

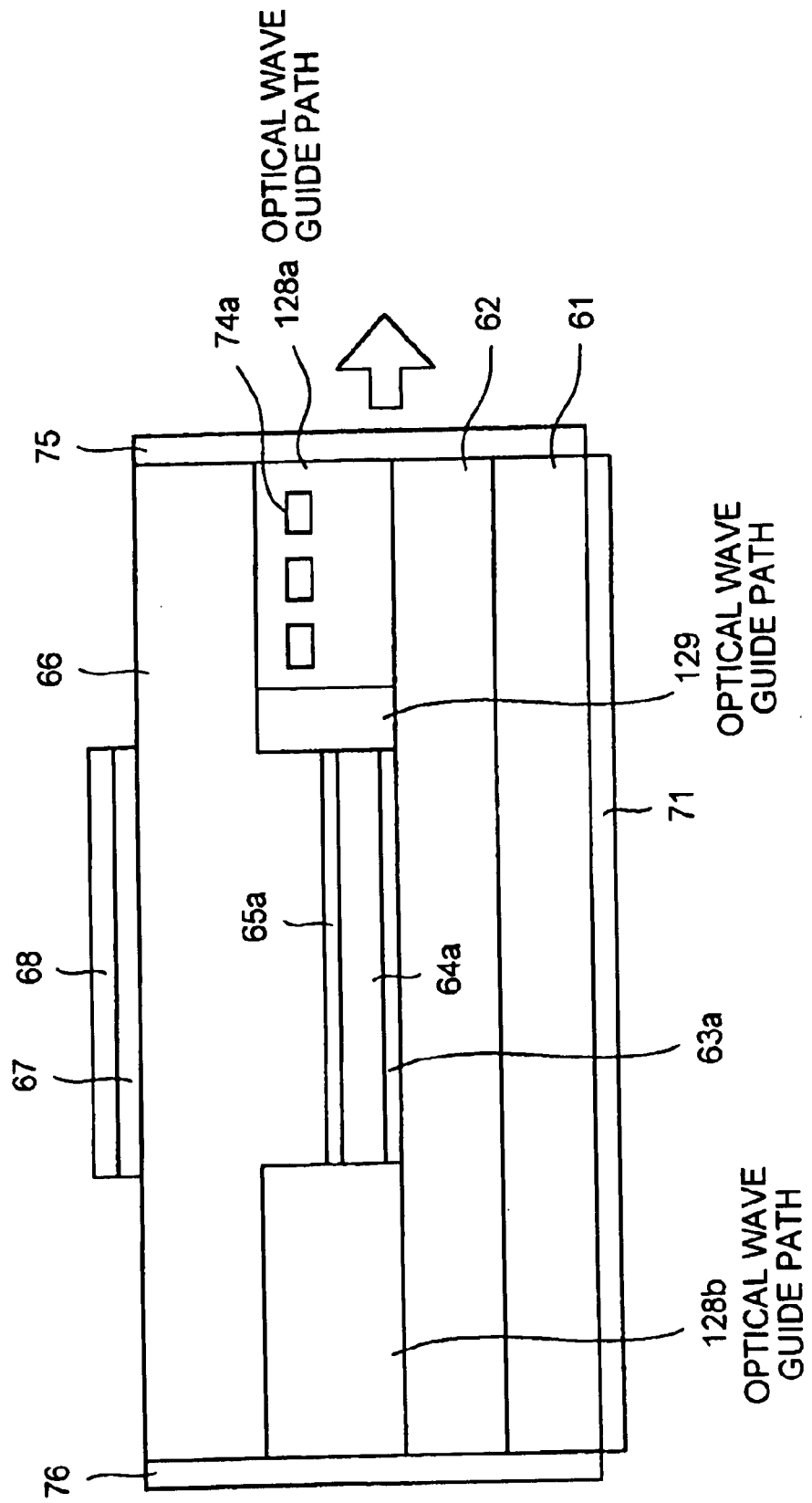

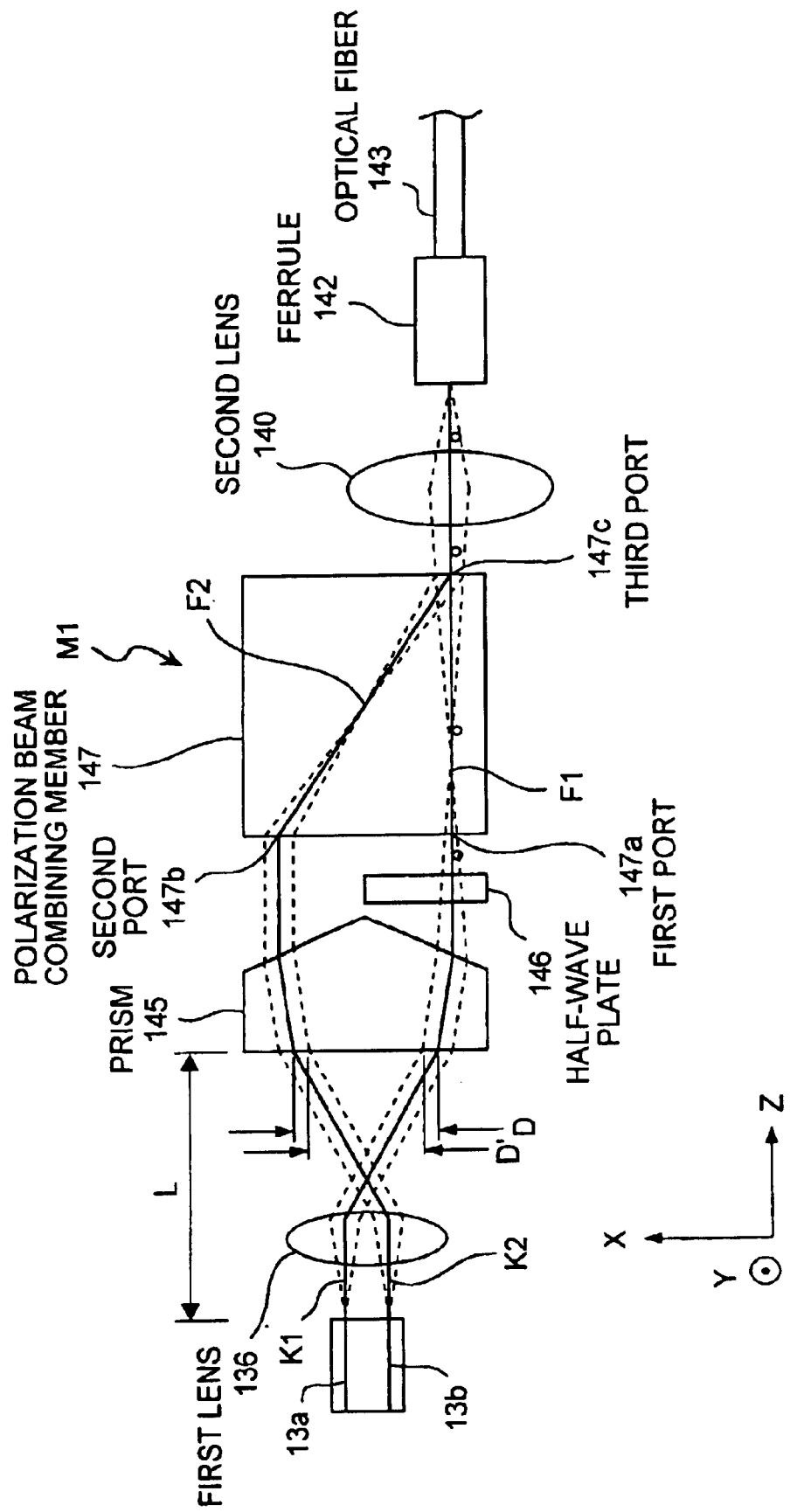

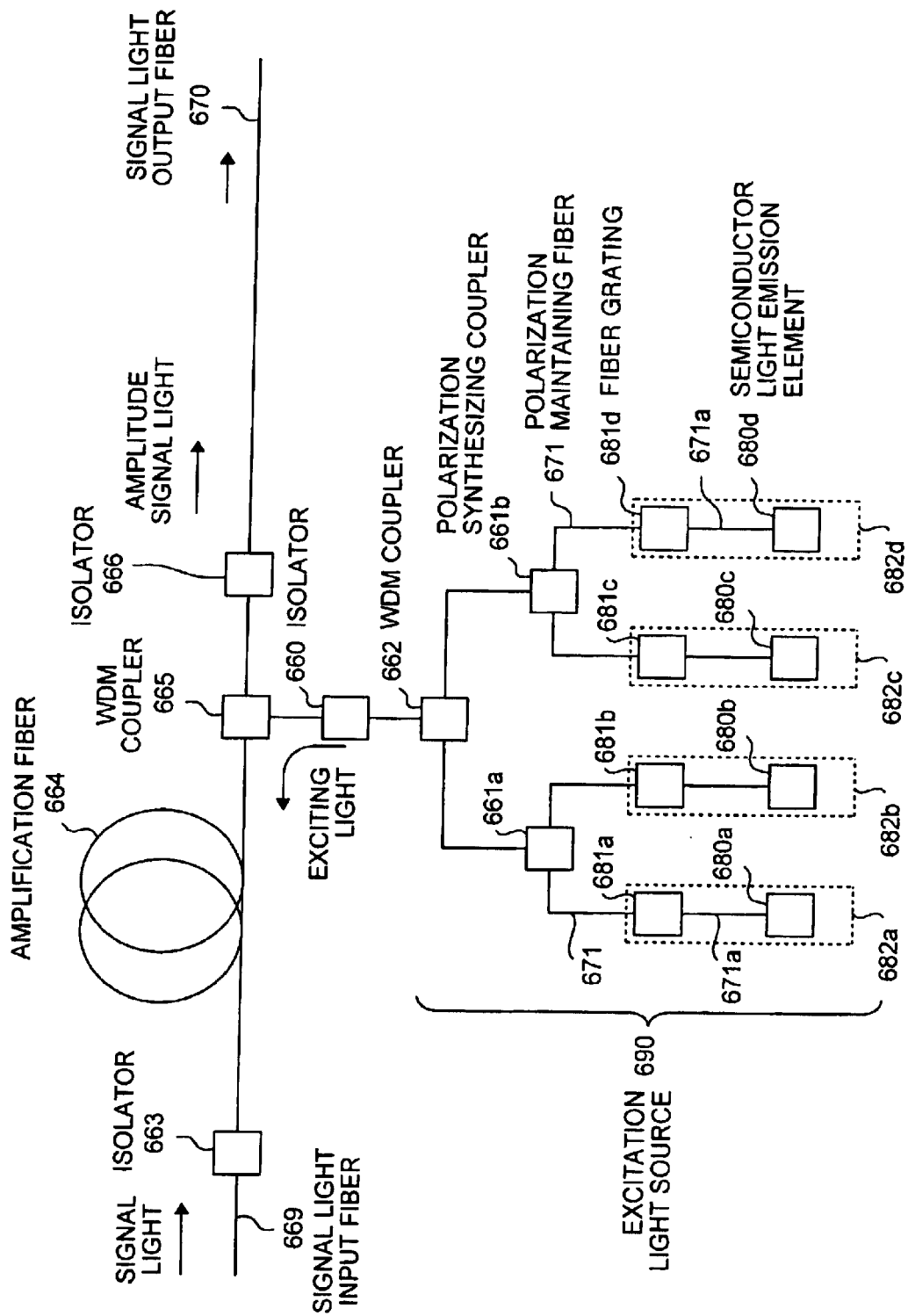

SEMICONDUCTOR LASER DEVICE, SEMICONDUCTOR LASER MODULE, AND OPTICAL FIBER AMPLIFIER USING THE DEVICE OR MODULE

BACKGROUND OF THE INVENTION

1) Field of the Invention

The present invention relates, in general, to amplification of signal light in optical networking and in particular, to a semiconductor laser device that does not require a temperature control module. Particularly, the present invention relates to an erbium doped optical fiber amplifier (EDFA) that produces a stable amplification gain of signal light. Further, the invention relates to a semiconductor laser device that has two stripe structures, a semiconductor laser module and an optical fiber amplifier that is compact and easy to manufacture, and achieves high output power while reducing stimulated Brillouin scattering in Raman amplifier and the degree of polarization of the laser beam emitted from the semiconductor laser device.

2) Description of the Related Art

With the recent advancements in the field of optical networking which has internet technology at its core, an optical fiber amplifier embedding between the each span of the transmitting optical fibers is widely practiced to enhance the transmission of light signals over longer distances. The optical fiber amplifier revives weak light signals by amplifying them. For example, if an exciting light having a central wavelength of around 980 nm or 1480 nm is injected into an erbium-doped fiber (EDF), the signal lights of 1550 nm range are amplified. A wavelength of around 1550 nm is generally preferred for transmission as it has very little transmission loss as compared to other wavelengths.

FIG. 78 is a graph that shows the relationship between the exciting light wavelength and the absorption coefficient of EDF at 980 nm range. It is evident from the graph that the absorption coefficient is the maximum at a wavelength of 978 nm and therefore the optical gain of Erbium doped fiber amplifier (EDFA) is the maximum at this wavelength. Hence, a high-gain optical fiber amplifier can be realized if EDFA is excited by the exciting light having a wavelength of 978 nm.

However, there are some requirements in the selection of excitation light source for the currently available optical fiber amplifiers requires caution. Fabry-Perot semiconductor laser devices are being widely used as the conventional excitation light source. However, the oscillation wavelength of the laser beam emitted from by a Fabry-Perot semiconductor laser device depends greatly on the temperature of the active layer and the current injected (injected current) in the active layer. The temperature of the active layer, because it emits the laser beam, rises as injection current into the active layer increases and the ambient temperature increases when oscillation occurs continuously.

The change in the oscillation wavelength of the laser due to the temperature change has a direct effect on the absorption coefficient of the EDF. The absorption coefficient of the EDF also changes, as can be seen in FIG. 78, with a change in the oscillation wavelength of the exciting laser. Hence it is very difficult to obtain a constant amplification gain independent on the temperature change of exciting laser in the EDFA.

Particularly, in the Fabry-Perot-type semiconductor laser device, if the temperature of the active layer rises by 1° C., the oscillation wavelength shifts by around 0.4 nm towards the longer wavelength side. Assuming that a semiconductor laser device oscillating at 978 nm at a certain temperature is the excitation light source, and that the temperature of the active layer has risen by 20° C., the oscillation wavelength of the emitted laser beam in this case will be 986 nm. As a result, the absorption coefficient of the EDF will decrease from 5 dB to 3 dB, as can be seen in FIG. 78. This indicates that it is not possible to obtain a constant amplification gain in EDFA independent of the oscillating wavelength change due to the temperature change of active layer of the laser.

A technology for obtaining exciting light of constant wavelength by mounting a semiconductor laser device on top of a temperature-adjusting module (hereinafter, referred to as prior art 1) is known. The prior art 1 discloses a semiconductor laser module that has a semiconductor laser device mounted on a thermo-electronic cooler and a light filter that allows laser beam having only a specific wavelength to pass. In the prior art 1, exciting light of constant wavelength is obtained by maintaining the intensity of the laser beam by monitoring the light form the reflection facet of the semiconductor laser device and controlling the temperature of the active layer of the semiconductor laser device by controlling a sensor (thermistor) temperature. For details, see the patent literature 1 mentioned below.

A technology that does not use a thermo-electronic cooler in the semiconductor laser module (hereinafter, referred to as prior art 2) is also known. This technology is described in detail with reference to FIG. 79. There are provided a first Fabry-Perot semiconductor laser module 201 that emits a laser beam of a first oscillation wavelength $\lambda 1$ at a specific basic temperature, and a second Fabry-Perot semiconductor laser module 202 that emits a laser beam of a second oscillation wavelength $\lambda_2$ at the same basic temperature. The laser beams emitted from the first Fabry-Perot semiconductor laser module 201 and the second Fabry-Perot semiconductor laser module 202 are multiplexed in a 50/50 coupler 203. The laser beam with the first oscillation wavelength $\lambda_1$ and the laser beam with the second oscillation wavelength $\lambda_2$ is split into two and one of them is multiplexed with a signal light 204 in WDM coupler 206 and subsequently passed into the amplification optical fiber 207. It is assumed here that the amplification optical fiber is the EDF and the amplification of signal light is achieved by combining the signal light with two types of laser beams, that is, the laser beam with the oscillation wavelength $\lambda_1$ and the laser beam with the oscillation wavelength $\lambda_2$. It is also assumed that, the Fabry-Perot semiconductor laser modules 201, 202 do not have an electronic cooling device and hence the temperature of the active layers cannot be controlled.

The mechanism of amplification in the prior art 2 is explained next with reference to FIG. 78. When amplifying signal light by using two laser beams of different wavelengths $\lambda_1$ and $\lambda_2$, the absorption coefficient of the EDF will be $\alpha+\beta$ where a is the absorption coefficient for wavelength $\lambda_1$ and $\beta$ is the absorption coefficient for wavelength $\lambda_2$.

As explained already, the temperature of the Fabry-Perot semiconductor laser modules 201, 202 increases, and therefore, the wavelengths shift towards the longer wavelength side. Let us assume that the temperatures of the Fabry-Perot semiconductor laser modules 201, 202 have risen by $\Delta T(K)$ and the respective wavelengths have increased by $\Delta\lambda(=0.4\times\Delta T)(nm)$.

Let us also suppose that the respective absorption coefficients $\alpha$ and $\beta$ have changed to $\alpha'$ and $\beta'$ because of the shift in the wavelengths. As can be seen from the graph in FIG. 78, the wavelength at which the absorption coefficient is the maximum is $\lambda_0$. If the oscillation wavelengths $\lambda_1$ and $\lambda_2$ of the Fabry-Perot semiconductor laser modules 201 and 202 are set in such a way that $\lambda_1<\lambda_0<\lambda_2$, then $\alpha'>\alpha$ and $\beta'>\beta$. However, if the absolute values of the amount of change of absorption coefficients, $\alpha(T)$ and $\beta(T)$, are identical, then $\alpha+\beta=\alpha'+\beta'$. As a result, the absorption coefficient of the EDF would be constant irrespective of the temperature of the active layer. Therefore, by setting $\lambda_1$ and $\lambda_2$ in such a way that the sum of absorption coefficients $\alpha(T)+\beta(T)$ is always constant, a constant amplification gain of the signal light 204 can be obtained for EDFA without the use of a temperature adjusting module or a wavelength monitoring section. For detail explanation see non-patent literature 2 mentioned below.

Patent literature 1: Japanese Patent Laid-Open Publication No. H10-79551.

Non-patent literature 2: P. Vavassori, R. Sotgiu, "New EDFA pumping scheme insensitive to 980 nm diode lasers temperature variation", OtuB3, 2001 Technical Digest on Optical Amplifiers and Their Applications, July 2001, Stresa, Italy.

Conventionally in an optical fiber amplifier using Raman amplification scheme, for example, it is known that a plurality of semiconductor laser devices are used as excitation light sources so that a high-output excitation light source is realized and a high-Raman gain optical fiber amplifier can be realized by using it. In the Raman amplification, since the signal light is amplified in a state that polarization directions of the signal light and the exciting light correspond with each other, it is necessary to reduce the influence of a deviation of a plane of polarization between the signal light and the exciting light as much as possible. For this reason, polarization of the exciting light is nullified (depolarization) so that the degree of polarization (DOP) is reduced.

FIG. 80 is a block diagram that shows one example of a structure of a conventional Raman amplifier used in a WDM communication system. As shown in FIG. 80, the conventional Raman amplifier includes semiconductor laser modules 682a through 682d. Each semiconductor laser module includes a Fabry-Perot type semiconductor light emission element and a fiber grating. That is, the semiconductor laser modules 682a through 682d include Fabry-Perot type semiconductor light emission elements 680a through 680d and fiber gratings 681a through 681d. The semiconductor laser modules 682a and 682b output laser beams, which are the excitation light source, to a polarization beam combiner 661a. The semiconductor laser modules 682c and 682d output laser beams, which are the excitation light source, to a polarization beam combiner 661b. The semiconductor laser modules 682a and 682b emit laser beams of same wavelengths and the polarization beam combiner 661a combines (multiplexes) these two laser beams to obtain light having perpendicularly polarized planes. Similarly, the respective semiconductor laser modules 682c and 682d emit laser beams of same wavelength and the polarization beam combiner 661b combines these two laser beams to obtain light having perpendicularly polarized planes. The polarization beam combiners 661a and 661b output the polarization multiplexed laser beams to a WDM coupler 662. The laser beams output from the polarization beam combiners 661a and 661b have different wavelengths.

The WDM coupler 662 multiplexes the laser beams output from the polarization beam combiner 661a and 661b via an isolator 660, and outputs the multiplexed laser beam as an exciting light to an amplification fiber 664 via a WDM coupler 665. A signal light to be amplified is also input into the amplification fiber 664 from a signal light input fiber 669 via an isolator 663. The signal light is coupled with the exciting light and the signal light is thus Raman-amplified.

When the laser beams to be polarization-combined are emitted from different semiconductor elements, the process of fabrication of the optical fiber amplifier become complicated and the optical fiber amplifier becomes bulky. To overcome this drawback, a technique of fabricating the Raman amplifier using a semiconductor laser device having two light emission areas at one chip is proposed. As a result of this technique, the process of fabrication of the optical fiber amplifier is simplified, and since a plurality of stripes are mounted on the same substrate, the semiconductor laser device itself can be miniaturized.

The semiconductor module used in the prior art 1 has a complex structure and function and besides is not cost-effective. Particularly, since the thermo-electronic cooler consume electricity to cool the semiconductor laser device, total power consumption of semiconductor laser module also goes up.

Complex structure translates to uneconomical production time and cost. Also, there is a high probability of breakdown. An optical fiber amplifier is expected have a long and trouble-free service life.

There are problems with the prior art 2 as well. If the value of $\lambda_1$ is set closer to of $\lambda_0$, the oscillation wavelength $\lambda_1+\Delta\lambda$ exceeds $\lambda_0$. When this happens, the absorption coefficient $\alpha(T)$ decreases and therefore is unable to counter-balance the reduction in absorption coefficient $\beta(T)$. The result is inability to maintain a constant gain.

To maintain a constant gain, it is necessary to set a small value for wavelength $\lambda_1$ in order to make the absorption coefficient $\alpha(T)$ as a monotone increasing function. The absorption coefficient $(\alpha(T)+\beta(T))$ would decrease and so would the gain during signal light amplitude. The prior art 1 is superior to the prior art 2 from gain point of view since in the prior art 1 the absorption coefficient can be maximized by properly controlling the temperature of the active layer and setting the value of the oscillation wavelength to $\lambda_0$.

Also, in the prior art 2, the gain is not constant because the temperature of the active layer changes. Since the Fabry-Perot type semiconductor laser device is used as an excitation light source in the prior art 2, the range of fluctuation of wavelength with respect to temperature variation is large. Therefore, it is difficult to determine wavelengths $\lambda_1$ and $\lambda_2$ from such a wide spectrum of the absorption coefficient of EDF such that the total of absorption coefficient $\alpha(T)+\beta(T)$ is constant. For instance, it can be seen that even in the case represented by FIG. 78, the rate of increase of $\alpha(T)$ is not equal to the rate of increase of $\beta(T)$ and hence the sum of absorption coefficient $\alpha(T)+\beta(T)$ decreases as the temperature increases.

On the other hand, when a semiconductor laser element having a structure of plural stripes, particularly a structure of two stripes (W-stripe structure) is used in the Raman amplifier, a new problem arises. In other words, when the semiconductor laser element having the W-stripe structure is used, DOP is not reduced as compared with when separated semiconductor elements are polarization-combined.

When DOP is not reduced, the degree of polarization of laser beam from the excitation light source is not nullified. Since the amplification gain in the Raman amplifier is determined by the intensity of the exciting laser beam component having the same polarization as that of the signal light, when the laser beam from the excitation light source is polarized to a specified direction, the amplification gain in the Raman amplifier changes due to the polarization direction of the signal light. In other words, since a stable amplification gain cannot be obtained, the semiconductor laser element having the W-stripe structure is not suitable has a problem for use as an excitation light source of the Raman amplifier.

The cause of the difference in the reduction of DOP is as follows. In the independent semiconductor laser elements as shown in FIG. 80, even when the oscillation wavelengths of each of the semiconductor laser elements are set to be uniform at the design stage, the oscillation wavelengths are not exactly equal, although the difference is very small, due to scattering in actual production. On the contrary, in the W-stripe structure, at the actual production step, a cleavage to allow for an epitaxial growth and to form a reflection end surface is normally formed in exactly identically for each stripe. Therefore, the structures of the stripes are exactly identical, and thus the oscillation wavelengths are the same. The difference in the reduction of DOP occurs due to such a difference in the structures.

Therefore, in order to reduce DOP in the semiconductor laser element having the W-stripe structure, for example, end faces may be formed separately by cleavage so that resonator lengths of the respective stripes are different. However, since the distance between the stripes in the semiconductor laser element is only within about a few hundred μm, it is neither easy nor realistic to carry out cleavage separately.

On the contrary, as shown in FIG. 80, in the structure that the independent semiconductor laser elements are polarization-combined, DOP can be reduced, and the amplification gain which is stabilized regardless of the polarization direction of the signal light can be obtained as a Raman gain. However, the production process of the Raman amplifier having the structure shown in FIG. 80 is complex and further it is difficult to miniaturize the entire device.

On the other hand, when semiconductor laser elements are used as the excitation light sources of a distribution type amplifier such as the Raman amplifier, it is preferable that the exciting light output power is increased in order to increase the Raman amplification gain. However, when its peak value is high, stimulated Brillouin scattering occurs, and this results in noise. It is essential to increase the threshold value at which the stimulated Brillouin scattering occurs.

Patent literature 2: Japanese Patent Laid-Open Publication No. H5-145194.

SUMMARY OF THE INVENTION

It is an object of the present invention is to provide a semiconductor laser device, a semiconductor laser module and an optical fiber amplifier in which the amplification fiber maintains the constant absorption coefficient in spite of variation in temperature without requiring a temperature control module and obtains a stable amplification of signal lights in EDFA.

It is also an object of the present invention to realize a semiconductor laser device and a semiconductor laser module which are suitable for an excitation light source for the Raman amplifier or the like, are compact and easily produced, having a small degree of polarization and capable of suppressing stimulated Brillouin scattering, and to provide an optical fiber amplifier which enables stable and high-gain amplification that does not depend on the direction of polarization of the signal light.

The semiconductor laser device according to one aspect of the present invention has a first conductive-type semiconductor substrate; a first conductive-type semiconductor buffer layer laminated on the semiconductor substrate; an active layer laminated on the semiconductor buffer layer; a first electrode laminated above the active layer; a second electrode disposed on the bottom surface of the semiconductor substrate; a second conductive-type spacer layer laminated between the active layer and the first electrode; a first diffraction grating embedded in one area in the second conductive-type spacer layer and possessing the ability to select an oscillation wavelength of a laser beam having a first center wavelength; and a second diffraction grating embedded in another area in the second conductive-type spacer layer and possessing the ability to select a wavelength of a laser beam having a second center wavelength. The laser beam having the first center wavelength and the laser beam having the second center wavelength have a plurality of longitudinal oscillation modes.

The semiconductor laser device according to another aspect of the present invention has a first conductive-type semiconductor substrate; a first conductive-type semiconductor buffer layer laminated on the semiconductor substrate; an active layer laminated on the semiconductor buffer layer, a first electrode laminated above the active layer; a second electrode disposed on the bottom surface of the semiconductor substrate; a first conductive-type spacer layer laminated between the semiconductor buffer layer and the active layer; a first diffraction grating embedded in one area in the first conductive-type spacer layer and possessing the ability to select a wavelength of a laser beam having a first center wavelength; and a second diffraction grating embedded in another area in the first conductive-type spacer layer and possessing the ability to select a wavelength of a laser beam having a second center wavelength. The laser beam having the first center wavelength and the laser beam having the second center wavelength have a plurality of longitudinal oscillation modes.

The semiconductor laser device according to still another aspect of the present invention has a first conductive-type semiconductor substrate; a first conductive-type semiconductor buffer layer laminated on the semiconductor substrate; an active layer laminated on the semiconductor buffer layer; a first electrode laminated above the active layer; a second electrode disposed on the bottom surface of the semiconductor substrate; a first conductive-type spacer layer laminated between the semiconductor buffer layer and the active layer; a first diffraction grating embedded in one area in the first conductive-type spacer layer and possessing the ability to select a wavelength of a laser beam having a first center wavelength; and a second conductive-type spacer layer laminated between the active layer and the first electrode; and a second diffraction grating embedded in one area in the second conductive-type spacer layer and possessing the ability to select a wavelength of a laser beam having a second center wavelength. The laser beam having the first center wavelength and the laser beam having the second center wavelength have a plurality of longitudinal oscillation modes.

The semiconductor laser device according to another aspect of the present invention has a first stripe structure that includes a first spacer layer laminated on one area of a semiconductor substrate, a first diffraction grating embedded in one area in the first spacer layer and possessing the ability to select a wavelength of a first laser beam having a first center wavelength, a first active layer laminated on the first spacer layer, and a first electrode disposed above the first active layer; and a second stripe structure that includes a second spacer layer laminated on another area of the semiconductor substrate, a second diffraction grating embedded in one area in the second spacer layer and possessing the ability to select a wavelength of a second laser beam having a second center wavelength, a second active layer laminated on the second spacer layer, and a second electrode disposed above the second active layer. The first laser beam and the second laser beam have a plurality of longitudinal oscillation modes.

The semiconductor laser device according to another aspect of the present invention has a first stripe structure that includes a first active layer laminated on one area of a semiconductor substrate, and a first diffraction grating that possesses the ability to select a wavelength of a laser beam having a first center wavelength; a second stripe structure comprising a second active layer laminated on another area of the semiconductor substrate, and a second diffraction grating that possesses the ability to select a wavelength of a laser beam having a second center wavelength. An optical waveguide layer is provided adjacent to the radiation end surface and/or reflection end surface in at least one of the first stripe structure and the second stripe structure, and the first diffraction grating or the second diffraction grating is embedded in the optical waveguide layer.

The semiconductor laser module according to another aspect of the present invention has the above mentioned semiconductor laser device; an optical fiber that transmits the laser beam emitted by the semiconductor laser device to the outside; and a photodetector that monitors the output light from the semiconductor laser device.

The semiconductor laser module according to another aspect of the present invention has the above mentioned semiconductor laser device; a laser beam combining unit that includes a first port from which the laser beam having the first center wavelength emitted from the semiconductor laser device enters, a second port from which the laser beam having the second center wavelength emitted from the semiconductor laser device enters, and a third port in which the laser beam having the first center wavelength from the first port and the laser beam having the second center wavelength from the second port are coupled and from which the combined laser beam is emitted; and an optical fiber that receives from the third port the laser beam emitted from the laser beam combining unit, and transmits it to the outside.

The optical fiber amplifier according to another aspect of the present invention has an excitation light source including the above mentioned semiconductor laser device; a coupler that couples signal light and exciting light; and an amplification optical fiber.

The optical fiber amplifier according to another aspect of the present invention has a first semiconductor laser module that has a semiconductor laser device having a first diffraction grating that selects a wavelength of a laser beam having a first center wavelength and a plurality of longitudinal oscillation modes; a second semiconductor laser module that has a semiconductor laser device having a second diffraction grating that selects a wavelength of a laser beam having a second center wavelength and a plurality of longitudinal oscillation modes; a first coupler that couples the laser beams emitted from the first semiconductor laser module and the second semiconductor laser module; a second coupler that couples the beam produced by the first coupler and a signal light; and an amplification optical fiber.

The semiconductor laser device according to another aspect of the present invention has a first stripe structure that has a first active layer laminated on one area of a semiconductor substrate and that emits a first laser beam; a second stripe structure that has a second active layer laminated on another area of the semiconductor substrate and that emits a second laser beam; an electrode laminated on the first active layer and the second active layer; an electric current bias unit that injects a bias current into the first active layer and the second active layer via the electrode; and a modulation unit that generates a modulation signal which modulates the bias current and superposes the modulation signal on the bias current.

The semiconductor laser device according to another aspect of the present invention has a first stripe structure that has a first active layer laminated on one area of a semiconductor substrate and a first diffraction grating which is arranged on one area in the vicinity of the first active layer and that selects a laser beam having a plurality of longitudinal oscillation modes having a specified center wavelength and emits a first laser beam; a second stripe structure that has a second active layer laminated on another area of the semiconductor substrate and a second diffracting grating which is arranged on one area in the vicinity of the second active layer and that selects a laser beam having a plurality of longitudinal oscillation modes having the specified center wavelength and emits a second laser beam; an electrode laminated on the first active layer and the second active layer; an electric current bias unit that injects a bias current into the first active layer and the second active layer via the electrode; and a modulation unit which generates a modulation signal which modulates the bias current and superposes the modulation signal on the bias current.

The semiconductor laser module according to another aspect of the present invention has the above mentioned semiconductor laser device; a first lens from which the first laser beam and the second laser beam emitted from the semiconductor laser device enter and which separates to widen the distance between the first laser beam and the second laser beam; a polarization rotating unit in which only one of the first laser beam and the second laser beam passed through the first lens enters and that rotates the plane of polarization of the entering laser beam by a predetermined angle; a polarization beam combining unit that has a first port from which the first laser beam from the first lens or the polarization rotating unit enters, a second port from which the second laser beam from the first lens or the polarization rotating unit enters, and a third port in which the first laser beam emitted from the first port and the second laser beam emitted from the second port are coupled and from which the coupled laser beam is emitted; and an optical fiber that receives the laser beam emitted from the third port of the polarization beam combining and transmits it to the outside.

The semiconductor laser module according to another aspect of the present invention has a first semiconductor laser device that has a first active layer laminated on a semiconductor substrate and that emits a first laser beam; a second semiconductor laser device that has a second active layer laminated on the semiconductor substrate and that emits a second laser beam; an electric current bias unit that injects a bias current into the first active layer and the second active layer; a first modulation unit that generates a first modulation signal which modulates the bias current injected into the first active layer and superposes the first modulation signal on the bias current; a second modulation unit that generates a second modulation signal by dephasing the first modulation signal produced by the first modulation unit by 180° and superposes the second modulation signal on the bias current; a polarization beam combining unit that combines the first laser beam output from the first semiconductor laser device and the second laser beam output from the second semiconductor laser device; and a depolarizer that depolarizes the polarized laser beam output from the polarization beam combining unit.

The semiconductor laser module according to another aspect of the present invention has a first semiconductor laser device that has a first active layer laminated on a semiconductor substrate and a first diffraction grating which is arranged on one area in the vicinity of the first active layer and that selects a laser beam having a plurality of longitudinal oscillation modes having a specified center wavelength, and emits a first laser beam; a second semiconductor laser device that has a second active layer laminated on the semiconductor substrate and a second diffraction grating which is arranged on one area in the vicinity of the second active layer and that selects a laser beam having a plurality of longitudinal oscillation modes having a specified center wavelength, and emits a second laser beam; an electric current bias unit that injects a bias current into the first active layer and the second active layer; a first modulation unit that generates a first modulation signal which modulates the bias current injected into the first active layer and superposes the first modulation signal on the bias current; a second modulation unit that generates a second modulation signal by dephasing the first modulation signal produced by the first modulation unit by 180° and superposes the second modulation signal on the bias current; a polarization beam combining unit that combines the first laser beam output from the first semiconductor laser device and the second laser beam output from the second semiconductor laser device; and a depolarizer that depolarizers the polarized laser beam output from the polarization beam combining unit.

The optical fiber amplifier according to another aspect of the present invention has the above mentioned semiconductor laser device; an amplification optical fiber; and a coupler that combines the exciting light output from the semiconductor laser device or the semiconductor laser module and the signal light propagated inside the amplification optical fiber.

In the abovementioned aspects, it is mentioned that the optical fiber amplifier according to the present invention uses the semiconductor laser device according to the present invention. However, it is not limited to this case. The optical fiber amplifier according to the present invention may use the semiconductor laser module according to the present invention.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 17 is a front view of a first variation of the semiconductor laser device according to the third embodiment of the present invention.

FIG. 18 is a front view of a second variation of the semiconductor laser device according to the third embodiment of the present invention.

FIG. 19A is a sectional view of the semiconductor laser device shown in FIG. 18 taken along the line E—E, and FIG. 19B is a sectional view of the semiconductor laser device shown in FIG. 18 taken along the line F—F.

FIG. 24 is a fifth variation of the semiconductor device according to the third embodiment of the present invention and shows a side sectional view of a stripe structure.

FIG. 27 is a view showing frame format of the structure of the semiconductor laser module according to the fifth embodiment of the present invention.

FIG. 80 is a block diagram of a conventional optical fiber amplifier.

DETAILED DESCRIPTIONS

Figure 1:
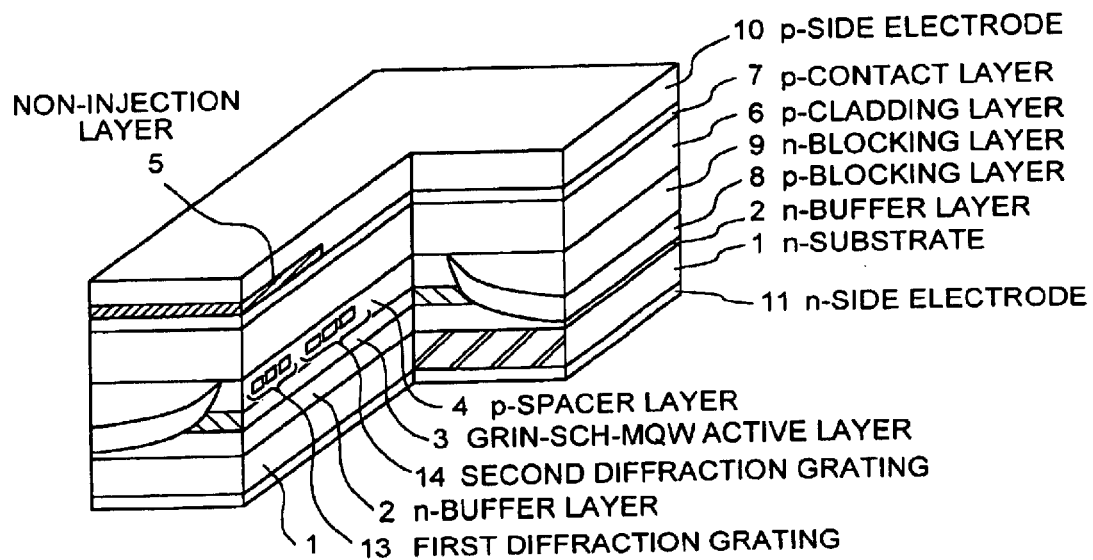
FIG. 1 is a cutaway oblique view of the semiconductor laser device according to the first embodiment of the present invention.

Preferred embodiments of a laser module according to the present invention are explained next with reference to the accompanying drawings. Identical parts in the drawings are assigned the same reference numerals. The frame format drawings are not drawn to scale. The relative scales and dimensions of the drawings also vary.

Figure 2:
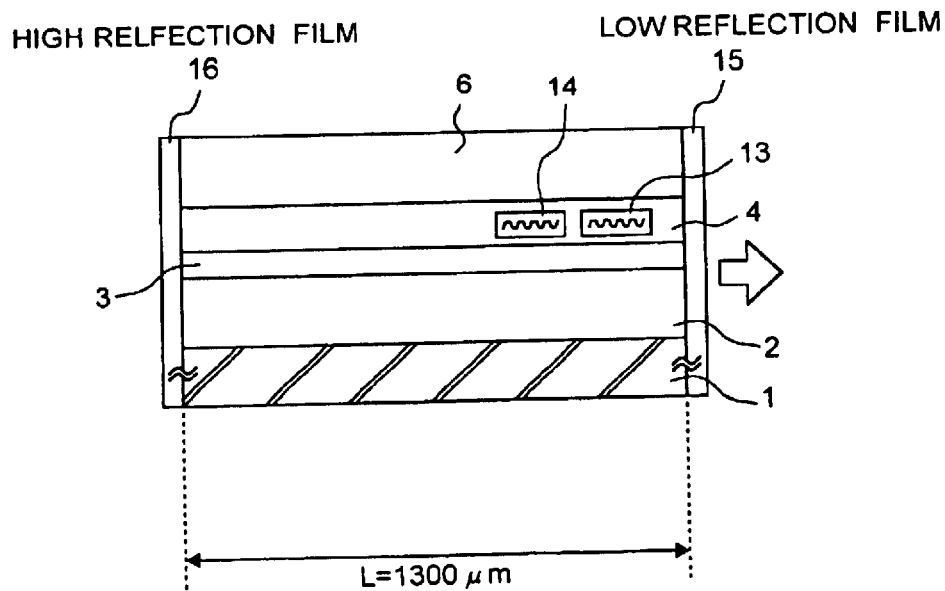
FIG. 2 is a side view of the semiconductor laser device according to the first embodiment of the present invention.
Figure 3:
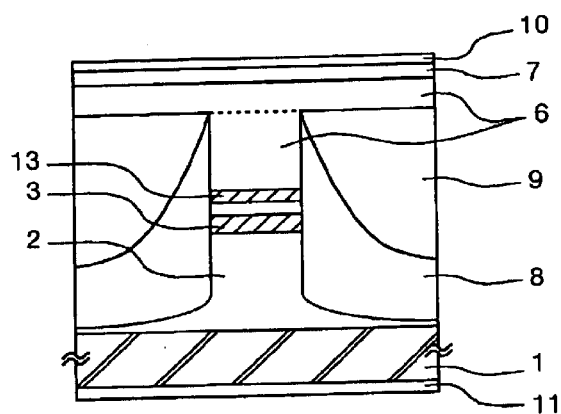
FIG. 3 is a front view of the semiconductor laser device according to the first embodiment of the present invention.
Figure 4:
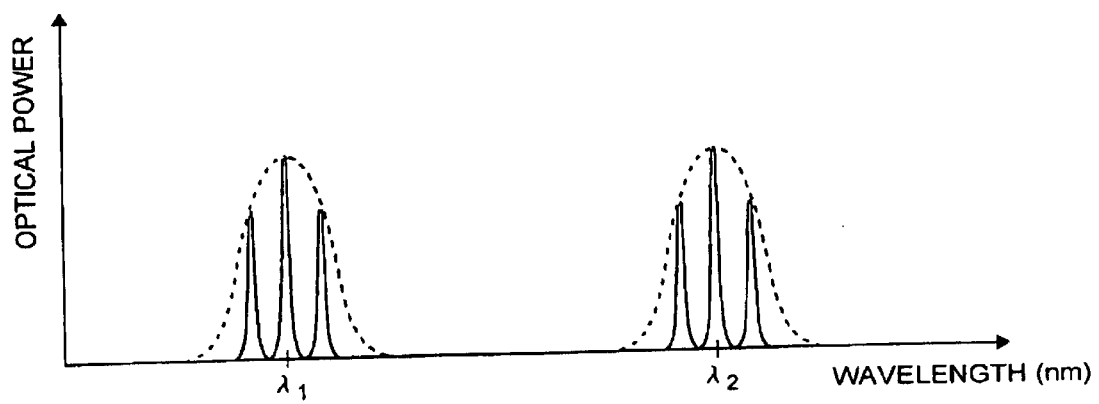
FIG. 4 is a graph that shows the spectrum of the laser beam emitted from the semiconductor laser device according to the first embodiment of the present invention.

A semiconductor laser device according to the first embodiment of the present invention is explained next. FIG. 1 is a cutaway view, FIG. 2 is a side view and FIG. 3 is a front view of the semiconductor laser device according to the first embodiment of the present invention.

The semiconductor laser device comprises, from bottom up, an n-substrate 1, an n-buffer layer 2, a Graded Index-Separate Confinement Hetero structure Multi Quantum Well (GRIN-SCH-MQW) active layer 3, a p-spacer 4, a p-cladding layer 6, a p-contact layer 7 and a p-side electrode 10. An n-side electrode 11 is disposed on the other surface of the n-substrate 1.

A mesa stripe structure is provided on GRIN-SCH-MQW active layer 3, p-spacer layer and n-buffer layer 2. The width of this structure (as shown in FIG. 3) is narrower than the width of the n-substrate 1. A p-blocking layer 8 and an n-blocking layer 9 are buried around the GRIN-SCH-MQW active layer 3, p-spacer layer and n-buffer layer 2. The function of these blocking layers is to concentrate the injected current into the active layer and to realize the single transverse mode oscillation stably. These layers are instrumental in increasing the carrier injection efficiency into the GRIN-SCH-MQW active layer 3 and rendering the first embodiment with a high efficiency of the laser output power. Particularly, in this embodiment, for achieving high output performance, a compression strain multi quantum well structure having 1% of lattice-mismatch in each well layer is used as the well layers in the active layer. If the strain exceeds 1.5% in each well of the multi quantum well layer, the crystal quality is deteriorated due to the formation of crystal defect. Therefore, providing a strain compensating structure for imparting a countering tensile strain in the barrier layer that forms the multi quantum well will yield a high quality semiconductor crystal.

There is provided a low reflection film 15 and a high reflection film 16 on the radiation end surface and the reflection end surface, respectively. The high reflection film 16 has a reflectivity of over 80%. On the other hand, the low reflection film prevents reflection of laser beam on the radiation end surface, and has a reflectivity of less than 2% or, ideally, 1%.

The n-buffer layer 2 functions as a cladding layer as well, apart from functioning as a buffer layer. The semiconductor laser device according to the first embodiment of the present invention has a double hetero structure because both the n-buffer layer 2 and the p-cladding layer 6 function as cladding layers. High efficiency of the light output is achieved by effectively confining the emission-contributing carrier within the GRIN-SCH-MQW layer 3.

The length of laser resonator (in the horizontal direction in FIG. 2) of the semiconductor device according to the first embodiment is 1300 $\mu$m. Though the length of laser resonator can be any value, 800 $\mu$m or above is preferable. In lengths below 800 $\mu$m the laser has only a single mode oscillation and does not have multiple longitudinal mode oscillations described later.

Further, a first diffraction grating 13 and a second diffraction grating 14 are provided within the p-spacer layer 4 and near the laser beam radiation surface. When viewed from the laser beam radiation surface the diffraction gratings appear in the sequence of the diffraction grating 13 and the diffraction grating 14.

The gratings that form the first and the second diffraction gratings 13 and 14 are made of p-type semiconductor material. The first diffraction grating 13 and the second diffraction grating 14 are formed by different periods of gratings. In the semiconductor laser device of the first embodiment, it is preferable that the laser radiation surface end of the first diffraction grating 13 be in contact with the laser radiation end surface. However, it is acceptable if the laser radiation surface ends of the first diffraction grating 13 and the second diffraction grating 14 are within 100 $\mu$m from the laser radiation end surface.

It is preferable that the product of the diffraction grating length in the laser radiation direction and the coupling coefficient for each of the first diffraction grating 13 and the second diffraction grating 14 be 0.3 or less. Otherwise, there is a problem of kinks appearing in the linearity of the light output intensity that corresponds to the injected current.

A current non-injection layer 5 is provided between the p-contact layer 7 and the p-side electrode 10 and above the first diffraction grating 13 and the second diffraction grating 14. This layer is made of an insulating film and prevents the current injected from the p-side electrode 10 from entering the first diffraction grating 13 and the second diffraction grating 14. In this embodiment, the current non-injection layer is made of an insulating film. However, the current non-injection layer can also be made using a semiconductor.

The operation and the effect of the semiconductor laser module according to the first embodiment of the present invention are explained next. An electric current is injected from the p-side electrode 10 towards the n-side electrode 11. The injected carrier is recombined in GRIN-SCH-MQW active layer 3 and an induced stimulated emission takes place. The emitted laser beam has a certain degree of spectrum width. The first diffraction grating 13 and the second diffraction grating 14 select specific wavelengths from the spectrum. The first diffraction grating 13 and the second diffraction grating 14 select multiple longitudinal oscillation mode laser beams with specific center wavelengths as they are formed from different period of diffraction gratings surrounded by p-spacer layer 4 with each other.

According to the first embodiment, the first diffraction grating 13 selects multiple longitudinal oscillation mode laser beam having with a center wavelength of 971 nm and the second diffraction grating 14 selects multiple longitudinal oscillation mode laser beam with a center wavelength of 979 nm.

Consequently, the semiconductor laser module according to the first embodiment of the present invention emits multiple longitudinal oscillation mode laser beams having $\lambda_1$ (=971 nm) and $\lambda_2$ (=979 nm) as the center wavelengths.

Figure 6:
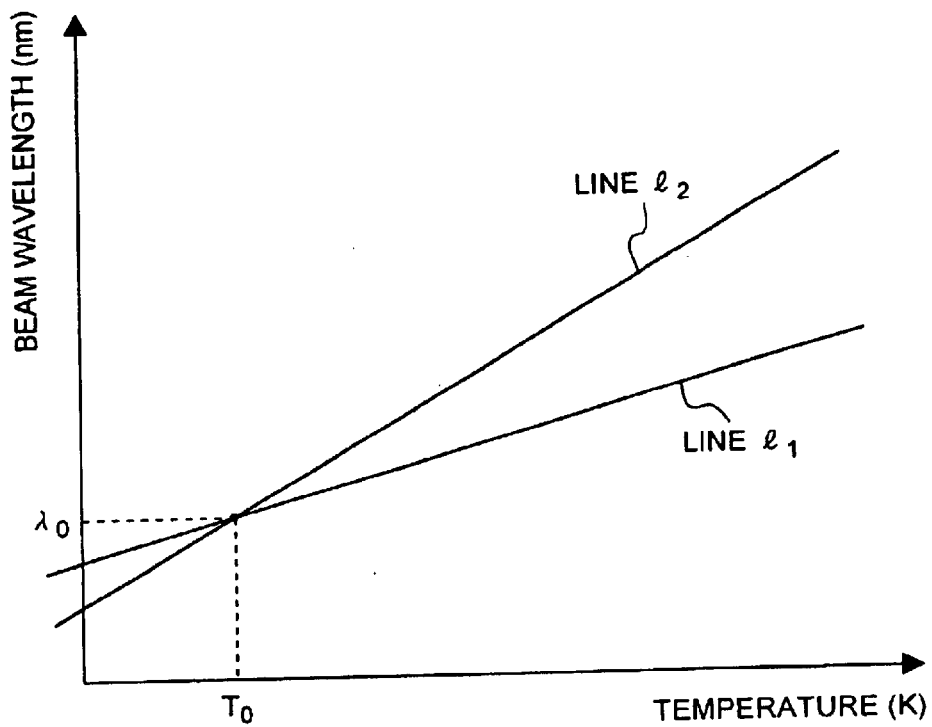
FIG. 6 is a graph that explains shifts in emission wavelength of laser emitted from the semiconductor laser device according to the first embodiment of the present invention and that from the conventional Fabry-Perot type laser device with change of temperature.

The change of wavelength with respect to the temperature of GRIN-SCH-MQW active layer 3 is explained next with reference to FIG. 6. In FIG. 6, the line $I_1$ represents the shift in the wavelength with respect to the change in temperature in the semiconductor laser device according to the first embodiment, and the line $I_2$ represents the shift in the wavelength with respect to the change in temperature in the convention Fabry-Perot type semiconductor laser device. The semiconductor laser device according to the first embodiment has a structure that produces two laser beams of different center wavelengths and the slope of the line $I_1$ is decided from the shift of wavelengths of these two laser beams. The shift of wavelength with respect to temperature in the semiconductor laser device according to prior art (line $I_2$) is 0.4 nm/K. However, the shift of wavelength with respect to temperature in the semiconductor laser device according to the first embodiment (line $I_1$) is 0.1 nm/K, which is one-fourth of the shift in the conventional semiconductor laser device.

In the conventional Fabry-Perot type semiconductor laser device, as the oscillation wavelength is measured according to the transition energy of the MQW in the active layer, the shift in wavelength with respect to the change in temperature is large. On the other hand, in the semiconductor laser device according the first embodiment, the oscillation wavelength is selected by the first diffraction grating 13 and the second diffraction grating 14. As a result, the shift in the oscillation wavelength mainly depends on the refractive index change of the first diffraction grating 13 and the second diffraction grating 14 and the refractive index change of the p-spacer layer 4 due to the generated heat in the active layer at current injection. Therefore, the semiconductor laser device according the first embodiment has a small change of oscillation wavelength with respect to temperature change, unlike the conventional semiconductor laser device.

In the semiconductor laser device according to the first embodiment, the first diffraction grating 13 and the second diffraction grating 14 select laser beams of specific wavelengths from the beam that is emitted from the GRIN-SCH-MQW layer 3. As both the diffraction gratings are within the p-spacer 4, their temperatures are more or less the same and the change of their refractive index with respect to the change in temperature also will be the same. Hence the shift of wavelength in the laser beam selected by the first diffraction grating 13 and the laser beam selected by the second diffraction grating 14 is identical.

Also, the current non-injection layer 5 is provided above the first diffraction grating 13 and the second diffraction grating 14. This layer prevents the injected current from entering the two diffraction gratings 13 and 14. Therefore, the temperature change accompanying the current injection is suppressed in these two diffraction layers. This in turn suppresses the change in the refractive index of the two diffraction gratings 13,14 further reducing the change in radiation wavelength.

The first embodiment according to the present invention can have many variations. For instance, it is explained above that the n buffer layer 2 also functions as a cladding layer, however, apart from an n-buffer layer 2, a separate n-cladding layer may be provided on the bottom surface of the GRIN-SCH-MQW active layer 3.

Further, since wavelength can be selected by diffraction grating, instead of a double hetero structure, a homo junction laser or single hetero laser construction, which does not have a bandgap difference between the active layer and other layers, may also be used. For the same reason, a structure that allows recombination of emitted beam, even if the structure has an active layer other than GRIN-SCH-MQW, is acceptable. In this embodiment, the p-blocking layer 8 and the n-blocking layer 9 are provided to effectively inject the carrier into the GRIN-SCH-MQW active layer 3. As a variation, these blocking layers may be omitted, because, wavelength selection is possible even without these layers. As still another variation, the current non-injection layer 5 may be omitted, because, wavelength selection is possible even without this layers. In this embodiment, the p-blocking layer 8 and the n-blocking layer 9 are provided to effectively inject the carrier into GRIN-SCH-MQW active layer 3. As a variation, these blocking layers may be omitted and even so wavelength selection is possible. As still another variation, the current non-injection layer 5 may be omitted, because, wavelength selection is possible even without this layers. Yet another variation is using an n-type or assembling n-type and p-type semiconductors in an npn construction for current non-injection layer, instead of an insulating film. In another variation, the p-side electrode 10 need not be disposed above the first diffraction grating 13 and the second diffraction grating 14.

Alternatively, the conductive type presented above as an example can be turned upside down. In other words, the substrate and buffer layer can be made p-type and the spacer layer and the cladding layer can be made n-type. In this case, the first diffraction grating 13 and the second diffraction grating 14 would need to be converted to n-type conductive type.

Figure 7:
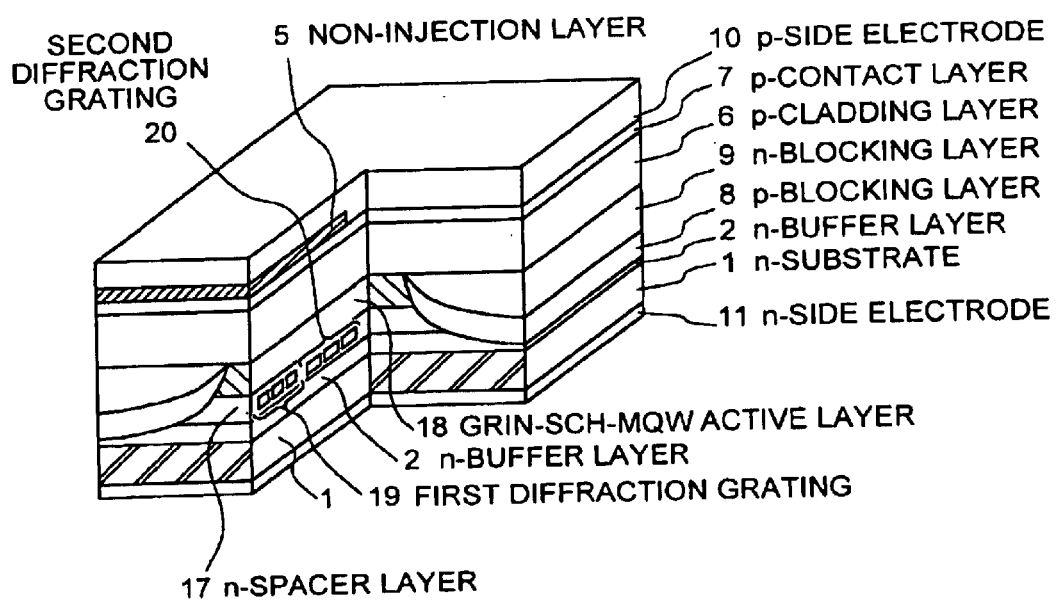
FIG. 7 is a cutaway oblique view of a variation of the semiconductor laser device according to the first embodiment of the present invention.

A variation of the first embodiment is explained next with reference to FIG. 7. An n-spacer layer 17 is disposed on the bottom surface of a GRIN-SCH-MQW active layer 18. A first n-type diffraction grating 19 and a second n-type diffraction grating 20 are provided within the n-spacer layer 17 for wavelength selection. Even with the first and the second diffraction gratings disposed below the GRIN-SCH-MQW active layer, the semiconductor laser device functions as well as the one described above.

A semiconductor laser device according to the second embodiment of the present invention is explained next. The parts that are identical to the first embodiment have identical functions and are represented by the same reference numerals.

Figure 8:
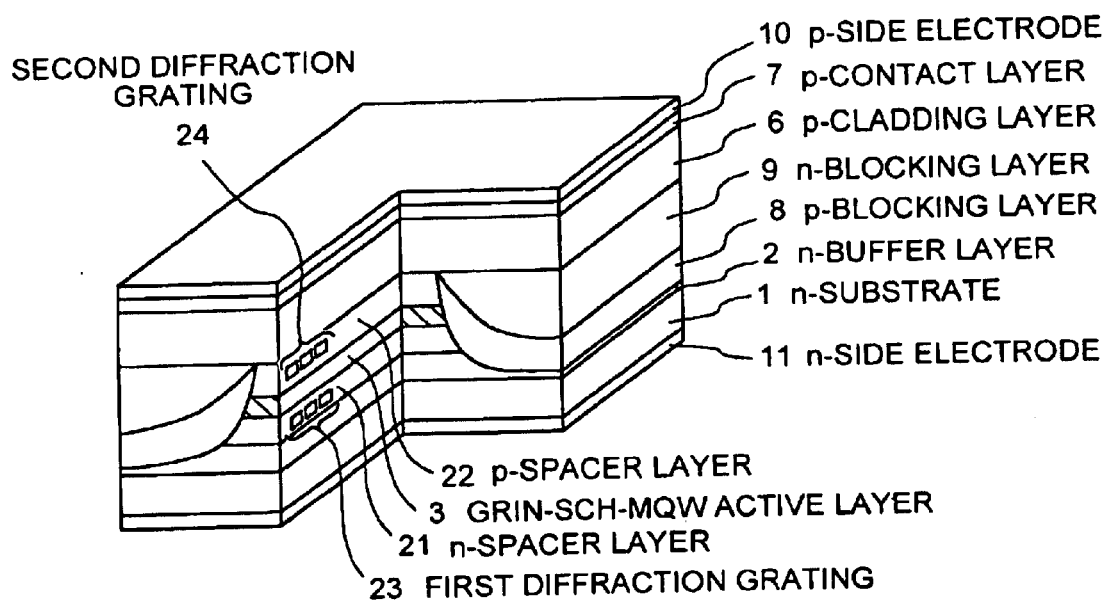
FIG. 8 is a cutaway oblique view of a semiconductor laser device according to the second embodiment of the present invention.
Figure 9:
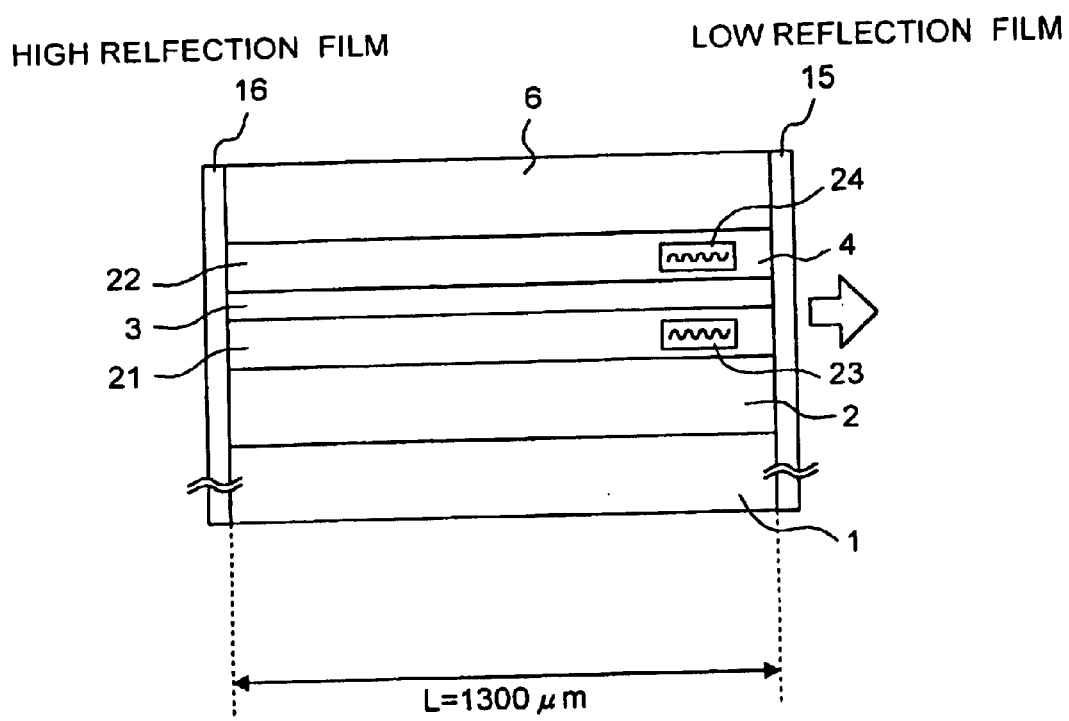
FIG. 9 is a side view of the semiconductor laser device according to the second embodiment of the present invention.
Figure 10:
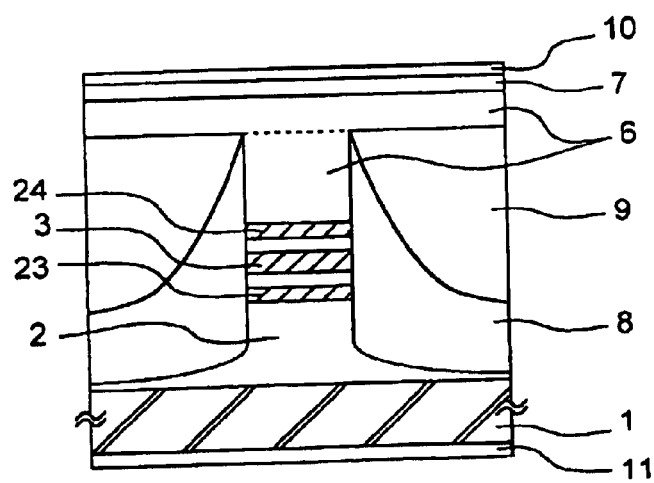
FIG. 10 is a front view of the semiconductor laser device according to the second embodiment of the present invention.

As shown in FIG. 8, the semiconductor laser device comprises, from bottom up, the n substrate 1, the n-buffer layer 2, an n-spacer layer 21, the GRIN-SCH-MQW active layer 3, a p-spacer layer 22, the p-cladding layer 6, the p-contact layer 7, and the p-side electrode 10. The n-side electrode 11 is disposed on the other surface of the n-substrate 1. As can be seen from FIG. 8, a mesa stripe structure is provided on GRIN-SCH-MQW active layer 3, p- and n-spacer layer 22, 21 and n-buffer layer 2. The width of this structure (as shown in FIG. 8) is narrower than the width of the n-substrate 1. The p-blocking layer 8 and the n-blocking layer 9 are buried around the n-spacer layer 21, GRIN-SCH-MQW active layer 3, and the p-spacer layer 22. The low reflection film 15 and the high reflection film 16 are provided on the radiation end surface and the reflection end surface, respectively. The low reflection film has a reflectivity of less than 2% or, ideally, 1% to prevent reflection of laser beam on the radiation end surface.

Within the n-spacer layer 21 is embedded a first diffraction grating 23 of n-type. The first diffraction grating 23 is disposed in a direction parallel to the laser beam radiation direction. An n-type diffraction grating is selected to avoid impediment to the current flow due to formation of p-n junction in the n-spacer layer 21. The first diffraction grating 23 has the ability to select a beam emitted from the GRIN-SCH-MQW layer 3. It is preferable that the laser radiation surface end of the first diffraction grating 23 should be in contact with the low reflection film 15. However, it is acceptable if the laser radiation end of the first diffraction grating 23 is within 100 µm from the boundary of the low reflection film 15 and the n-spacer layer 21, which is the distance at which the diffraction grating can select a laser beam of a specific wavelength at stable longitudinal multi-mode oscillation.

Within the p-spacer layer 22 is embedded a second diffraction grating 24 of p-type. The second diffraction grating 24 is disposed, like the first diffraction grating 23, in a direction parallel to the laser beam radiation direction. The second diffraction grating 24 has the ability to select a beam having a different wavelength than the one that the first diffraction grating 23 selects. It is preferable that the laser radiation surface end of the second diffraction grating 24 be in contact with the low reflection film 15. However, it is acceptable if the laser radiation end of the second diffraction grating 24 is within 100 µm from the boundary of the low reflection film 15 and the n-spacer layer, which is the distance at which the diffraction grating can select a laser beam of a specific wavelength at stable longitudinal multi-mode oscillation.

The operation and the effect of the semiconductor laser module according to the second embodiment of the present invention are explained next with reference to FIG. 8. An electric current is injected from the p-side electrode 10. According to the injected current, the electrons and the hole are recombined in the GRIN-SCH-MQW active layer 3 and an induced stimulated emission takes place. The spectrum of the emitted laser beam has a certain degree of spectrum width. The first diffraction grating 23 and the second diffraction grating 24 select specific wavelengths. The first diffraction grating 23 and the second diffraction grating 24 select multiple longitudinal oscillation mode laser beams having specific center wavelengths as they are formed from different diffraction grating from each other with each having a specific period.

When a plurality of diffraction gratings are arranged in a row in a direction parallel to the direction of the laser wavelength oscillation, a possibility of formation of composite resonator arises due to mutual interference of the diffraction grating. However, in the semiconductor laser device according to the second embodiment of the present invention, the formation of composite resonator does not take place, because, the first diffraction grating 23 and the second diffraction grating 24 are disposed above and below the GRIN-SCH-MQW active layer 3. Consequently, the semiconductor laser device according to the second embodiment is able to effectively prevent kinks in the linearity of the emitted laser light output intensity that corresponds to the injected current.

The semiconductor laser device according to the second embodiment also emits laser beams having multiple longitudinal oscillation modes and allows wavelength selection by means of diffraction gratings. Also, as can be inferred from FIG. 6, the shift in the wavelength with respect to the change in temperature in this embodiment is very small as compared to a Fabry-Perot type semiconductor laser device.

As in the first embodiment, a current non-injection layer can be provided in the second embodiment as well. As provision of a current non-injection layer further prevents the flow of current into the first diffraction grating 23 and the second diffraction grating 24, the shift of radiation wavelength can be further prevented.

Figure 11:
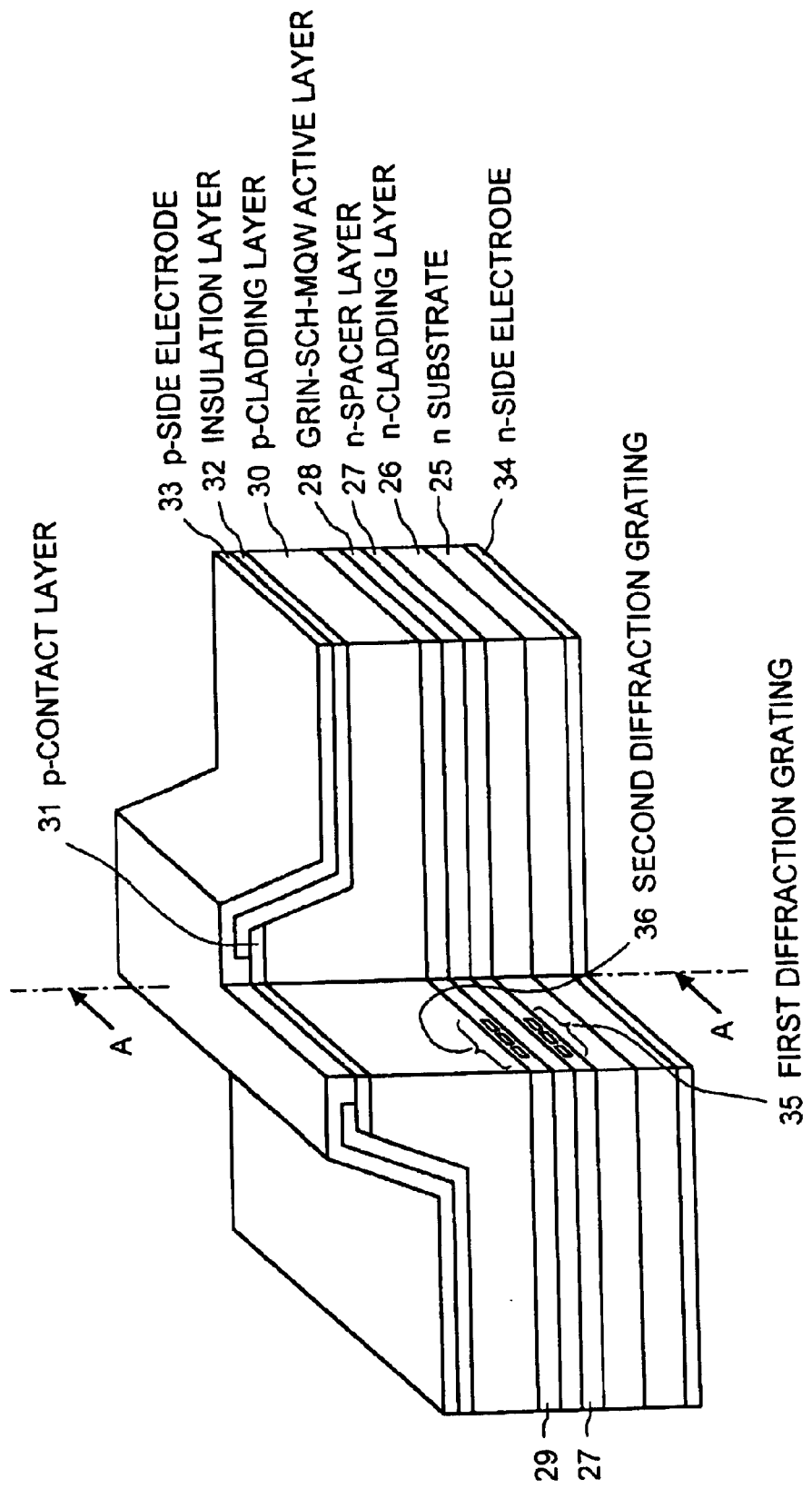
FIG. 11 is a cutaway view of a first variation of the semiconductor laser device according to the second embodiment of the present invention.
Figure 12:
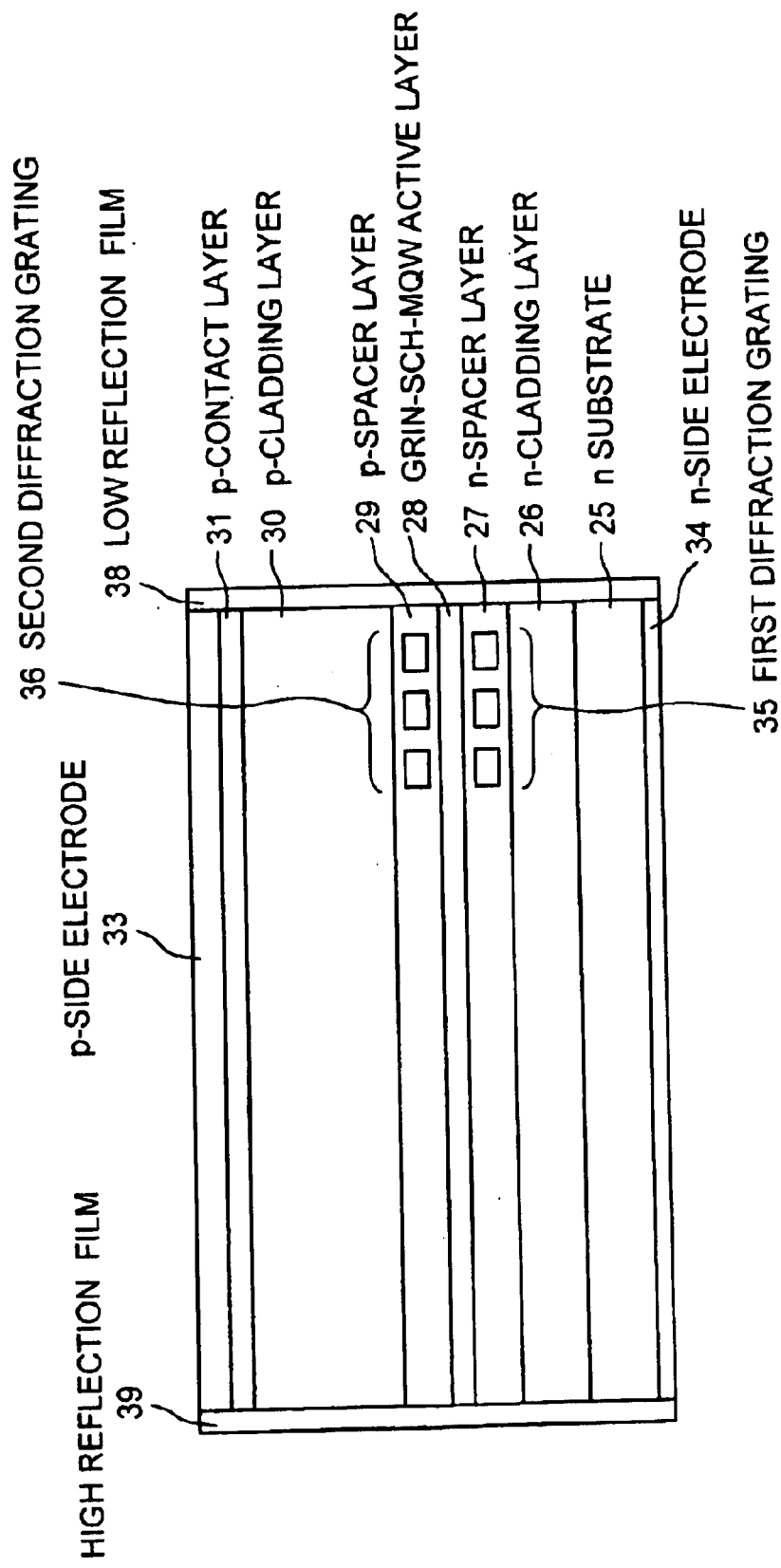
FIG. 12 is a sectional view of the semiconductor laser device shown in FIG. 11 taken along the line A—A.

A first variation of the semiconductor laser device according to the second embodiment of the present invention is explained next with reference to FIG. 11 and FIG. 12. FIG. 11 is a cutaway view and FIG. 12 is a sectional view of FIG. 11 taken along the line A—A. The semiconductor laser device in the first variation has a ridge-type structure and has a first diffraction grating and a second diffraction grating.

As shown in FIG. 11, the first variation of the second embodiment comprises, from bottom up, an n-substrate 25, an n-cladding layer 26, an n-spacer layer 27, a GRIN-SCH-MQW active layer 28, a p-spacer layer 29, and a p-cladding layer 30. A ridge structure is provided above the p-cladding layer 30. The width of the ridge, which is in the direction of the laser beam emission, is narrow. A p-contact layer 31 is laminated on the top surface of the ridge structure. An insulation layer 32 covers the entire surface of the p-contact layer 31 except for a portion on top. Above the insulation layer 32 and the uncovered p-contact layer 31 is provided a p-side electrode 33. An n-side electrode 34 is disposed on the other surface of the n-substrate 25. All the parts that are similar to those in the first and the second embodiments have the same names and, unless mentioned otherwise, have identical functions.

The n-substrate 25 is formed from an n-type GaAs and the n-cladding layer 26 and the n-spacer layer 27 are formed from an n-type AlGaAs. The p-spacer layer 29 and the p-cladding layer 30 are formed from a p-type AlGaAs and the p-contact layer 31 is formed from GaAs doped heavily with p-type impurities.

A first diffraction grating 35 is embedded in the n-spacer layer 27 in a position that corresponds to the ridge structure disposed above the p-cladding layer 30. Similarly, a second diffraction grating 36 is embedded in the p-spacer layer 29 in a position that corresponds to the ridge structure. The first diffraction grating 35 and the second diffraction grating 36 have the same structure as the diffraction gratings in the second embodiment of the present invention. For instance, the first diffraction grating has a structure such that it can select a multiple longitudinal oscillation laser beam having a center wavelength of $\lambda_1$ (=971 nm) and the second diffraction grating 36 has a structure such that it can select a multiple longitudinal oscillation laser beam having a center wavelength of $\lambda_2$ (=979 nm).

As shown in FIG. 12, a low reflection film 38 is provided on the radiation end surface (right side in FIG. 12) and a high reflection film 39 is provided on the reflection end surface (left side in FIG. 12).

The p-side electrode 33 is connected to a not shown external power source. The current from the external source reaches the GRIN-SCH-MQW active layer 28 via the boundary face of the p-side electrode 33 and the p-contact layer 31 and through the ridge structure on the p-cladding layer 30. As the electric current flows in the area corresponding to the width of the ridge structure, the intensity of the injected current is increased whereby the light output power is increased and, the multiple longitudinal oscillation of the laser is taken place by the first diffraction grating 35 and the second diffraction grating 36.

Figure 13:
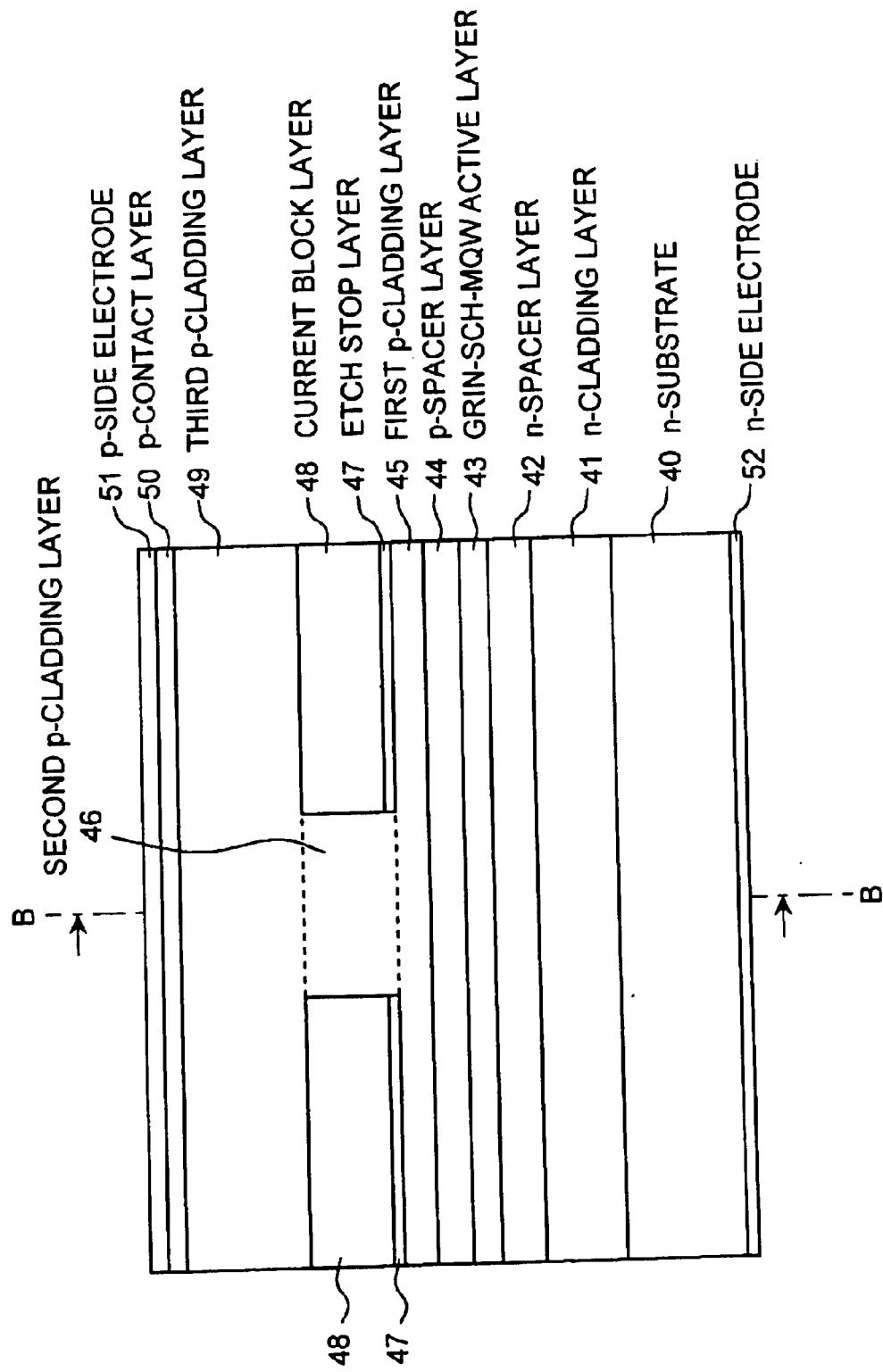
FIG. 13 is a front view of a second variation of the semiconductor laser device according to the second embodiment of the present invention.
Figure 14:
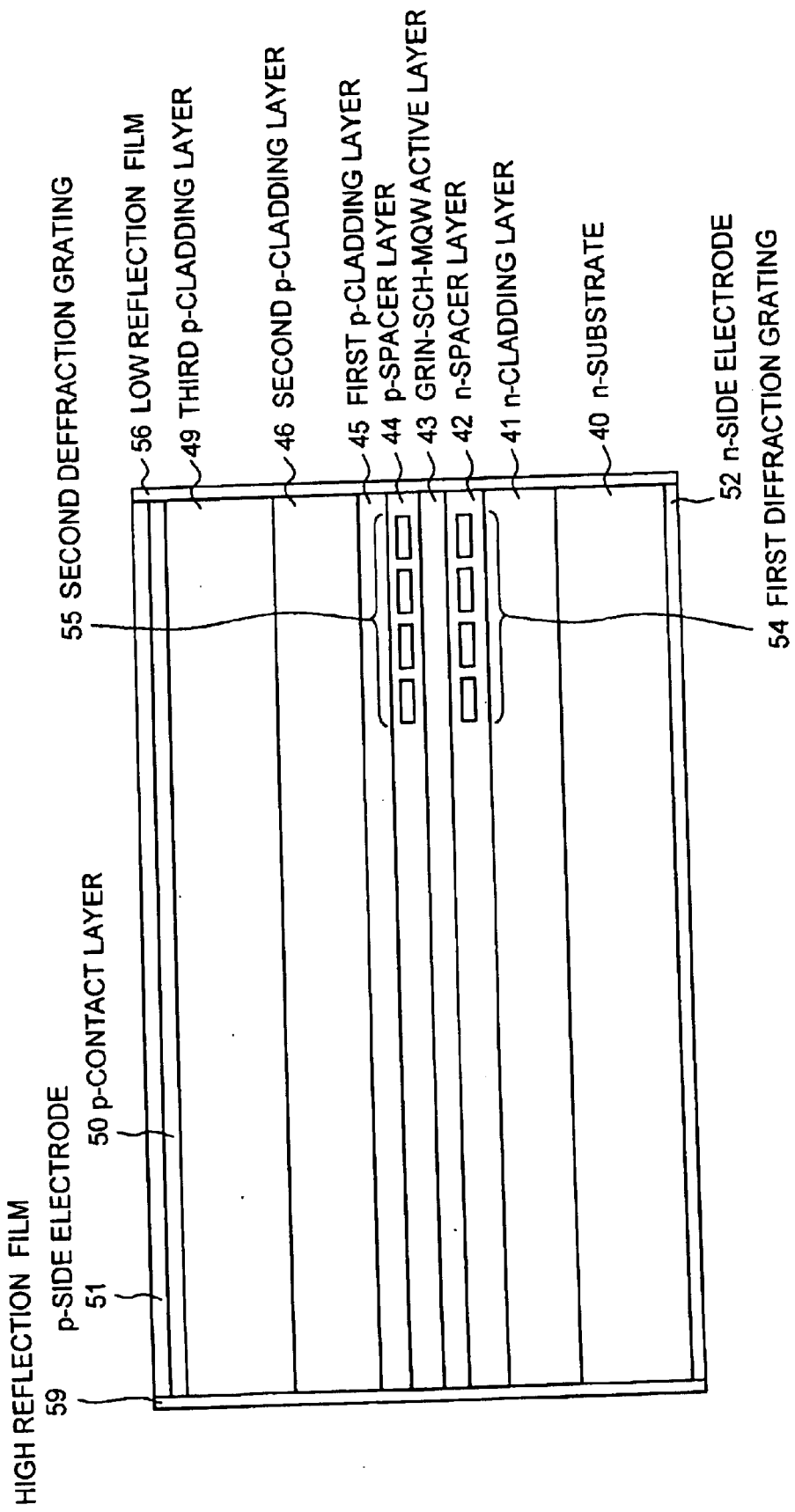
FIG. 14 is a sectional view of the semiconductor laser device shown in FIG. 13 taken along the line B—B.

A second variation of the semiconductor laser device according to the second embodiment of the present invention is explained next with reference to FIG. 13 and FIG. 14. FIG. 13 is a front view of and FIG. 14 is a sectional view of FIG. 13 taken along the line B—B. The semiconductor laser device in the second variation has a structure in which the diffraction gratings are embedded in a self alignment structure laser.

As shown in FIG. 13, the second variation of the second embodiment comprises, from bottom up, an n-substrate 40, an n-cladding layer 41, an n-spacer layer 42, a GRIN-SCH-MQW active layer 43, a p-spacer layer 44, and a first p-cladding layer 45. A second p-cladding layer 46 is laminated in one area on the first p-cladding layer 45. The remaining area of the first p-cladding layer 45 is covered by an etching stop layer 47 and a current blocking layer 48. A third p-cladding layer 49, a p-contact layer 50, and a p-side electrode 51 are laminated above the second p-cladding layer 46 and the current blocking layer 48. An n-side electrode 52 is disposed on the other surface of the n-substrate 40.

The n-substrate 40 is formed from an n-type GaAs and the n-cladding layer 41 and the n-spacer layer 42 are formed from an n-type AlGaAs. The p-spacer layer 44, the first p-cladding layer 45, the second p-cladding layer 46, and the third p-cladding layer 49 are formed from AlGaAs. The etching stop layer 47 is formed from GaInP or GaAs, the current blocking layer 48 is made of an n-type AlGaAs and the p-contact layer 50 is formed from GaAs doped heavily with p-type impurities.

As shown in FIG. 14, a first diffraction grating 54 is embedded in the n-spacer layer 42 in one area below the second p-cladding layer 46. A second diffraction grating 55 is embedded in the p-spacer layer 44 in one area below the p-cladding layer 46. The two diffraction gratings are formed from a p-type GaAs and select multiple longitudinal oscillation mode laser beams having specific center wavelengths. A low reflection film 56 is provided on the radiation end surface (right side in FIG. 14) and a high reflection film 57 is provided on the reflection end surface (left side in FIG. 14).

In the second variation, the current blocking layer 48 blocks the current that is introduced from the p-side electrode 51. Hence the current flow in the GRIN-SCH-MQW active layer 43 is restricted to the area corresponding to the bottom portion of the second p-cladding layer 46. The intensity of the current flowing in the GRIN-SCH-MQW active layer 43 is therefore enhanced. The first diffraction grating 54 and the second diffraction grating 55 are therefore able to select multiple longitudinal oscillation having specific center wavelengths of high efficiency of light output.

The first and the second embodiments according to the present invention can have many variations. For instance, a variation having a structure which is a combination of the first embodiment and the second embodiment is possible. As an example, a structure in which the n-spacer layer 27, described in the first variation of the second embodiment, is omitted and the first diffraction grating and the second diffraction grating are embedded in the p-spacer layer 29 is acceptable. Another variation can be to provide the current non-injection layer above the first diffraction grating and the second diffraction grating so that there is no current flow in the diffraction gratings.

Figure 15:
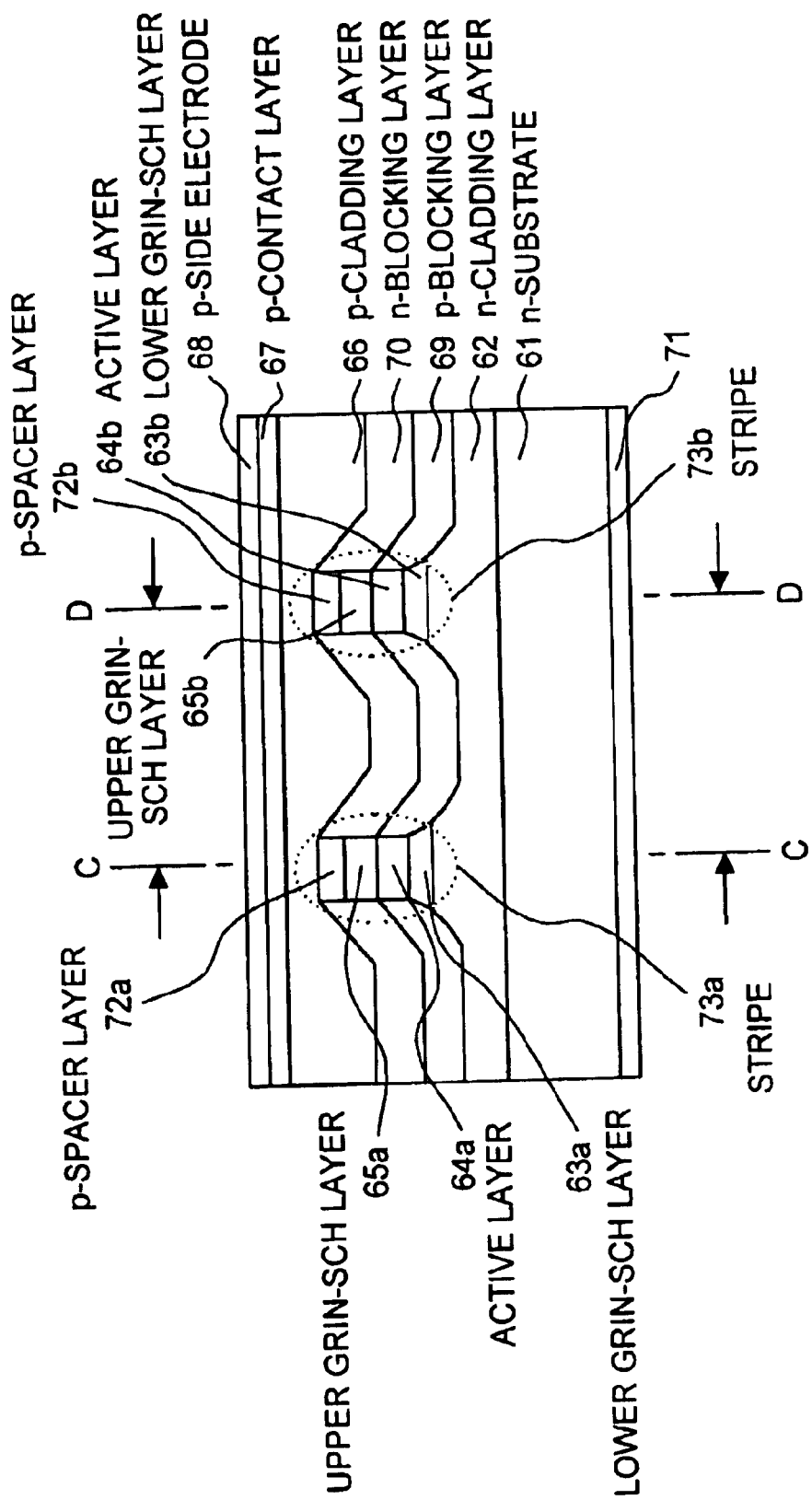
FIG. 15 is the front view of a semiconductor laser device according to the third embodiment of the present invention.
Figure 16A:
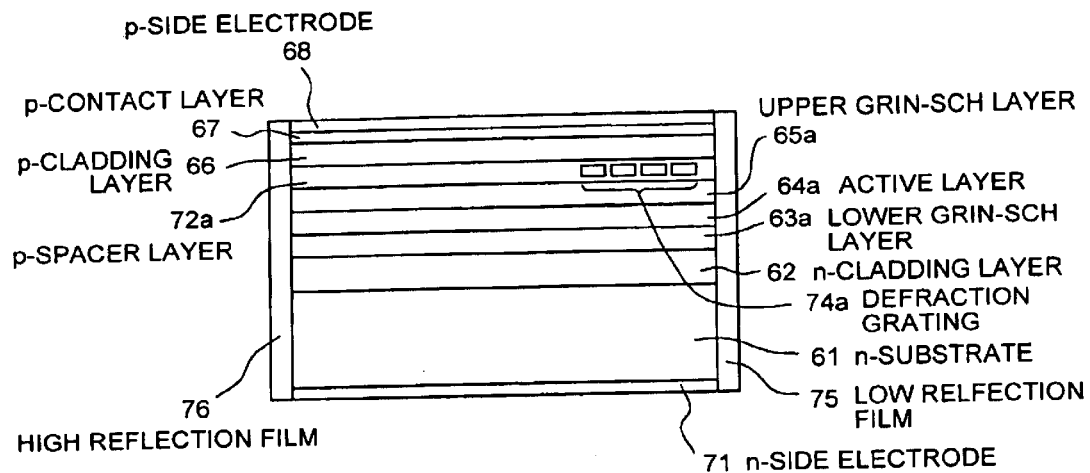
FIG. 16A is a sectional view of the semiconductor laser device shown in FIG. 15 taken along the line C—C.
Figure 16B:
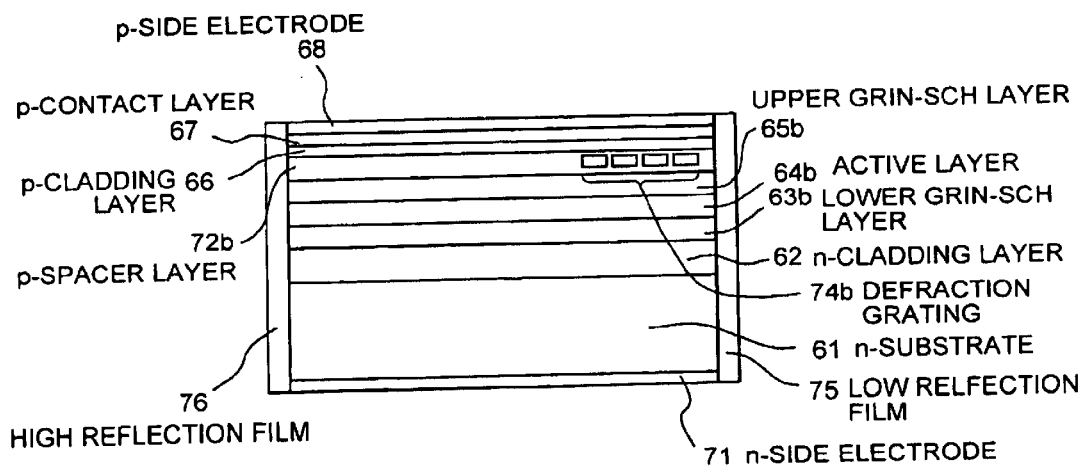
FIG. 16B is a sectional view of a semiconductor laser device shown in FIG. 15 taken along the line D—D.

A semiconductor laser device according to the third embodiment of the present invention is explained next with reference to FIG. 15, FIG. 16A and FIG. 16B. FIG. 15 is the front view. FIG. 16A is a sectional view of FIG. 15 taken along the line C—C. FIG. 16B is a sectional view of FIG. 15 taken along the line D—D.

The semiconductor laser device according to the third embodiment comprises, as shown in FIG. 15, an n-substrate 61 above which an n-cladding layer 62 is laminated. The structure at the line C—C in FIG. 15, shown in FIG. 16A, comprises a lower GRIN-SCH layer 63a, an active layer 64a, an upper GRIN-SCH layer 65a, and a p-spacer layer 72a laminated one on top of another. The four layers together comprise a first stripe 73a. Similarly, the structure at the line D—D in FIG. 15, shown in FIG. 16B, comprises a lower GRIN-SCH layer 63b, an active layer 64b, an upper GRIN-SC layer 65b, and a p-spacer layer 72b that form a second stripe 73b. The stripes 73a and 73b are spatially separated. In the portions not occupied by the stripes, an n-cladding layer 62, a p-blocking layer 69 and an n-blocking layer 70 are laminated one on top of another. This structure allows the injected current to flow only in the first stripe 73a and the second stripe 73b. A p-cladding layer 66 is laminated above the upper GRIN-SCH layers 65a and 65b, and the n-blocking layer 70. A p-contact layer 67 and a p-side electrode 68 are laminated sequentially on top of the p-cladding layer 66. An n-side electrode 71 is disposed on the bottom surface of the n-substrate 61. A first diffraction grating 74a and a second diffraction grating 74b are embedded in the p-spacer layers 72a and 72b, respectively, as shown in FIG. 16A and FIG. 16B.

The n-cladding layer 62 functions as a buffer layer as well, apart from functioning as a cladding layer. The semiconductor laser device according to the third embodiment of the present invention has a double hetero structure as it has a structure such that the n-cladding layer 62 and the p-cladding layer 66 clamp the stripes 73a and 73b from above and below. High emission efficiency is achieved by effectively confining the carrier in the active layer.

In the first stripe 73a comprising the lower GRIN-SCH layer 63a, an active layer 64a and an upper GRIN-SCH layer 65a, if the active layer 64a has an multi quantum well structure, a GRIN-SCH-MQW (Graded Index—Separate Confinement Hetero structure Multi Quantum Well) active layer is formed. If the active layer 64a has a single quantum well structure, a GRIN-SCH-SQW (Graded Index—Separate Confinement Hetero structure Single Quantum Well) active layer is formed. A more effective carrier confinement is achieved with the help of GRIN-SCH-MQW and GRIN-SCH-SQW active layers. These, in combination with the double hetero structure, help realize very high emission efficiency. The same applies for the second stripe 73b.

High output can be obtained if the semiconductor laser device is a GaInAsP system on an InP substrate, and the active layers 64a and 64b satisfy the following two conditions. Namely, the active layers should have a compression strain quantum well structure which has a strain amount of 0.5% to 1.5% with respect to the lattice constant of n-substrate 61, and the number of wells in the multi quantum well should be many, for example about 5. On the other hand, if the semiconductor laser module is a GaInAs system or a GaInAsP system on a GaAs substrate, the quantum well has either one or two wells. Further, if a strain compensating structure for imparting a countering tensile strain in the barrier layer is provided, there is no need to set an upper limit for the strain amount of the well layer since the stacked strain energy in semiconductor crystal maintain at low level.

As mentioned above, a first diffraction grating 74a is embedded in one area in the p-spacer layer 72a of the first stripe 73a. A second diffraction grating 74b is embedded in one area in the p-spacer layer 72b of the second stripe 73b The gratings that form the first diffraction grating 74a and the second diffraction grating 74b are made of p-type semiconductors and have different periods. It is preferable that the laser radiation surface ends of the diffraction grating 74a and the diffraction grating 74b be in contact with the laser radiation surface. However, it is acceptable if the laser radiation surface ends of the diffraction grating 74a and 74b are within 100 µm from the laser radiation end surface.

It is preferable that the product of the diffraction grating length in the laser radiation direction and the coupling coefficient for each of the first diffraction grating 13 and the second diffraction grating 14 is 0.3 or less. Otherwise, there is a danger of kinks appearing in the linearity of the laser light output intensity that corresponds to the injected current.

The high reflection film 76 has a reflectivity of over 80% and, ideally, 98%. On the other hand, the low reflection film 75 prevents reflection of laser beam on the radiation end surface, and has a reflectivity of less than 2% or, ideally, 1%. However, the reflectivity of the low reflection film is optimized corresponding to the length of the laser emission direction.

The operation of the semiconductor laser device according to the third embodiment of the present invention is explained next. The injection of current into stripe 73a and the laser emission from stripe 73a and 73b are explained first.

An electric current is injected from p-side electrode 68 towards n-side electrode 71. The carrier is recombined in the active layer 64a and an induced stimulated radiation takes place. The spectrum of emitted laser beam has a certain degree of spectrum width. The first diffraction grating 74a selects a multiple longitudinal oscillation mode laser beam with a specific center wavelength as it is formed from gratings that have a different refractive index from the surrounding p-spacer layer 72a and a specific diffraction grating period. As a result, a multiple longitudinal oscillation mode laser beam having a specific wavelength is emitted from the first stripe 73a. The same applies for the second stripe 73b. The second diffraction grating 74b in the second stripe 73b also selects a laser beam of a specific center wavelength. The center wavelengths that the first diffraction grating 74a and the second diffraction grating 74b can select is determined by the period of the respective diffraction gratings. The first diffraction grating 74a and the second diffraction grating 74b are composed in such a way that they select laser beams having different center wavelengths.

In the semiconductor laser device according to the third embodiment, the first diffraction grating 74a and the second diffraction grating 74b are composed in such a way as to select multiple longitudinal oscillation mode laser beam having a center wavelength of 971 nm and 979 nm, respectively.

Consequently, the semiconductor laser module according to the third embodiment of the present invention emits multiple longitudinal oscillation mode laser beams having $\lambda_1$ (=971 nm) and $\lambda_2$ (=979 nm) as the center wavelengths.

Figure 5A:
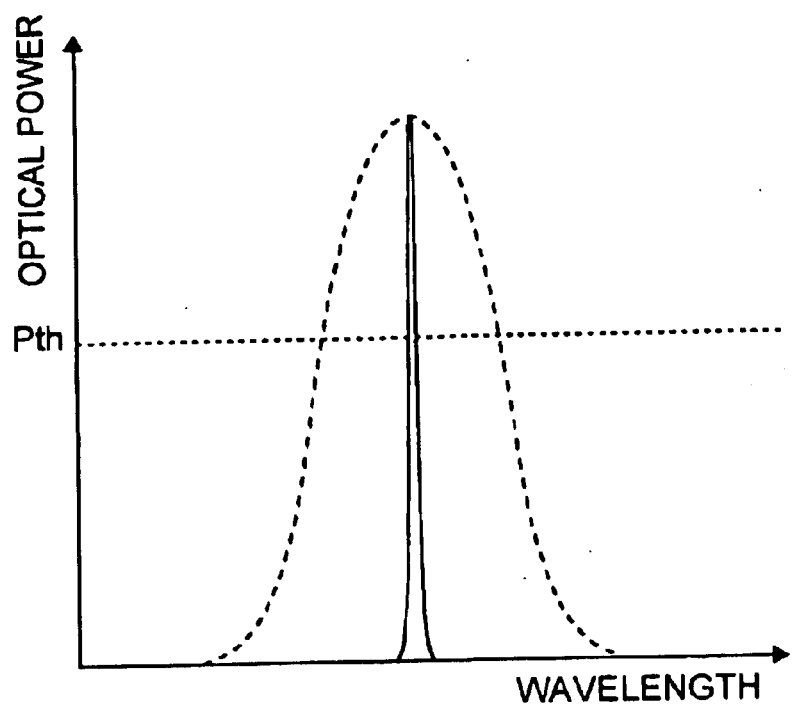
FIG. 5A and FIG. 5B are graphs that show the laser beam emitted from the semiconductor laser device according to the first embodiment of the present invention, and the conventional single mode laser beam, for comparison.
Figure 5B:
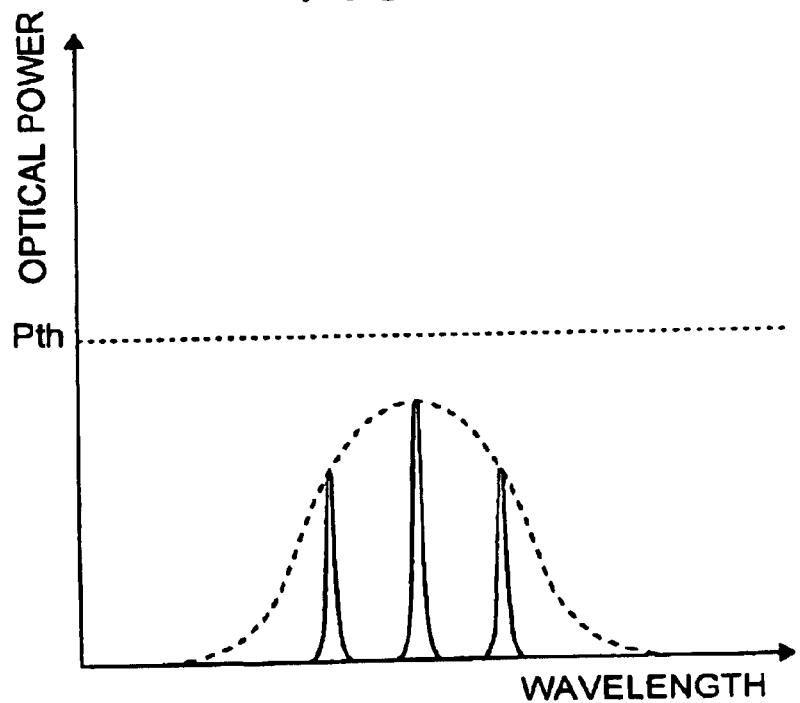

The oscillation spectrums of the semiconductor laser devices according to the third embodiment and prior art are compared with reference to FIG. 5A and FIG. 5B. FIG. 5A is the oscillation spectrum of a laser beam having a single oscillation mode generated by the conventional semiconductor device. FIG. 5B is the oscillation spectrum of a laser beam generated by the semiconductor device according to the third embodiment of the present invention. The value of the injected current and the center wavelength (oscillation wavelength in FIG. 5A) are kept identical in both the cases.

The shift in wavelength with respect to the change in temperature of the active layers 64a and 64b is explained next with reference to FIG. 6. In FIG. 6, the line $I_1$ represents the shift in the wavelength with respect to the change in temperature in a semiconductor laser device according to the third embodiment. The line $I_2$ represents the shift in the wavelength with respect to the change in temperature in the conventional Fabry-Perot type semiconductor laser device. The semiconductor laser device according to the third embodiment has a structure that produces two laser beams of different center wavelengths. The line $I_1$ slopes according to the shift of wavelengths in the two laser beams. The shift of wavelength with respect to temperature in the conventional semiconductor laser device is 0.4 nm/K. However, the shift of wavelength with respect to temperature in the semiconductor laser device according to the first embodiment is 0.1 nm/K, which is one-fourth of the shift in the conventional semiconductor laser device.

In the conventional Fabry-Perot type semiconductor laser device, as the oscillation wavelength is measured according to the transition energy of the MQW in the active layer, the shift in wavelength with respect to the change in temperature is large. On the other hand, in the semiconductor laser device according the third embodiment, the oscillation wavelength is selected by the first diffraction grating 74a and the second diffraction grating 74b. As a result, the shift in the oscillation wavelength mainly depends on the refractive index change of the first diffraction grating 74a and the second diffraction grating 74b and the refractive index change of the p-spacer layers 72a and 72b. Therefore, the semiconductor laser device according the third embodiment of the present invention has a small change of oscillation wavelength with respect to temperature change, unlike the conventional semiconductor laser device.

In the semiconductor laser device according to the third embodiment, the first diffraction grating 74a and the second diffraction grating 74b select laser beams of specific wavelengths from the beam that is emitted from the active layers 64a and 64b. As the first stripe 73a and the second stripe 73b get electric current from the same p-side electrode 68, the two stripes get approximately the same amount of current and therefore the rise in temperature is also approximately the same. Consequently the temperature change-dependent refractive index change of the two stripes also is the same. Therefore, the wavelengths of the multiple longitudinal oscillation mode laser beams with specific center wavelengths selected by the first diffraction grating 74a and the second diffraction grating shift by the same amount, thereby maintaining a constant difference of the central wavelength.

A first variation of the semiconductor laser device according to the third embodiment is explained next with reference to FIG. 17, which shows the front view. In this first variation, there is a separation groove 85 between the first stripe 73a and the second stripe 73b. An insulating film 84 is laminated on the surface of the separation groove 85. Consequently, the p-side electrode is divided into a first p-side electrode 68a disposed on the first stripe 73a and a second p-side electrode 68b disposed on the second stripe 73b. The advantages of this kind of structure are explained next.

Because of the separation of the p-side electrode the electric current injection from p-side electrode 68a and p-side electrode 68b can be independently controlled. Further, due to the presence of the p-blocking layer 69 and the n-blocking layer 70, the flow of the injected electric current to areas other than the stripes 73a and 73b is prevented.

By controlling the amount of electric current injected from the p-side electrodes 68a and 68b, the amount of electric current flow in the stripes 73a and 73b can be controlled. For instance, the injected electric current can be controlled in such a way that the electric current flow in the two stripes is identical. Similarly, the injected current can be controlled to cause a difference in the electric current flow in the two stripes, thereby causing a difference in the shift of center wavelengths of the emitted laser beams.

A second variation of the semiconductor laser device according to the third embodiment of the present invention is explained next with reference to FIG. 18, FIG. 19A and FIG. 19B. FIG. 18 is a front view, FIG. 19A is a sectional view of FIG. 18 along the line E—E, and FIG. 19B is a sectional view of FIG. 18 along the line F—F.

In the second variation of the third embodiment, in a first stripe 88a, an n-spacer layer 86a is disposed below the lower GRIN-SCH layer 63a, and in a second stripe 88b, an n-spacer layer 86b is disposed below the lower GRIN-SCH layer 63b. As shown in FIG. 19A, a first diffraction grating 87a is embedded in one area in the n-spacer layer 86a, and as shown in FIG. 19B, a second diffraction grating 87b is embedded in one area in the n-spacer layer 86b. The diffraction gratings 87a and 87b are formed from n-type semiconductors. The diffraction gratings in this variation also can select multiple longitudinal oscillation mode laser beams having specific center wavelengths.

Figure 20:
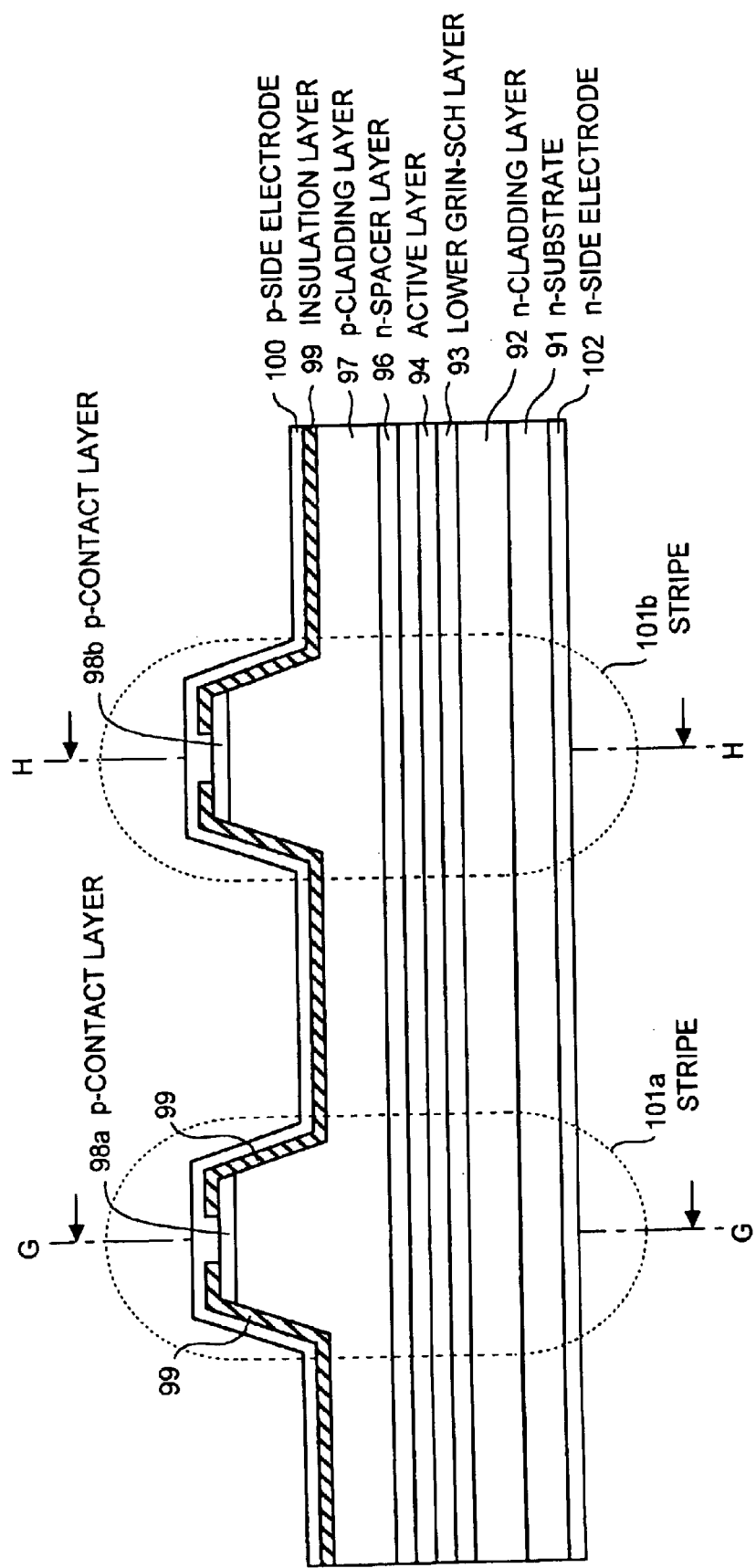
FIG. 20 is a front view of a third variation of the semiconductor laser device according to the third embodiment of the present invention.
Figure 21A:
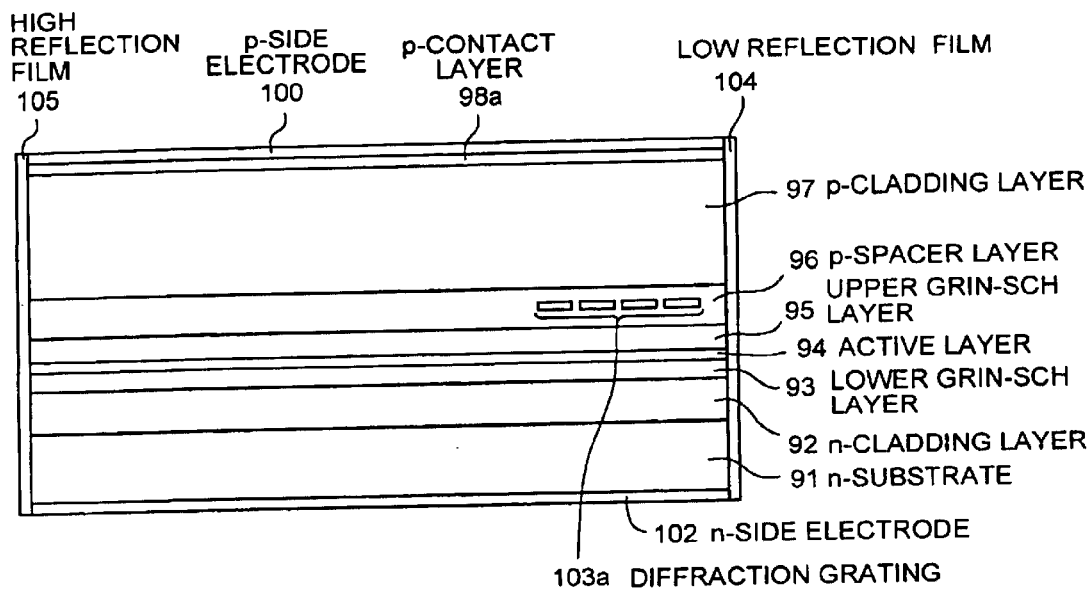
FIG. 21A is a sectional view of the semiconductor laser device shown in FIG. 20 taken along the line G—G.
Figure 21B:
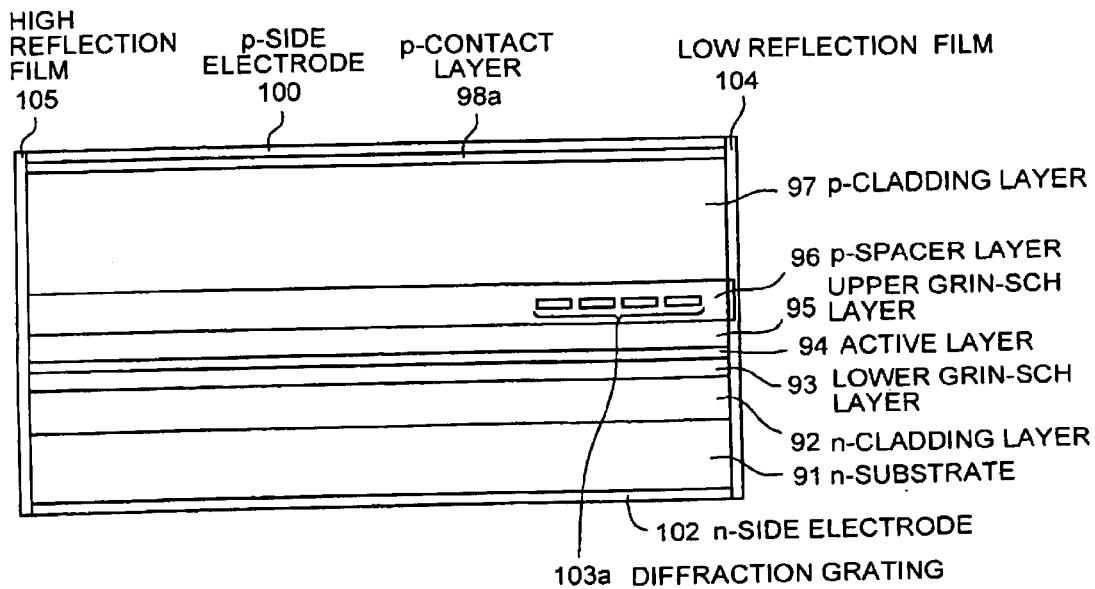
FIG. 21B is a sectional view of the semiconductor laser device shown in FIG. 20 taken along the line H—H.

A third variation of the semiconductor laser device according to the third embodiment of the present invention is explained next with respect to FIG. 20, FIG. 21A and FIG. 21B. FIG. 20 is a front view, FIG. 21A is a sectional view of FIG. 20 along the line G—G, and FIG. 21B is a sectional view of FIG. 20 along the line H—H. The third variation is a ridge-type semiconductor laser device that has a plurality of stripes 101a and 101b. The parts that are identical to the third embodiment have identical functions, unless mentioned otherwise.

As shown in FIG. 20, the third variation of the semiconductor laser module, from bottom up, an n-substrate 91, an n-cladding layer 92, a lower GRIN-SCH layer 93, an active layer 94, an upper GRIN-SCH layer 95, a p-spacer layer 96, and a p-cladding layer 97 laminated one on top of another. There are two ridges corresponding to a first stripe 101a and a second stripe 101b on the top portion of the p-cladding layer 97. A first p-contact layer 98a and a second p-contact layer 98b are disposed on the respective ridges. Aside from a portion of the p-contact layers 98a and 98b, an insulation layer 99 covers the entire p-cladding layer 97 and the p-contact layers 98a and 98b. A p-side electrode 100 is provided on the insulation layer 99. An n-side electrode 102 is disposed on the other surface of the n-substrate 91.

As shown in FIG. 21A, a first diffraction grating 103a is embedded in the area corresponding to the first stripe 101a within the p-spacer layer 96. Similarly, as shown in FIG. 21B, a second diffraction grating 103b is embedded in the area corresponding to the second stripe 101b within the p-spacer layer 96. The diffraction gratings 103a and 103b select multiple longitudinal oscillation mode having specific center wavelengths.

Figure 22:
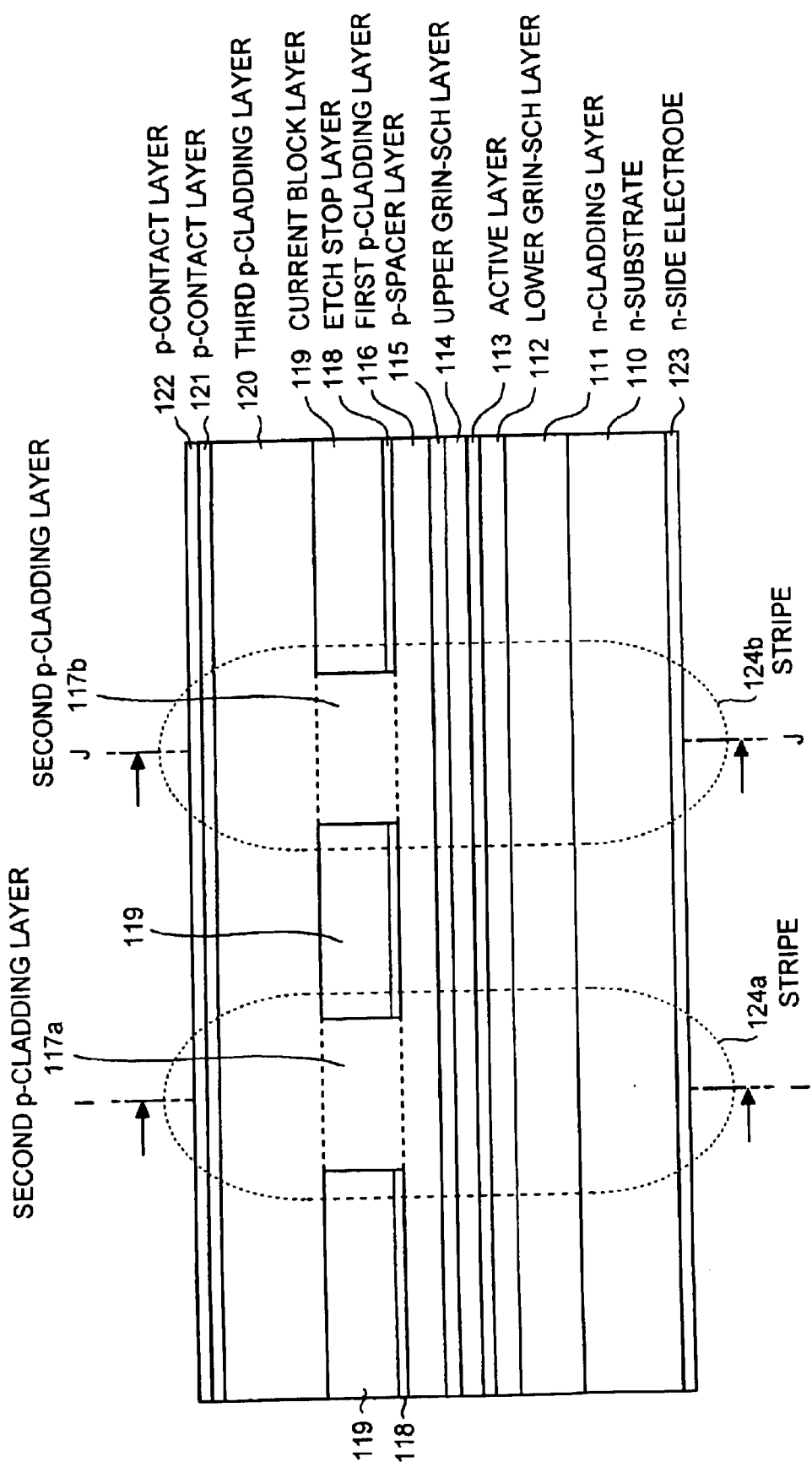
FIG. 22 shows the structure of a fourth variation of the semiconductor laser device according to the third embodiment of the present invention.
Figure 23A:
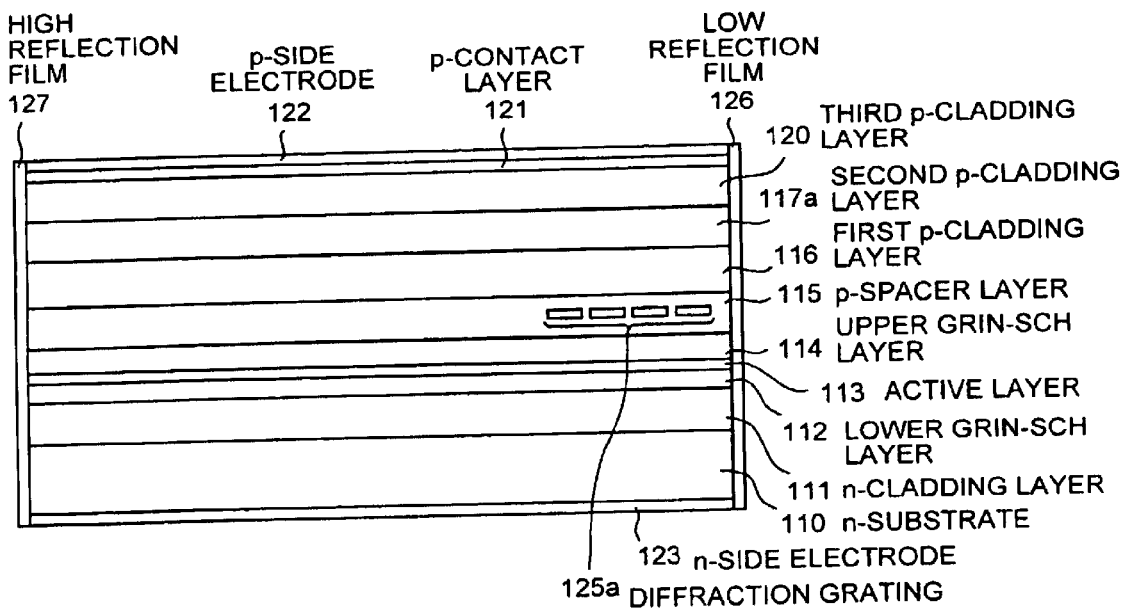
FIG. 23A is a sectional view of the semiconductor laser device shown in FIG. 22 taken along the line I—I.
Figure 23B:
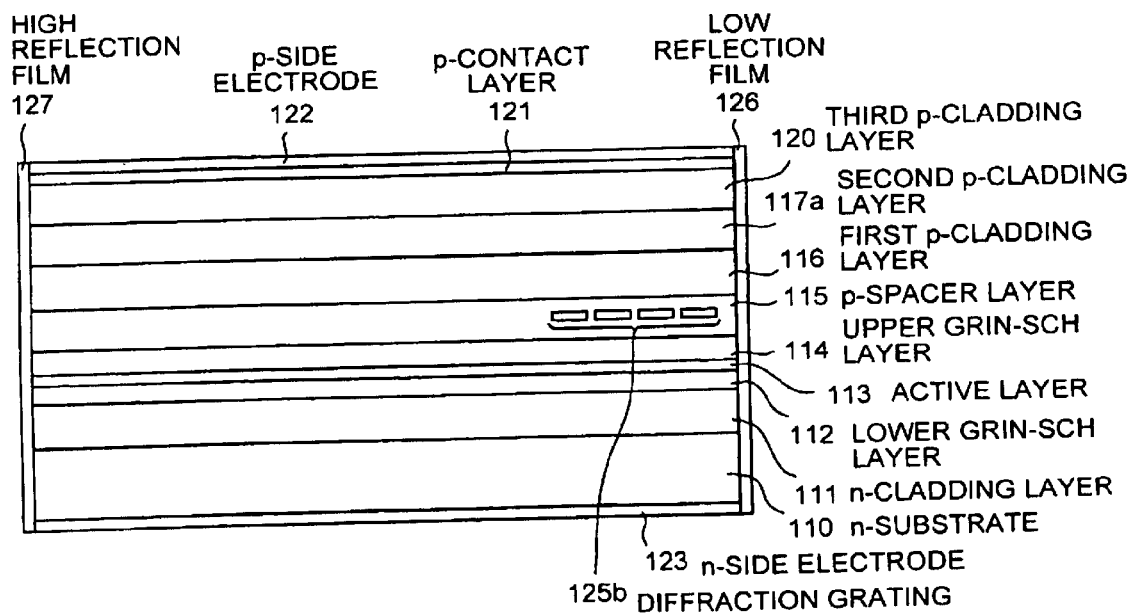
FIG. 23B is a sectional view of the semiconductor laser device shown in FIG. 22 taken along the line J—J.

A fourth variation of the semiconductor laser device according to the third embodiment of the present invention is explained next with respect to FIG. 22, FIG. 23A and FIG. 23B. FIG. 22 is a front view, FIG. 23A is a sectional view of FIG. 22 along the line I—I, and FIG. 23B is a sectional view of FIG. 22 along the line J—J. The parts that are identical to the third embodiment have identical functions, unless mentioned otherwise.

The fourth variation is a SAS (self-aligned structure)-type semiconductor laser device that has a first stripe 124a and a second stripe 124b. As shown in FIG. 22, the fourth variation of the semiconductor laser module according to the third embodiment comprises, from bottom up, an n-substrate 110, an n-cladding layer 111, a lower GRIN-SCH layer 112, an active layer 113, an upper GRIN-SCH layer 114, a p-spacer layer 115, and a first p-cladding layer 116 laminated one on top of another.

A second p-cladding layer 117a and 117b is laminated in the area corresponding to the first stripe 124a and the second stripe 124b, respectively, on the first p-cladding layer 116. The remaining area is covered by an etching stop layer 118, and a current blocking layer 119 on top of the etching stop layer 118. On top of the second p-cladding layer 117a and 117b, and the current blocking layer 119 are laminated, from bottom up, a third p-cladding layer 120, a p-contact layer 121, and a p-side electrode 122.

As shown in FIG. 23A, a first diffraction grating 125a is embedded in the area corresponding to the first stripe 124a within the p-spacer layer 115. Similarly, as shown in FIG. 23B, a second diffraction grating 125b is embedded in the area corresponding to the second stripe 124b within the p-spacer layer 115. The diffraction gratings 125a and 125b select multiple longitudinal oscillation mode having specific center wavelengths.

A fifth variation of the semiconductor laser device according to the third embodiment of the present invention is explained next. The semiconductor laser device in the fifth variation has a plurality of stripes similar to the semiconductor laser device of the third embodiment and its first to fourth variants. However, in the fifth variation, the optical waveguide paths are provided next to the radiation end surface and the reflection end surface, at least in one stripe.

FIG. 24 shows a sectional view of a stripe structure of a semiconductor laser device of the fifth variation according to the third embodiment. In this variation, at least one stripe has an n-cladding layer, an optical waveguide path 128b and a p-cladding layer laminated one on top of another on the reflection end surface side. Further, the n-cladding layer 62, an optical wave guide path 128a, another optical waveguide path 129, and the p-cladding layer 66 are laminated one on top of another on the radiation end surface side. The diffraction grating 74a is embedded in the optical waveguide path 128a.

The optical waveguide paths 128a and 128b guide the laser beam generated from the active layer 64a. The optical waveguide path 129 functions as an independent phase adjusting layer. The optical waveguide paths 128a, 128b and 129 are made of semiconductor material having a wider bandgap than the active layer 64 in order to prevent the absorption of the laser beam generated in the active layer 64.

A variant can be a semiconductor laser device with just one of optical waveguide path layers 128a and 128b. Another variant can be one in which the optical waveguide path layer 129 is omitted. Further, the diffraction grating 74a need not necessarily be embedded in the optical wave path layer 128a. It can be embedded in the optical waveguide path layer 128b, as long as it is in the vicinity of the active layer 64. In FIG. 24, no provision is shown for electric current injection. However, a p-side electrode 68 may be provided as a distinct current injection terminal on top of the optical wave guide path layer.

The semiconductor laser device according to the third embodiment and its variations are not limited to the structures described above. For instance, since wavelength can be selected by diffraction grating, instead of a double hetero structure, a homo junction laser or single hetero laser construction, which does not have a bandgap difference between the active layer and other layers, can also be used. For the same reason, a structure that allows recombination of emitted beam, even if the structure has an active layer other than GRIN-SCH-MQW, is acceptable. In the third embodiment, the p-blocking layer 69 and the n-blocking layer 70 are provided to effectively inject the carrier into the GRIN-SCH-MQW active layers 64a and 64b. As a variation, these blocking layers can be omitted and even so wavelength selection is possible.

Alternatively, the conductive type presented above as an example can be turned upside down. In other words, the substrate and buffer layer can be made p-type and the spacer layer and the cladding layer can be made n-type. In this case, the first diffraction grating 74a and the second diffraction grating 74b would need to be converted to the n-type conductive type. A current non-injection layer may be provided above the diffraction gratings 74a and 74b and between the p-side electrode 68 and the p-contact layer 67. This layer prevents the injected current from entering the two diffraction gratings 74a and 74b. This suppresses the change in the refractive index change of the gratings forming the two diffraction gratings, thereby controlling the change in the radiation wavelength. It is preferable that the material for the current non-injection layer is an insulating film. However, other n-type semiconductor material may also be used. The p-side electrode 68 above the diffraction grating layers 74a and 74b may be omitted.

Figure 25:
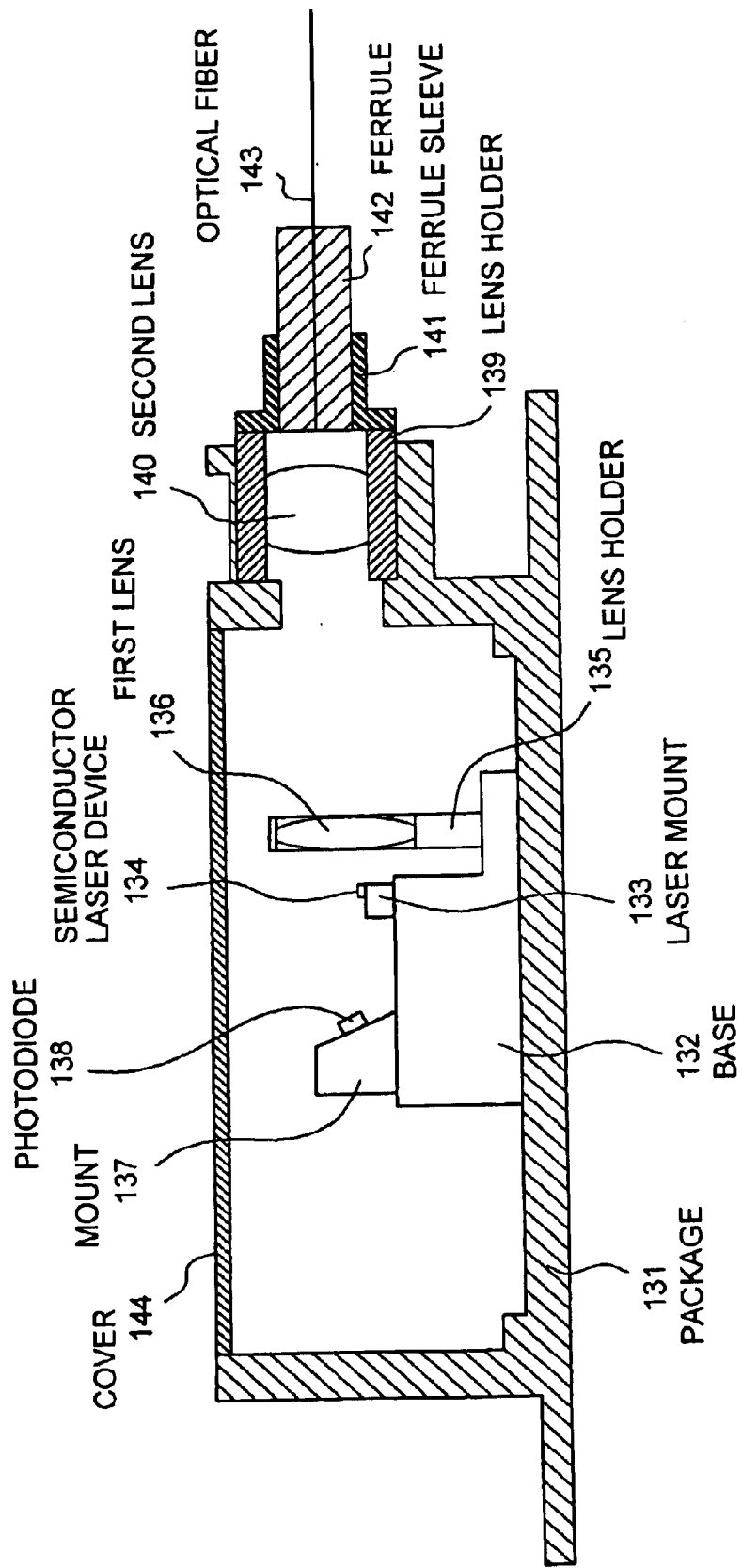
FIG. 25 is a side view of a semiconductor laser module according to the fourth embodiment of the present invention.

A semiconductor laser module according to the fourth embodiment of the present invention is explained next. This module includes a semiconductor laser device according to the first or second embodiment. As shown in FIG. 25, the semiconductor laser module comprises a package 131 inside which a base 132 is arranged. On the base are arranged a laser mount 133 which holds the semiconductor laser device 134, a mount 137 which holds a photodiode 138, and a lens holder 135 which holds a first lens 136. There is an opening in the package 131 in the laser radiation direction (right side in FIG. 25). A lens holder 139 is disposed near the opening and holds a second lens 140. In the opening again, a ferrule sleeve 141 and a ferrule 142 are provided to hold an optical fiber 143. A cover 144 covers the top of the package 131. The package 131 is made air-tight (tightly sealed).

The base 132 is made of copper-tungsten (CuW) and holds all the components that are inside the semiconductor laser module. The CuW is chosen because the heat generated from the semiconductor laser device 134 is effectively dissipated outside not only the package 131, but the entire semiconductor module. Consequently any material with good heat conductivity and having enough strength to hold all the components within the semiconductor laser module may be used.

The laser mount 133 is provided to mount the semiconductor laser device 134. The function of the laser mount 133 is to dissipate the heat generated by the semiconductor laser device 134 to the base 132 for dissipation. The material used for the laser mount in the fourth embodiment of the present invention is aluminium nitride (AlN). However any material that satisfies the conditions mentioned above may be used.

The base 132 and the laser mount 133 are only means by which the heat generated in the active layer that can endanger the laser oscillation is dissipated and do not in any way carry out any kind of temperature adjustment. Hence, the semiconductor laser module according to the fourth embodiment of the present invention is distinctly different from the semiconductor laser module that uses a temperature control module in order to maintain the temperature of the semiconductor laser device constant.

As the semiconductor laser device 134 is according to either the first or the second embodiment, it outputs multiple longitudinal oscillation mode laser beams having different center wavelengths.

The photodiode 138 is provided to monitor the optical intensity of the semiconductor laser device 134 and to output electric signal corresponding to the intensity of the laser beam emitted backward from the semiconductor laser device 134. A constant optical intensity is maintained by adjusting the intensity of electric signal of monitored optical output intensity of the laser beam emitted backward from the semiconductor laser device 134, whereby a constant electric signal is output by the photodiode 138.

The first lens 136 is provided to convert the laser beam emitted from the semiconductor laser device 134 in the forward direction into a parallel beam. The second lens 140 is provided to direct the laser beam into the optic fiber 143.

The semiconductor laser device according to the fourth embodiment is designed with the presupposition that the temperature of the active layer affects the oscillation wavelength. Therefore, no provision, like a temperature adjustment module or a temperature monitoring unit, is made in this semiconductor laser module. As a result of doing away with temperature adjustment module, etc, the package is made more compact. The manufacturing process is also simplified due to less number of components as compared to prior art, with an accompanying cost reduction.

The semiconductor laser module according to the fourth embodiment uses a semiconductor laser device according to the first or second embodiment which simultaneously emits multiple longitudinal oscillation mode laser beams having two different center wavelengths. In a device that requires two laser beams, such as an optical fiber amplifier according to the sixth embodiment described later, it is sufficient to use just a single semiconductor laser module. Again, this translates to less number of components in the optical fiber amplifier and, thereby, cost reduction.

Figure 26:
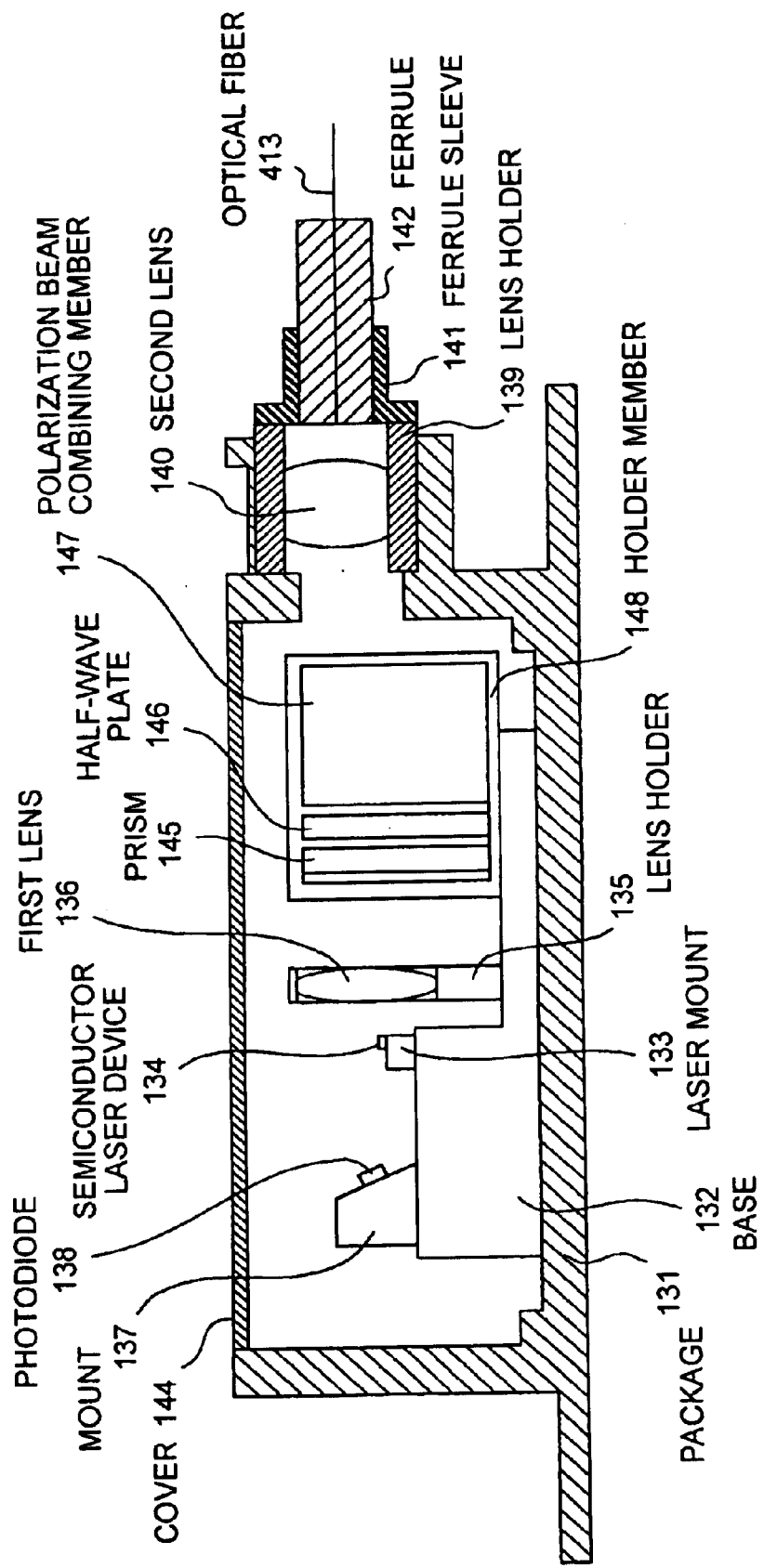
FIG. 26 is a side view of a semiconductor laser module according to the fifth embodiment of the present invention.

A semiconductor laser module according to the fifth the embodiment of the present invention is explained next. This semiconductor laser module uses the semiconductor laser device according to the third embodiment that has a plurality of stripe structures. FIG. 26 shows a side sectional view of the semiconductor laser module and FIG. 27 is a view showing frame format of the semiconductor laser module.

As shown in FIG. 26, the semiconductor laser module includes the tightly sealed package 131 inside which are provided the semiconductor laser device 134 that emits laser beams, the photodiode 138, the first lens 136, a prism 145, a half-wave plate (polarization rotation unit) 146, a polarization beam combining member (PBC) 147, and the optical fiber 143.

The semiconductor laser device 134 has the first stripe 73a and the second stripe 73b that are disposed apart from each other in a parallel fashion on the same plane and in the longitudinal direction, as described in the third embodiment. A first laser beam K1 and a second laser beam K2 are emitted from the end surface of the stripes 73a and 73b, respectively. The reference symbols K1 and K2 in FIG. 27 represent the central loci of the laser beam emitted from the stripes 73a and 73b, respectively. The two dashed lines on either side of the solid lines K1 and K2 represent the beam. The distance between the first stripe 73a and the second stripe 73b is about 40 μm.

The semiconductor laser device 134 is mounted on the laser mount 133. Alternatively, the semiconductor laser device 134 may be mounted on a heat sink (not shown), which, in turn, may be mounted on the laser mount 133.

The photodiode 138 receives the laser beam that is emitted for monitoring from the rear end surface (left side in FIG. 26) of the semiconductor laser device 134.

The first lens 136 first widens the gap between the first laser beam K1 and the second laser beam K2 when they pass through it after being emitted from the front end surface (right side in FIG. 26) of the semiconductor laser device 134, and then converge each of the laser beams K1 and K2 at different focal points (F1 and F2, respectively).

The lens holder 135 holds the first lens 136. It is preferable that the lens 136 is placed in such a way that the optical axis of the first laser beam K1 emitted from the first stripe 73a and the optical axis of the second laser beam K2 emitted from the second stripe 73b are approximately symmetrical on either side of the central axis. When the lens is placed in such a position, the laser beams K1 and K2 pass through the vicinity of the central axis of the first lens 136 that has least aberration. Therefore, the distortions in the wavefront are eliminated to produce highly effective optical coupling with the optical fiber 143. As a result, a semiconductor laser device with a higher output can be obtained. It is preferable to use a non-spherical lens as the first lens 136 in order to avoid spherical aberration and to increase coupling effectiveness with the optical fiber 143.

The prism 145 is provided between the first lens 136 and the polarization beam combining member 147. The prism 145 makes the optical axes of the entering laser beams K1 and K2 parallel to each other and outputs them. The prism 145 is made of an optical glass like BX7 (borosilicate crown glass). Since non-parallel laser beams K1 and K2 are made parallel by the prism 145, it is possible to use a simple and therefore compact structure for the next component in the semiconductor laser module, the polarization beam combining member 147.

Figure 28A:
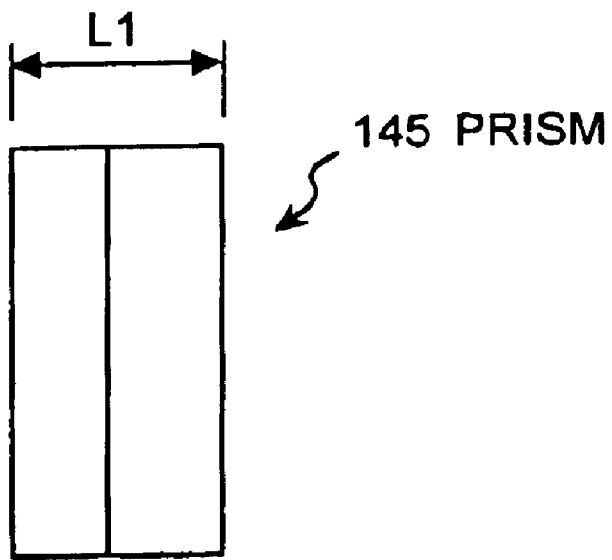
FIG. 28A is a side view that shows the structure of a prism.
Figure 28B:
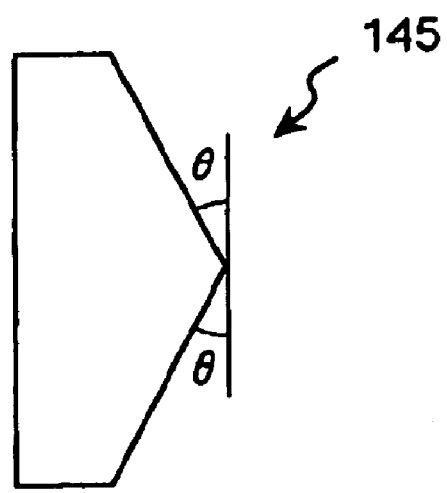
FIG. 28B is a plan view of FIG. 28A.

FIG. 28A is a side view that shows the structure of the prism 145. FIG. 28B is a plan view of FIG. 28A. The length L1 of the prism is about 1.0 mm. The prism 145 has an entrance face that is flat and an exit face that is tilted at a specific angle θ, where θ is 32.1°±0.1°

Of the laser beams K1 and K2 that have passed through the prism, only the laser beam K1 is allowed to pass through the half-wave plate 146. The half-wave plate 146 rotates the plane of polarization of the laser beam K1 by 90°.

The polarization beam combining member 147 includes a first port 147a from which the first laser beam K1 enters, a second port 147b from which the second laser beam K2 enters, and a third port 147c from which the first laser beam K1 entering from the first port 147a, and the second laser beam K2 entering from the second port 147b are multiplexed and emitted.

The polarization beam combining member 147 is a birefringence element which propagates the first laser beam K1, for example, as an ordinary ray to the third port 147c and the second laser beam K2 as an extraordinary ray to the third port 147c. When the polarization beam combining member 147 is the birefringence element, it is made of TiO2 (rutile), so that its birefringence index is high and the separation width between the laser beams is large.

Figure 29A:
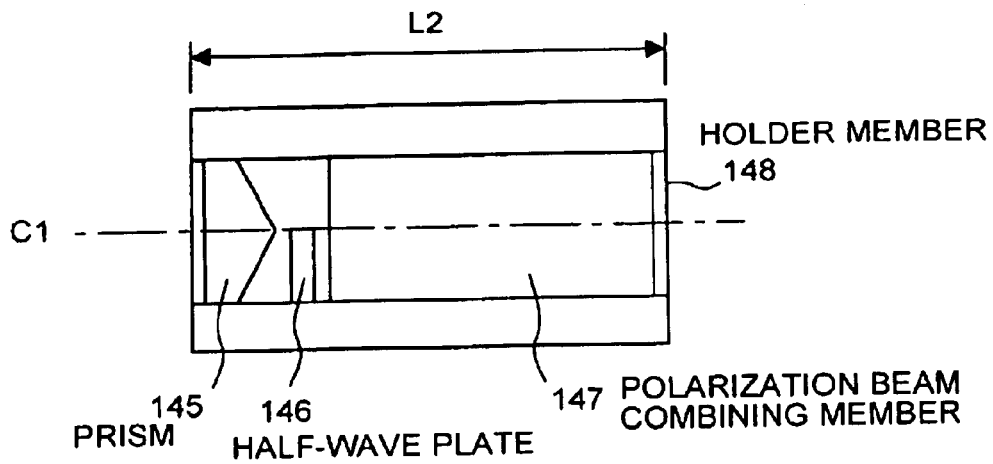
FIG. 29A is a plan view of a holder member which houses the prism, a half-wave plate and a polarization beam combining member.
Figure 29B:
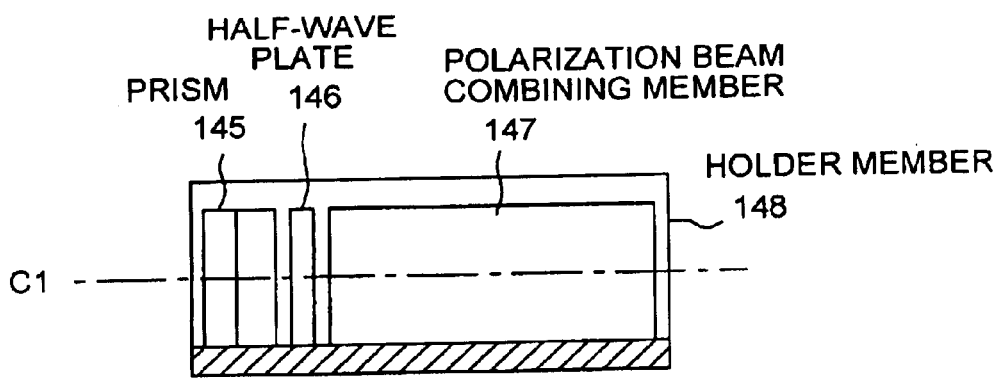
FIG. 29B is a side view of the holder.
Figure 29C:
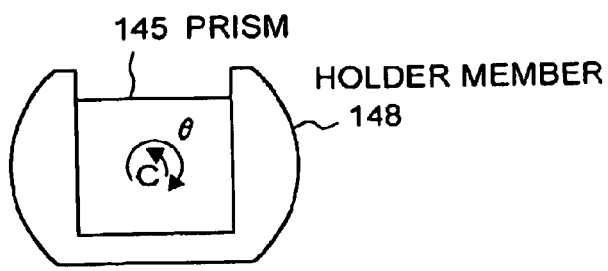
FIG. 29C is a front view of the holder.

In the fifth embodiment, the prism 145, the half-wave plate 146 and the polarization beam combining member 147 are fixed to the same holder member 148. FIG. 29A is a plan view that shows the holder member 148 which fixes the prism 145, the half-wave plate 146 and the polarization beam combining member 147. FIG. 29B is a side sectional view of FIG. 29A, and FIG. 29C is a front view of FIG. 29A. As shown in FIG. 29A, FIG. 29B, and FIG. 29C, the holder member 148 is made of a material which can be YAG laser-welded (for example, SUS 403, 304 and the like), its length L2 is approximately 7.0 mm, and it almost columnar. A housing section is formed in the holder member 148. The prism 145, the half-wave plate 146, and the polarization beam combining member 147 are fixed to the housing section. The top of the holder member 148 is open, and the bottom is flat.

As a result, positions around the central axis Cl of the prism 145 and the polarization beam combining member 147 can be easily adjusted so that the first laser beam K1 which enters from the first port 147a of the polarization beam combining member 147 and the second laser beam K2 which enters from the second port 147b are emitted from the third port 147c.

The second lens 140, which optically couples the laser beam emitted from the third port 147c of polarization multiplexing combining member 147 in the optical fiber 143, is provided between polarization beam combining member 147 and optical fiber 143. The first lens 136 is located such that the first laser beam K1 and the second laser beam K2 form focal points (F1, F2) between the first lens 136 and the second lens 140. As a result, after the first laser beam K1 and the second laser beam K2 pass through the first lens 136, the propagation distance L required for separation (the distance D' in FIG. 27 becomes a sufficiently large) becomes short, and thus the length of the semiconductor laser module in an optical axis direction can be shortened. This makes it possible to provide the semiconductor laser module with high reliability in which time stability of the optical coupling between the semiconductor laser device 134 and the optical fiber 143 is excellent under conditions of high temperature.

The laser mount 133 to which the semiconductor laser device 134 is fixed and the mount 137 to which the photodiode 138 is fixed are soldered and fixed to the base 132 having an almost L-shaped section. The base 132 is preferably made of a CuW alloy or the like in order to heighten the radiation property with respect to heat generation of the semiconductor laser device 134.

The operation of the semiconductor laser module of the fifth embodiment will be explained. The first laser beam K1 and the second laser beam K2, which are emitted respectively from the front end surfaces of the stripe 73a and the stripe 73b of the semiconductor laser device 134, pass through the first lens 136 to cross each other, and the distance between the beams K1 and K2 widens before they enter the prism 145. The distance (D) between the first laser beam K1 and the second laser beam K2 is approximately 460 μm when they enter the prism 145. The first laser beam K1 and the second laser beam K2 are made to be parallel with each other by the prism 145 when they are emitted from the prism 145. The distance between the two lasers is approximately 500 μm when they come out of the prism 145. The first laser beam K1 enters the half-wave plate 146 where its plane of polarization is rotated by 90°. Subsequently it enters the first port 147a of the polarization beam combining member 147. The second laser beam K2 enters the second port 147b of the polarization beam combining member 147.

In the polarization beam combining member 147, the first laser beam K1 that enters from the first port 147a and the second laser beam K2 that enters from the second port 147b are coupled so that the coupled beam is emitted from the third port 147c.

The laser beam emitted from the polarization beam combining member 147 is condensed by the second lens 140 and enters the end surface of the optical fiber 143 held by the ferrule 142 so as to be transmitted to the outside.

Meanwhile, the laser beam for monitoring, emitted from the rear end surface of the semiconductor laser device 134, is received by the photodiode 138, and the light receiving quantity and the like of the photodiode 138 is calculated so that an optical output and the like of the semiconductor laser device 134 is adjusted.

According to the semiconductor laser module of the fifth embodiment, since only one semiconductor laser device 134 having two stripes emitting two laser beams is used, the time required for locating the semiconductor laser device 134 is reduced. As a result, the time required to produce the semiconductor laser module can be reduced.

Since the semiconductor laser module according to the fifth embodiment is not equipped with a temperature adjusting module, its manufacturing is easy and the manufacturing time can also be reduced. The manufacturing is also easy because the temperature detector and the accompanying wiring required for controlling the temperature adjusting module is not required. It is thus possible to reduce the manufacturing cost.

Further, since beams are emitted in completely different axial directions from two semiconductor laser devices in the prior art, when the semiconductor laser module is not designed with the warpage or the like of the package in the respective axial directions is taken into consideration, a fluctuation of an optical output due to the warpage of the package, occurring due to a change or the like of an ambient temperature cannot be suppressed. However, according to the structure of this embodiment, since two light outputs from one semiconductor laser device are propagated in approximately the same direction, the influence of the warpage of the package is suppressed only in one direction so that the intensity of a light output from the optical fiber 143 can be stabilized.

In addition, two lights are output from one semiconductor laser device so that the coupling efficiency of these two lights with the optical fiber 143 fluctuates with respect to the warpage or the like of the package with the same tendency. Therefore, even when the temperature fluctuates, the degree of polarization of the light output from the optical fiber 143 is stabilized.

In the fourth and the fifth embodiments of the laser module the semiconductor laser element described in the first to third embodiments are used. However, it is preferable to provide an isolator in the module package to control the reflection of components that are outside the module.

In the fifth embodiment, a 980 nm band laser module that does not use a cooling device as an excitation light source for low cost EDFA is described. But, in 1480 nm band laser module that does not use the cooling device, too, wavelength modulation due to change in temperature poses a similar problem when EDFA is constructed. This invention can be easily applied to this band as it optimizes the structure of diffraction grating in this wavelength. Especially in laser module having multiple stripes, high wavelength stability is acquired than the heat radiation from the laser module having a single stripe. Moreover, this invention can also be applied when 14XX nm excitation light source of wavelength 1360–1520 nm band is used as excitation light source for low cost medium Raman amplifier.

In the Raman amplifier, since the length of the optical fiber, which is the amplification medium, is more than that of the EDF, a non-linear effect of fiber is observed which leads to a problem in the backscattering due to the stimulated Brillouin scattering. When this backscattering occurs, the exciting light output is effectively reduced and the desired Raman gain is not acquired. Stimulated Brillouin scattering depends on the width and number of modes near one longitudinal oscillation mode of the exciting light. In other words, optical output where stimulated Brillouin scattering occurs is in the range of milliwatts, if the width of transmission longitudinal mode of laser is less than the spectrum width of stimulated Brillouin scattering. If the width of transmission longitudinal mode of laser is greater than the spectrum width of stimulated Brillouin scattering, the optical output increases along with the increase in the width and the number of longitudinal oscillation modes also increases. Thus, by using this invention it is possible to realize an excitation light source for a low cost medium Raman amplifier having a multiple longitudinal oscillation modes and which does not have the influence of stimulated Brillouin scattering.

Figure 30:
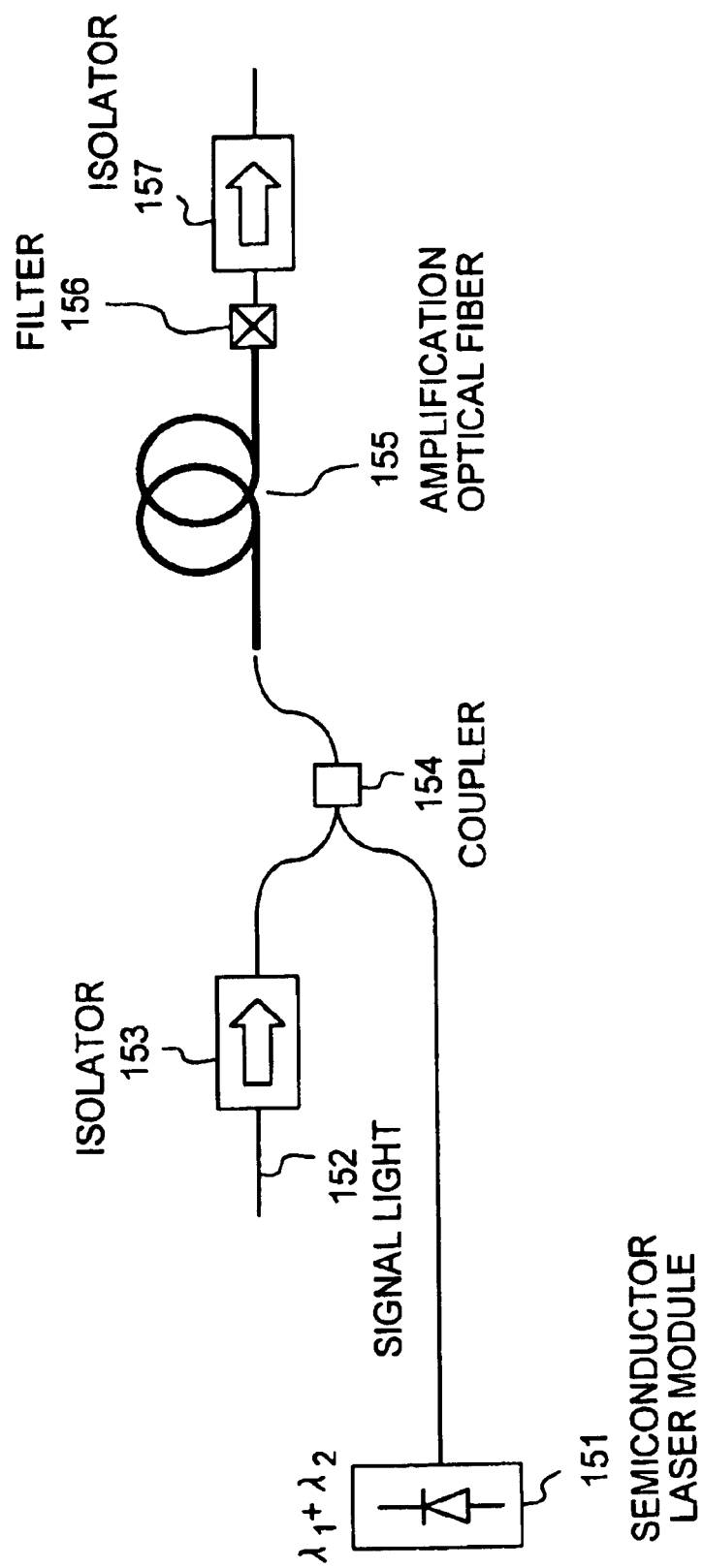
FIG. 30 is a view showing frame format of a semiconductor laser device according to the sixth embodiment of the present invention.

An optical fiber amplifier according to the sixth embodiment will be explained. The optical fiber amplifier according to the sixth embodiment is a structure using a semiconductor laser module according to fourth embodiment or fifth embodiment. FIG. 30 is a structure of optical fiber amplifier according to the sixth embodiment. The optical fiber amplifier according to the sixth embodiment has a semiconductor laser module 151 that works as an excitation light source, a WDM coupler 154 that combines the exciting light and signal light 152 emitted from semiconductor laser module 151, and an amplification optical fiber 155 that amplifies the signal light 152. Further, an isolator 153 is provided just before the signal light 152 enters the WDM coupler 154 and another isolator 157 is provided after the amplification optical fiber 155.

The signal light 152 is emitted from a not shown signal light source and is transmitted through the optical fiber. The wavelength of this signal light 152 is around 1550 nm of wavelength range. Further, the signal light 152 and the exciting light emitted from the semiconductor laser module 151 are multiplexed in the WDM coupler 154 and the resultant light is output to amplification optical fiber 155. The isolator 153 blocks the light beam reflected from the WDM coupler 154 and suppresses the noise. Further, a filter 156 prevents the exciting light that enters the amplification optical fiber 155 from entering into transmission optical fiber. The isolator 157 blocks the reflected light beam from entering the amplification optical fiber 55.

The amplification optical fiber 155 is the EDF. In the EDF, the optical fiber is doped with erbium ions ($Er^{3+}$). The erbium ions have the property of getting excited when they absorb laser beam having a wavelength of 980 nm or 1480 nm. These electrons amplify the signal light 152 with 1550 nm wavelength. The absorption coefficient for a laser beam of 980 nm wavelength in the EDF is shown in the graph in FIG. 31.

The semiconductor laser module 151 is the semiconductor laser module according to the fourth or fifth embodiment.

The semiconductor module emits two multiple longitudinal oscillation mode laser beams having two different center wavelengths $\lambda_1$ and $\lambda_2$ of 971 nm and 979 nm.

The operation of the optical fiber amplifier according to the sixth embodiment will be explained next. Two laser beams of center wavelengths $\lambda_1$ and $\lambda_2$ emitted from the semiconductor laser module 151 enter the amplification optical fiber 155 through the WDM coupler 154. The amplification optical fiber 155 which has the property of getting excited by a laser beam having a wavelength of about 980 nm, is excited because of the entry of two laser beams having a center wavelength of about 980 nm. The signal light 152 enters the amplification optical fiber 155 via the isolator 153 and the WDM coupler 154. Since the signal light 152 has a wavelength of 1550 nm, it is amplified by the amplification optical fiber 155. The amplified signal light 152 is output from the isolator 157.

Figure 31:
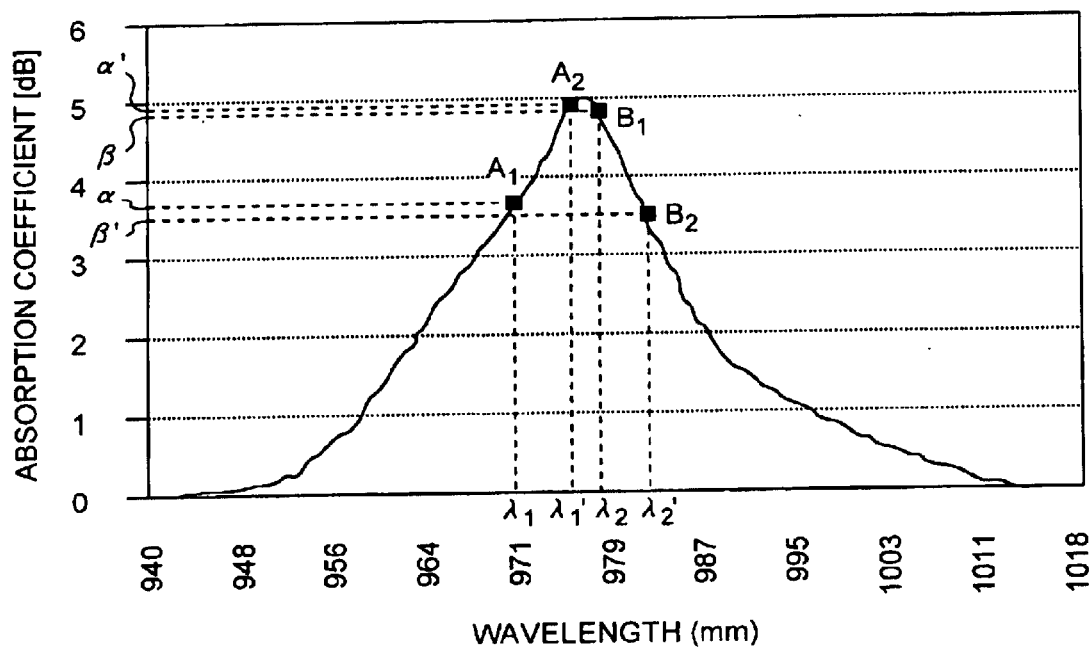
FIG. 31 is a graph that shows the relationship between the wavelength of the exciting light of an optical fiber amplifier and the absorption coefficient of an amplification optical fiber in the sixth embodiment.

Since a temperature control module is not provided in the semiconductor laser module 151 that is a component of the optical fiber amplifier according to the sixth embodiment, there is a rise in the temperature due to laser oscillation and non radiative recombination current etc. Accompanying the rise in temperature, there is a shift in the center wavelengths $\lambda_1$ and $\lambda_2$ as well. FIG. 31 is a graph showing the change in the absorption coefficient with respect to the exciting light wavelength of EDF which forms the amplification optical fiber 155. As shown in the graph, the absorption coefficient of a laser beam with a center wavelength $\lambda_1$ (=971 nm) at 0° C. is $\alpha$ and that of $\lambda_2$ (=979 nm) is $\beta$. In the semiconductor laser module 151 that is a component of the optical fiber amplifier according to the sixth embodiment, the temperature can reach as high as 70° C. when laser oscillation takes place. If we consider that the shift in the wavelength of the emitted laser beam with respect to the rise in temperature is 0.1 nm/K, the wavelengths respectively shift to $\lambda_1'$(=978 nm) and $\lambda_2'$(=986 nm) at 70° C. The absorption coefficients of the amplification optical fiber 155 change to $\alpha'$ and $\beta'$ corresponding to the shift in the wavelengths.

The absorption coefficient of the amplification optical fiber 155 is a sum the absorption coefficients of the laser beams. Therefore, the absorption coefficient of the amplification optical fiber 155 is $\alpha+\beta$ at 0° C. and $\alpha'+\beta'$ at 70° C. As can be deduced from the graph $\alpha+\beta=\alpha'+\beta'$. Further, the degree of inclination in the graph from point $A_1$ to point $A_2$ and that from point $B_1$ to $B_2$ is about the same. Therefore, it is possible to maintain a uniform value of $\alpha(T)+\beta(T)$ for the temperature T from 0° C. to 70° C. Since the absorption coefficient of the amplification optical fiber 155 and the amplification of signal light 152 are correlated, the optical fiber amplifier according to the sixth embodiment can amplify the signal light 152 uniformly with respect to the change in temperature even if the semiconductor laser module 151 is not provided with a temperature adjusting module.

As the rate of change of wavelength with respect to the change in temperature is very small compared to conventional technology, it is possible to bring the values of $\lambda_1$ and $\lambda_2$ further closer to $\lambda_0$ than in the conventional technology. Further, when a semiconductor laser device of the Fabry-Perot type is used, the shift in wavelength with respect to the change in temperature is 0.4 nm/K. Therefore, when using the optical fiber amplifier in the temperature range of 0° C. to 70° C., it is necessary that the center wavelength $\lambda1$ of the laser beam at 0° C. is 950 nm in order to keep the oscillation wavelength within the maximum wavelength for all the temperatures that satisfy the condition 0° C.<T° C.<70° C. The absorption coefficient for 950 nm is a low value and when compared to the optical fiber amplifier in the sixth embodiment, it has a gain of only about 4 points in dB unit, that is, about 40%. Therefore, it can be said that the optical fiber amplifier in the sixth embodiment can amplify the signal light 152 by a gain that is higher than in the conventional technology.

The two multiple longitudinal oscillation mode laser beams having different center wavelengths are emitted from the same active layer. Therefore the two beams can be said to be emitted at the temperature of the active layer, which may not be the case when multiple semiconductor laser devices are used.

A single optical fiber amplifier 151 according to the sixth embodiment performs the function of an excitation light source of two oscillating laser beams. Also, a temperature adjusting module and a wavelength monitor for maintaining uniform wavelengths is not required in the semiconductor laser module 151. Moreover, in the sixth embodiment, a 50/50 coupler for coupling the laser beams emitted from two semiconductor laser devices is also not required as was required in the conventional technology. Therefore, it is possible to reduce the number of components that are required to fabricate an optical fiber amplifier. The manufacturing process is made easy by simplifying the structure.

Figure 32:
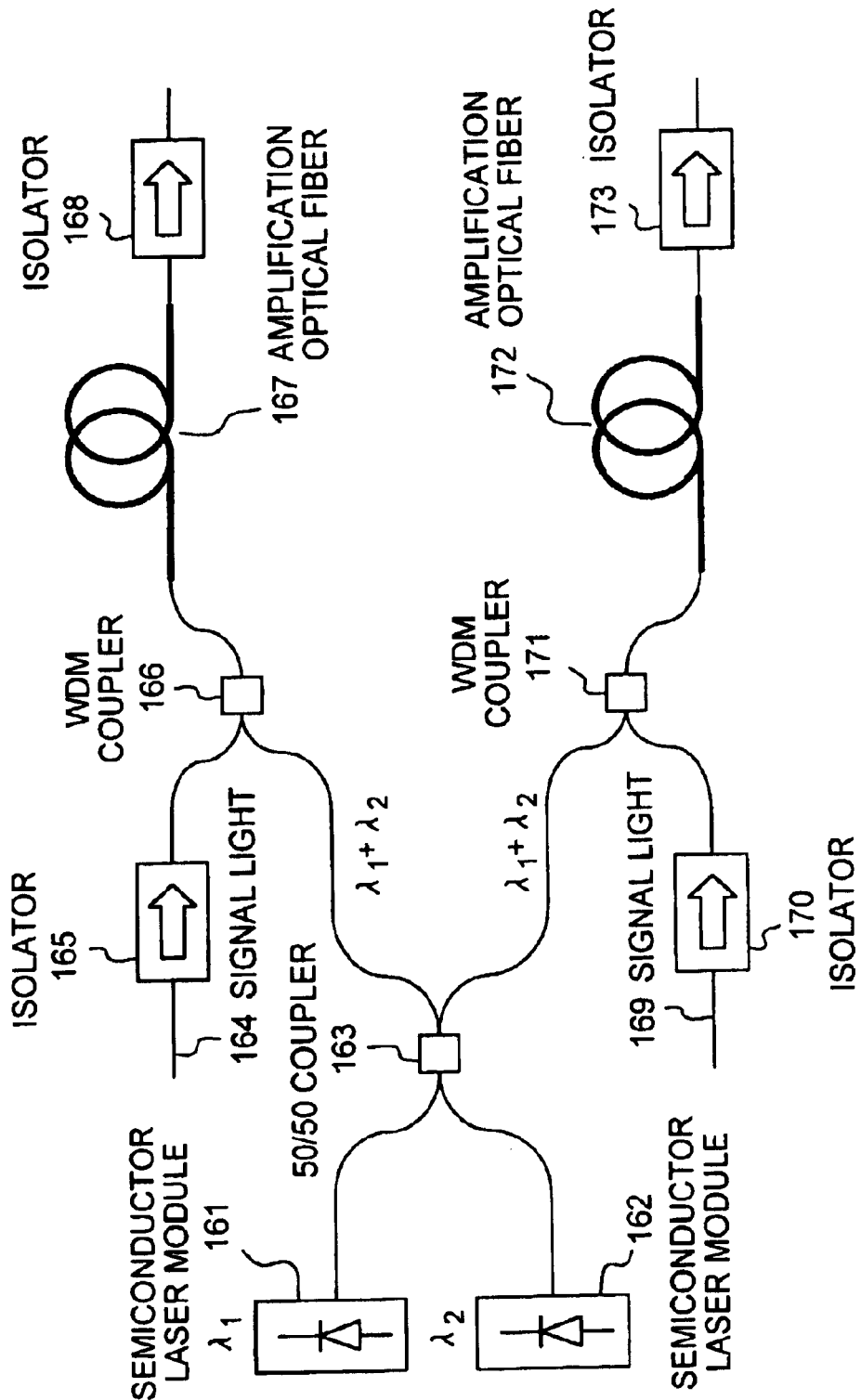
FIG. 32 is a view showing frame format of the structure of an optical fiber according to the seventh embodiment of the present invention.

The optical fiber amplifier according to the seventh embodiment will be explained with reference to FIG. 32. The optical fiber amplifier according to the seventh embodiment includes an excitation light source that includes two semiconductor laser modules 161 and 162 that have semiconductor laser devices that emit multiple longitudinal oscillation mode laser beams having specific center wavelengths, a 50/50 coupler 163 that splits the exciting light, that includes the two laser beams, into two, a WDM coupler 166 that couples one of the exciting lights with the signal light 164, and an amplification optical fiber 167. The optical fiber amplifier according to the seventh embodiment also includes a second WDM coupler 171 that couples the second exciting light with the signal light, and an amplification optical fiber 172.

The signal light 164 is emitted from a not shown signal light source and transmitted to the optical fiber. The wavelength of this signal light is 1550 nm. The laser beams emitted from the semiconductor laser modules 161 and 162 are coupled by the 50/50 coupler 163. The WDM coupler 166 combines the coupled leaser beam (exciting light) with the signal light 164 and outputs the resultant light to the amplification optical fiber 167. Similarly, the WDM coupler 171 couples the signal light 169 and the exciting light and outputs it to the amplification optical fiber 172. Further, the isolators 165 and 170 block the beam getting reflected from the WDM couplers 166 and 171 and suppress the noise, etc. The isolators 168 and, 173 block the reflected light from entering the amplification optical fibers 167, 172.

Figure 34:
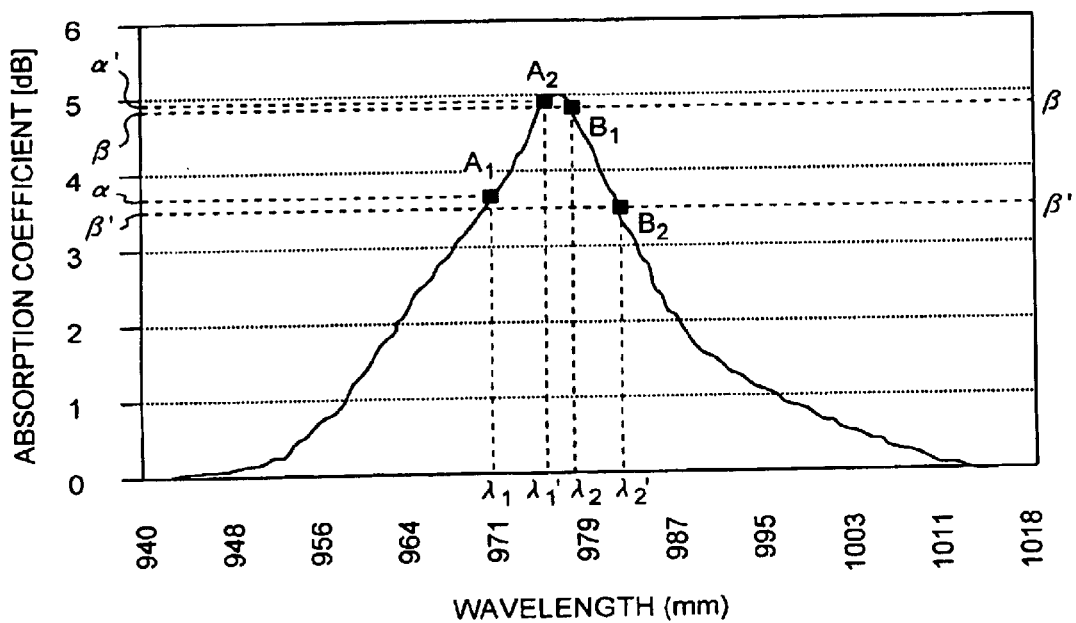
FIG. 34 is a graph that shows the relationship between the wavelength of the exciting light of an optical fiber amplifier and the absorption coefficient of an amplification optical fiber in the seventh embodiment.

In the seventh embodiment, the amplification optical fibers 167, 172 use the EDF. In the EDF, the optical fiber is doped with erbium ions ($Er^{3+}$). It absorbs beam of about 980 nm or 1480 nm wavelength and the electrons in erbium ion get excited. Amplification of the signal light 164 and 169 of 1550 nm wavelength takes place because of these excited electrons. The absorption coefficient for the beam of 980 nm wavelength in the EDF is shown in FIG. 34.

Figure 33:
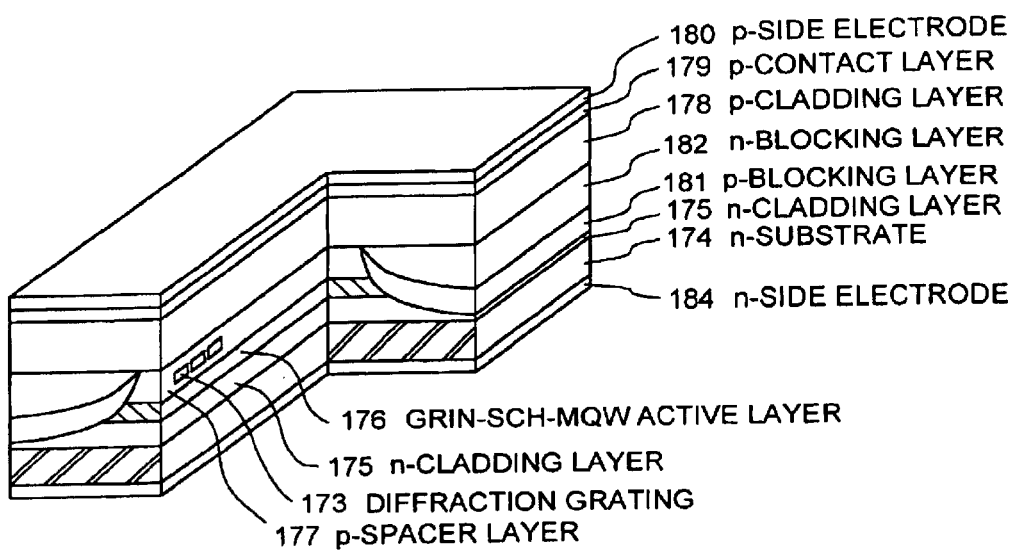
FIG. 33 is a cutaway view of the semiconductor laser device forming an optical fiber amplifier according to the seventh embodiment of the present invention.

The semiconductor laser device composed of semiconductor laser modules 161 and 162, which are the excitation light sources, will be explained. FIG. 33 is a diagram indicating the structure of the semiconductor laser device that is used as an excitation light source of optical fiber amplifier according to the seventh embodiment.

In this semiconductor laser device, an n-cladding layer 175, a GRIN-SCH-MQW active layer 176, a p-spacer layer 177, a p-cladding layer 178, a p-contact layer 179, a p-side electrode 180 are sequentially laminated on an n-substrate 174. The GRIN-SCH-MQW active layer 176 is composed of a laminated structure of lower section of GRIN-SCH layer, an active layer, and an upper section of GRIN-SCH layer. An n-side electrode 184 is arranged on the other surface of the n-substrate 174. The upper section of n-cladding layer 175, GRIN-SCH-MQW active layer 176, and p-spacer layer 177 are composed in a mesa shape. A p-blocking layer 181 and an n-blocking layer 182 that are adjacent to the mesa shape components are laminated the portion other than the mesa shape components thus confining the current flow to the mesa shape components.

Further, a diffraction grating 183 is provided in one part of the p-spacer layer 177 for selecting a multiple longitudinal oscillation mode laser beam having having a specific center wavelength. The mechanism for selecting the laser beam is the same as that of the semiconductor laser device mentioned in the first to third embodiments. The selection of center wavelength is similar to that of the semiconductor laser device mentioned in the first to third embodiments. The operation of optical fiber amplifier according to the seventh embodiment is explained with reference to FIG. 32. To make the explanation simple, only the amplification of the signal light 164 is explained. Further, the following can be similarly applied for the amplification of signal light 169.

A first laser beam of center wavelength $\lambda_1$ is emitted from the semiconductor laser module 161, and a second laser beam of center wavelength $\lambda_2$ is emitted from the semiconductor laser module 162. The 50/50 coupler 163 couples the first laser beam and the second laser beam and the exciting light having the wavelengths $\lambda_1$ (=971 nm) and $\lambda_2$ (=979 nm) is emitted from the 50/50 coupler 163.

The exciting light then enters the WDM coupler 166. The signal light 164 enters the WDM coupler 166 from the isolator 165 and is coupled with the exciting light. This coupled beam then enters the amplification optical fiber 167.

The amplification optical fiber 167 is excited by a beam having a wavelength of about 980 nm. The two laser beams that enter the amplification optical fiber 167 excite the amplification optical fiber 167. Since the signal light 164 has a wavelength of 1550 nm, which is the gain area of amplification optical fiber 167, it is amplified by the amplification optical fiber 167. This amplified signal light 164 is output through the isolator 168.

A temperature adjusting module is not provided in semiconductor laser modules 161 and 162 that are composed of optical fiber amplifier according to the seventh embodiment. Therefore, there is a rise in the temperature due to nonradiative recombination current etc. along with laser oscillation. Also, $\lambda_1$ and $\lambda_2$ are shifted to the longer wavelength side. FIG. 34 is a graph showing the change in the absorption coefficient of exciting light wavelength of the EDF that forms the amplification optical fiber 167. Here the absorption coefficient of the laser beam having a center wavelength $\lambda_1$ (=971 nm) at 0° C. is α and that of $\lambda_2$ (=979 nm) is β. In the semiconductor laser modules 161 and 162 that are composed of optical fiber amplifier as mentioned in the seventh embodiment, the temperature can rise up to 70° C. at the time of laser oscillation. If it is considered that the change in the wavelength of the laser beams that are emitted from the semiconductor laser modules 161 and 162 with respect to the change in temperature is 0.1 nm/K, the wavelengths are respectively change to $\lambda'_1$ (=978 nm) and $\lambda'_2$ (=986 nm) at 70° C. As per the change in wavelength, the absorption coefficients of the amplification optical fiber 167 shift to α' and β'.

Further, the absorption coefficient of the amplification optical fiber 167 is indicated as a total of the respective laser beams. Therefore, the absorption coefficient of amplification optical fiber 167 becomes α+β at 0° C. and α'+β' at 70° C. α+β nearly equal to α'+β' is formed as is understood from the graph in FIG. 34. Further, the inclination of graph from point $A_1$ to point $A_2$ and that from point $B_1$ to $B_2$ is about the same degree. Therefore, it is possible to maintain a uniform value of α(T)+β(T) for all the temperatures T from 0° C. to 70° C. Since the absorption coefficient of the amplification optical fiber 167 and the amplification gain of signal light 164 are correlated, the optical fiber amplifier according to the seventh embodiment can amplify the signal light 164 with a uniform gain as per the temperature change even if semiconductor laser modules 161 and 162 do not have a temperature adjusting module.

Figure 78:
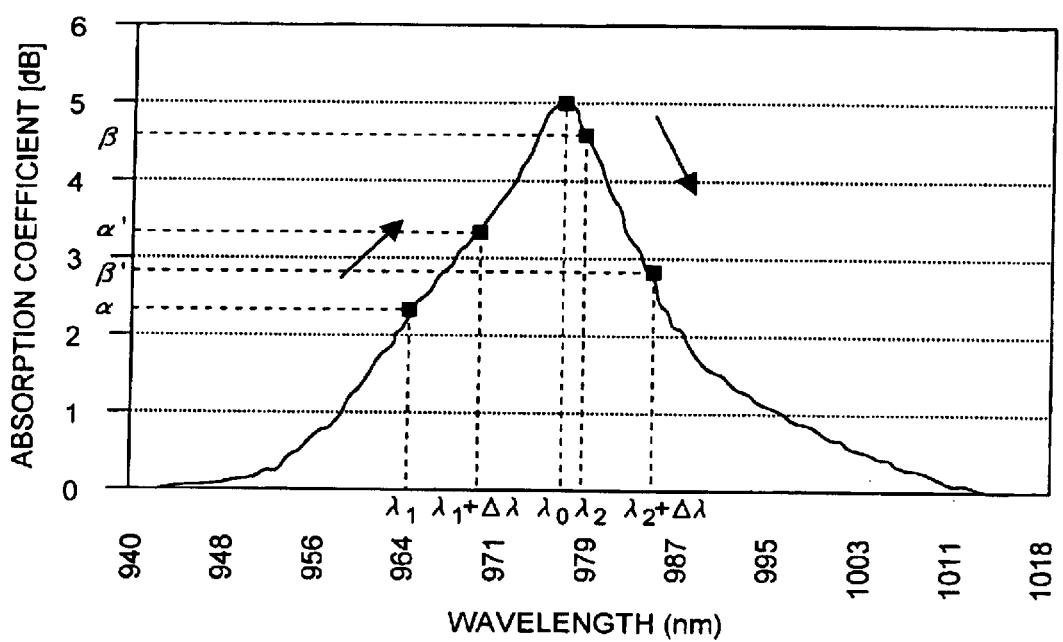
FIG. 78 is a graph that shows the relationship between the exciting light wavelength of a conventional optical fiber amplifier and the absorption coefficient of the amplification optical fiber.
Figure 79:
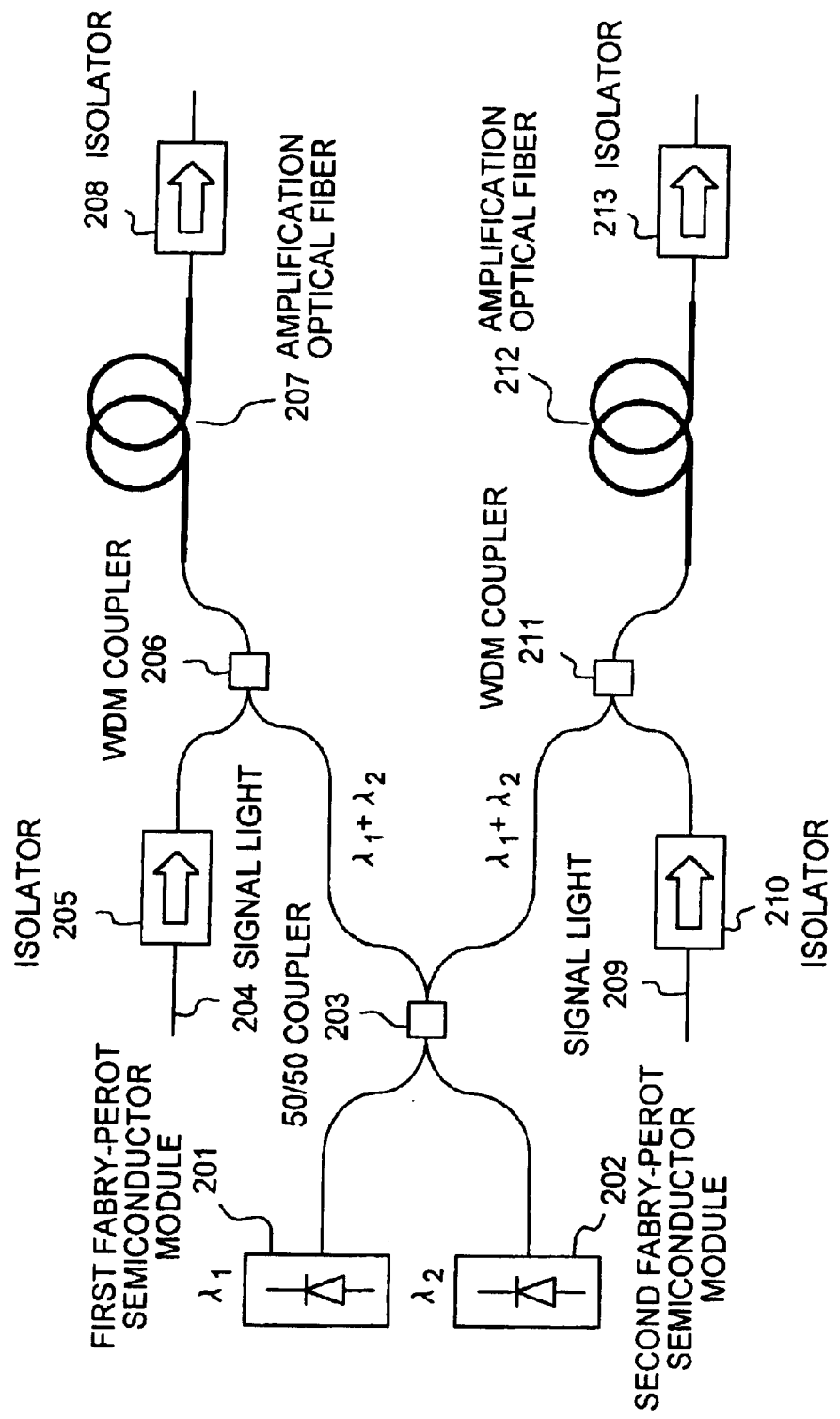
FIG. 79 is a frame format that shows the structure of an optical amplifier according to the prior art.

In the optical fiber amplifier according to the seventh embodiment, the wavelengths of the laser beams change near the peak value of the absorption coefficient graph. Therefore, the value of the absorption coefficient itself becomes very large. This can be clearly understood when compared with FIG. 78 of the conventional technology. When the semiconductor laser device of the conventional Fabry-Perot type is used, the wavelength shift as per the change in temperature is 0.4 nm/K. Therefore, when an optical fiber amplifier is used within the range of 0° C. to 70° C., a laser beam of wavelength $\lambda_1$ of about 950 nm is required at 0° C. in order to suppress wavelength oscillation below the peak wavelength in all the temperatures that satisfy the condition of 0°<T°<70°. The value of absorption coefficient at 950 nm is low. When compared with the optical fiber amplifier of seventh embodiment, the gain in dB units is 4 points (i.e., 40%). Therefore, it can be said that the optical fiber amplifier according to seventh embodiment, can amplify signal light 164 with a gain that is higher as compared to the conventional technology.

Figure 35:
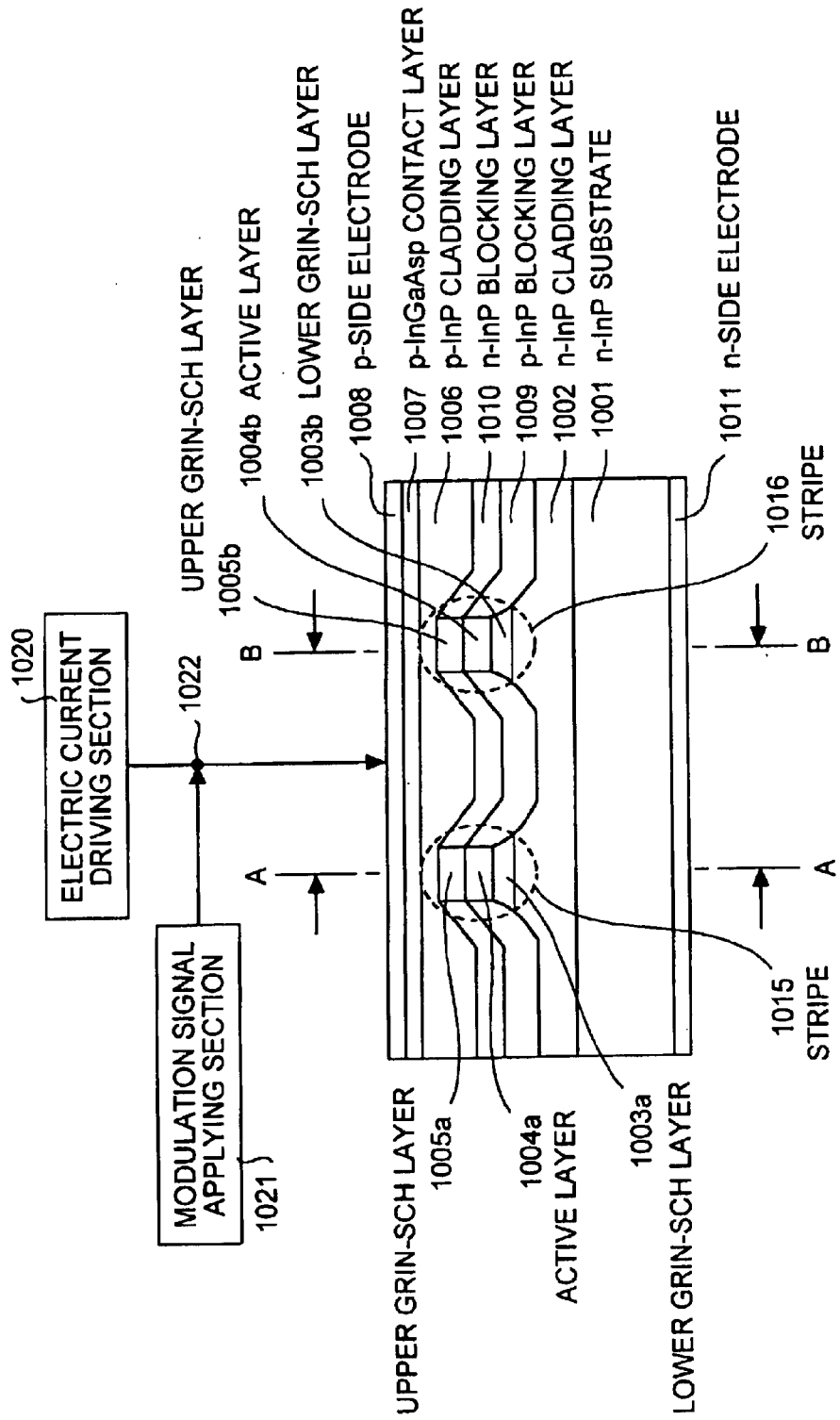
FIG. 35 is a longitudinal sectional view that shows a structure of a semiconductor laser device according to the eighth embodiment of the present invention.
Figure 36:
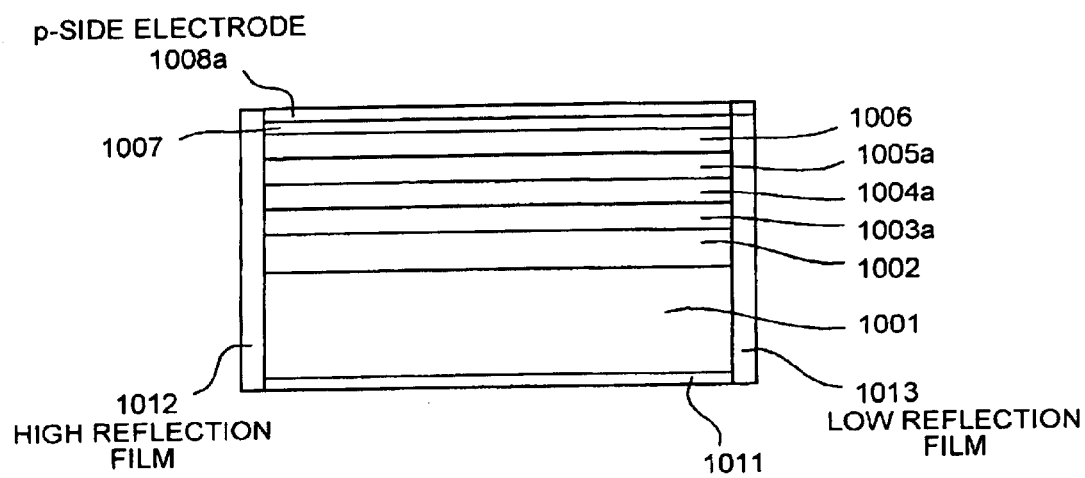
FIG. 36 is a sectional view of the semiconductor laser device shown in FIG. 35 taken along the line A—A.

The eighth embodiment of the present invention will be explained. FIG. 35 is a longitudinal sectional view in a longitudinal direction of a semiconductor laser device according to the eighth embodiment of the present invention. FIG. 36 is a sectional view of the semiconductor laser device shown in FIG. 35 taken along the line A—A. A sectional view along the line B—B shall be the same as the sectional view taken along the line A—A and so it is not shown.

The semiconductor laser device according to the eighth embodiment is constituted so that, as shown in FIG. 35, an n-InP cladding layer 1002 is laminated on an n-InP substrate 1001. Moreover, on the line A—A shown in FIG. 35, a lower GRIN-SCH layer 1003a, an active layer 1004a, and an upper GRIN-SCH layer 1005a are laminated in a mesa shape. These layers form a stripe 1015. Similarly, on the line B—B, a lower GRIN-SCH layer 1003b, an active layer 1004b and an upper GRIN-SCH layer 1005b are laminated in a mesa shape. These layers form another stripe 1016. The stripe 1015 is separated from the stripe 1016 by a space. The section other than the stripes 1015 and 1016 has a structure such that a p-InP blocking layer 1009 and an n-InP blocking layer 1010 are sequentially laminated on the n-InP cladding layer 1002. The flow of the injected electric current is confined only to the stripes 1015 and 1016. Moreover, a p-InP cladding layer 1006 is laminated on the upper GRIN-SCH layers 1005a and 1005b and the n-InP blocking layer 1010. A p-InGaAsP contact layer 1007 and a p-side electrode 1008 are laminated sequentially on the p-InP cladding layer 1006. Moreover, an n-side electrode 1011 is laminated on the other surface of the n-InP substrate 1001.

The n-InP cladding layer 1002 functions as a buffer layer as well. The stripes 1015 and 1016 are sandwiched between the n-InP cladding layer 1002 and the p-InP cladding layer 1006 so that the semiconductor laser device of the eighth embodiment has a double hetero structure, and because the carrier is confined effectively, high radiation efficiency of output light is achieved.

It is advantageous in view of high output that the active layers 1004a and 1004b adopt, for example, a compressive strain quantum well structure when a lattice mismatching of each well in MQW with respect to the n-InP substrate 1001 is in a range of 0.5% to 1.5%, and use a multiple quantum well structure in which a number of wells is about 5. Moreover, in the strain quantum well structure, when its barrier layer adopts a strain compensating structure composed by introducing tensile strain opposite to the strain of the well layer, a grating matching condition can be satisfied equivalently. For this reason, it is not necessary to provide an upper limit of a degree of the lattice mismatching of the well layer.

The stripe 1015 is composed of a laminated structure of the lower section of the GRIN-SCH layer 1003a, the active layer 1004a and the upper section of the GRIN-SCH layer 1005a, and this forms a so-called GRIN-SCH-MQW (Graded Index-Separate Confinement Hetero structure Multi Quantum Well) active layer. This enables the carrier to be confined more effectively, and the semiconductor laser device of the first embodiment has high radiation efficiency of output light as well as the double hetero structure. This can be applied to the stripe 1016 as well.

In the structures of the section taken along the line A—A and the section taken along the line B—B, as shown in FIG. 36, a low reflection film 1013 is arranged on an entire surface of a radiation end surface (right end surface in FIG. 36), and a high reflection film 1012 is arranged on an entire surface of a reflection end surface (left end surface in FIG. 36). Moreover, the p-side electrode 1008 is arranged on an entire surface of the p-InGaAsP contact layer 1007.

The high reflection film 1012 has a reflectivity of more than 80%, or, ideally, more than 98%. Meanwhile, the low reflection film 1013 serves to prevent reflection of a laser beam on the radiation end surface. Therefore, the low reflection film 1013 has a reflectivity of less than 5%, or, ideally, 1%. However, the low reflection film 1013 is optimized according to a resonator length.

In the semiconductor laser device according to the eighth embodiment, an electric current is injected from the p-side electrode 1008 so that radiative recombination of the carrier occurs on the stripes 1015 and 1016. A light generated by this is amplified by a resonator formed by the high reflection film 1012 and the low reflection film 1013, and stimulated emission occurs so that the laser beam is radiated from the low reflection film 1013.

The semiconductor laser device according to the eighth embodiment has an electric current driving section 1020 which applies a bias current to the p-side electrode 1008, and a modulation or dithering signal applying section 1021 which applies a modulation frequency signal which modulates the bias current. The modulation frequency signal output from the modulation signal applying section 1021 is superposed on the bias current at a connection point 1022, and a superposed signal on which the modulation frequency signal is superposed is applied to the p-side electrode 1008.

This modulation frequency signal is a sine-wave signal of 10 to 100 kHz and has an amplitude value of about 0.1 to 10% of the bias current and prefers an amplitude value of 1 to 3% degree. The modulation frequency signal is not limited to the sine-wave signal and may be a periodic signal such as a triangular signal. Then, since the periodic signal such as a triangular signal includes a plurality of sine-wave components, the sine-wave signal is preferable as the modulation frequency signal.

Figure 37:
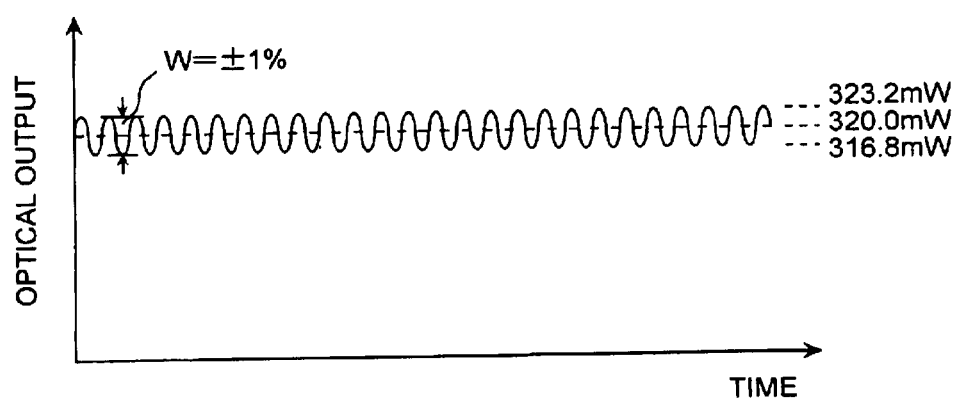
FIG. 37 is a graph that shows a change in the optical output with time when a modulation frequency signal is superposed.
Figure 38:
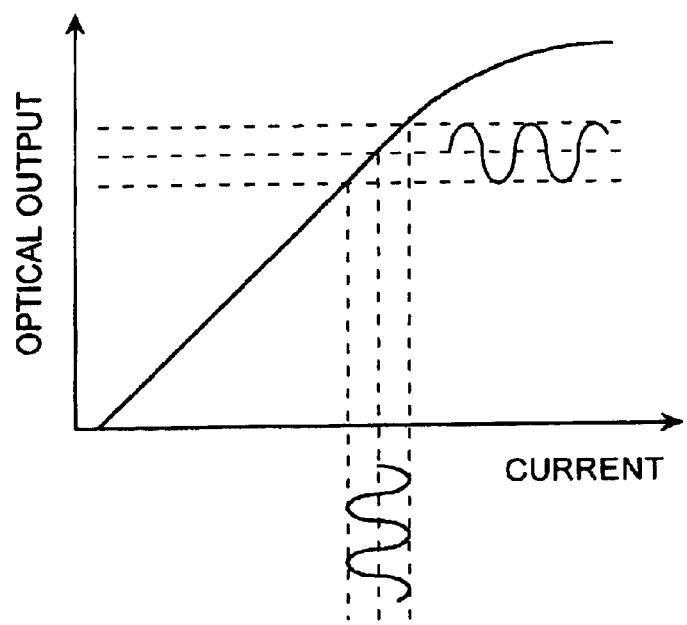
FIG. 38 is a graph that shows a modulation principle when a modulation frequency signal is applied to an electric current-optical output characteristic of a semiconductor laser device.

FIG. 37 is a diagram, which shows a change of time of an optical output at the time of driving by the superposed signal in which the modulation frequency signal is superposed on the bias current. In FIG. 37, the modulation frequency signal is a sine-wave signal having an amplitude value of 1% of the value of the bias current, and an amplitude of the optical output at the time of the driving only by the bias current is changed by 1% in a sine-wave manner. As shown in FIG. 38, this operation corresponds to when an electric current-optical output (I-L) characteristic of the semiconductor laser device is modulated.

Figure 39:
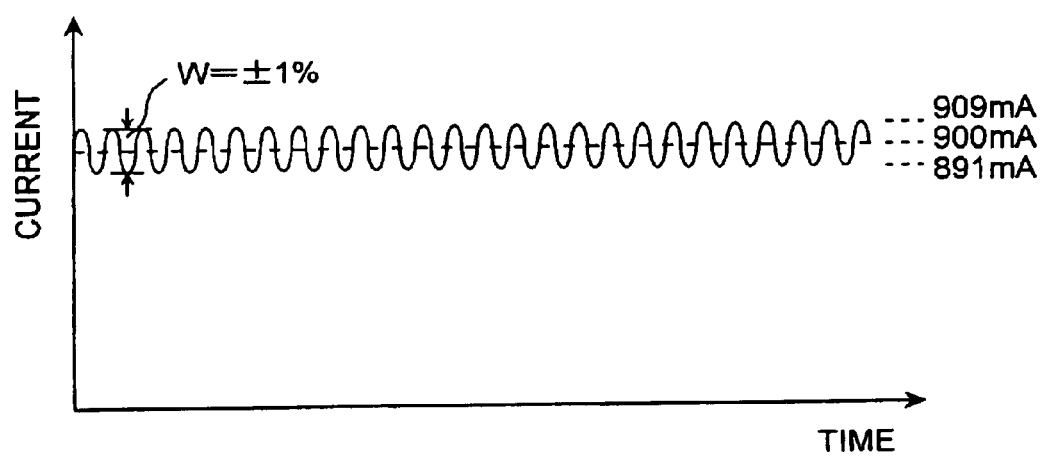
FIG. 39 is a graph that shows a change in the driving current with time when a modulation frequency signal is superposed.

In the modulation area shown in FIG. 38, the I-L characteristic is linear and the degree of modulation for optical output becomes the same as that of the driving electric current that is modulated as per the modulation wavelength signal. Therefore, in this modulation area, the modulation degree is always maintained at 1% only by applying the driving electric current that maintains the amplitude of modulation wavelength signal at 1%, as is shown in FIG. 39. Controlling the modulation degree of optical output thus becomes easy. On one hand, the modulation degree of the driving electric current modulated as per the modulation frequency signal and that of optical output was not the same in the area where the optical output was amplified. In that case, the amplitude value of modulation frequency signal is adjusted and controlled such that the modulation degree of the optical output becomes 1%, as shown in FIG. 37.

When the value of the driving current to be applied to the semiconductor laser device changes in this way, a refractive index n of the radiation area of the laser beam, such as the active layers 1004a and 1004b changes. When the refractive index n changes, an optical resonator length Lop also changes. Namely, the optical resonator length Lop is expressed in the following equation:

$$Lop = n \cdot L$$

where L is the physical length of the resonator. The optical resonator length Lop changes according to a change of the refractive index n. When the optical resonator length Lop changes, a resonator wavelength also changes in the Fabry-Perot type. Namely, the resonator wavelength also changes in a sine-wave manner.

Figure 40:
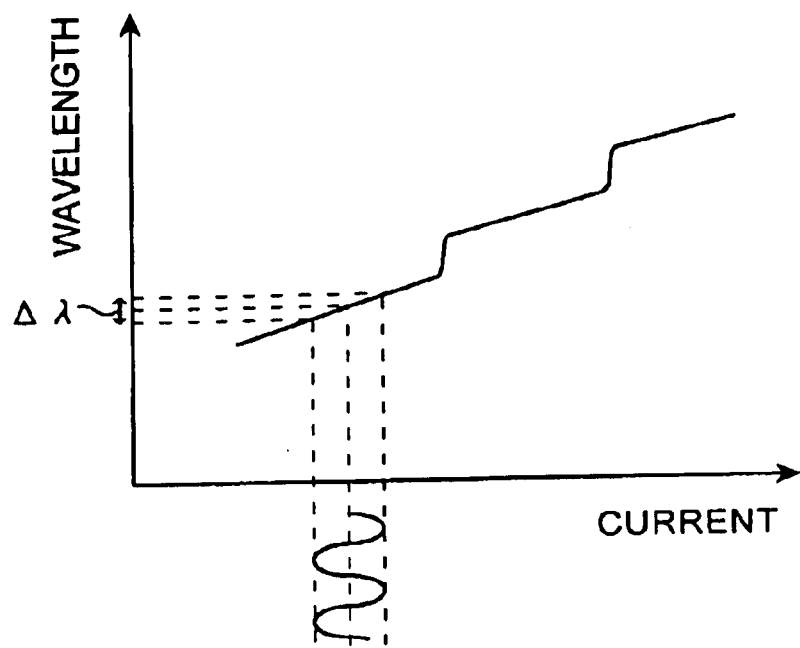
FIG. 40 is a graph that shows a change of the wavelength with a change in the electric current.
Figure 41:
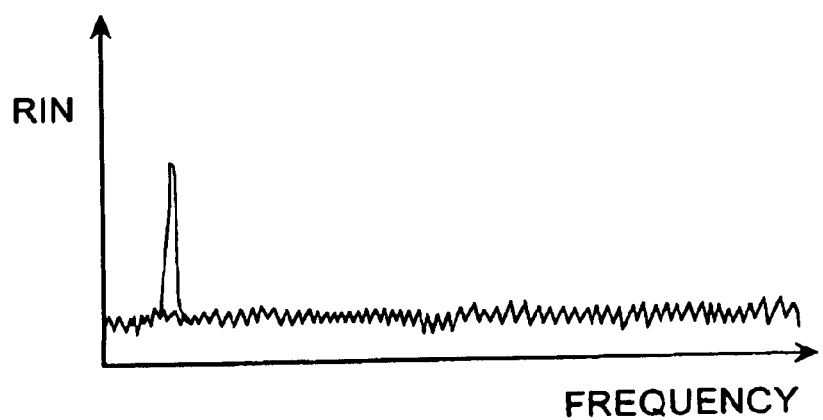
FIG. 41 is a graph that shows a frequency characteristic of RIN when the modulation frequency signal is superposed.

FIG. 40 shows a change of the wavelength with respect to a change of the electric current in the semiconductor laser device. As shown in FIG. 40, the refractive index n changes with the change of the electric current as mentioned above, and a wavelength of the longitudinal oscillation mode slightly changes with the change of the refractive index. When the change of the electric current is large, the longitudinal oscillation mode hops to an adjacent longitudinal oscillation mode so that the wavelength of the longitudinal oscillation mode changes abruptly. Therefore, the modulation frequency signal should be such that the electric current is changed slightly in the range of a slight change of the wavelength. This modulation frequency signal becomes a noise component. FIG. 41 is a diagram, which shows a relationship between the frequency and a relative intensity noise (RIN). A modulation frequency signal component of low frequency has a large RIN value, but this frequency area has been known and is not used as a signal amplifying area.

Figure 42A:
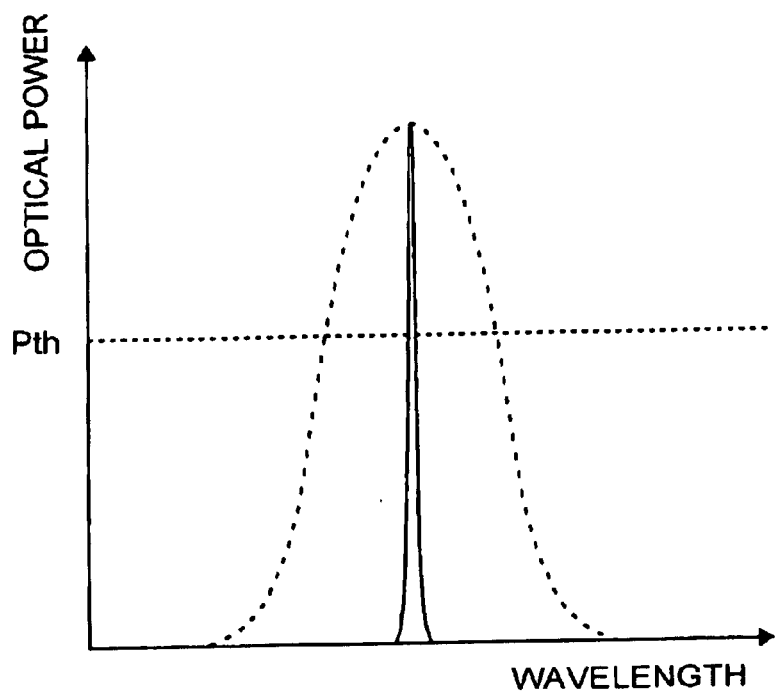
FIG. 42A and FIG. 42B are graphs that show that a threshold value of stimulated Brillouin scattering is relatively heightened.
Figure 42B:
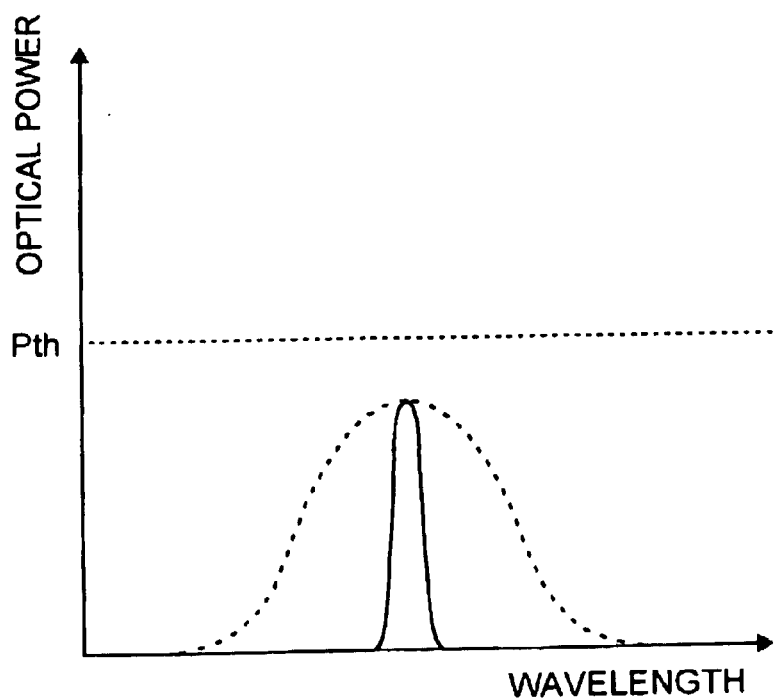

The change of the wavelength with the change of the electric current results in an increase in the spectrum width of the longitudinal oscillation mode. FIG. 42A and FIG. 42B are diagrams that show spectrum waveforms of the longitudinal oscillation mode when the modulation frequency signal is not superposed and when the modulation frequency signal is superposed. FIG. 42A shows a spectrum waveform of the longitudinal oscillation mode when the modulation frequency signal is not superposed, and FIG. 42B shows a spectrum waveform of the longitudinal oscillation mode when the modulation frequency signal is superposed. The spectrum width of the longitudinal oscillation mode shown in FIG. 42A increases further with the change of the wavelength, and when the same optical output is obtained (FIG. 42A and FIG. 42B) the peak value decreases. As a result, when the modulation frequency signal is superposed, the threshold value Pth of stimulated Brillouin scattering can be relatively increased.

Figure 43:
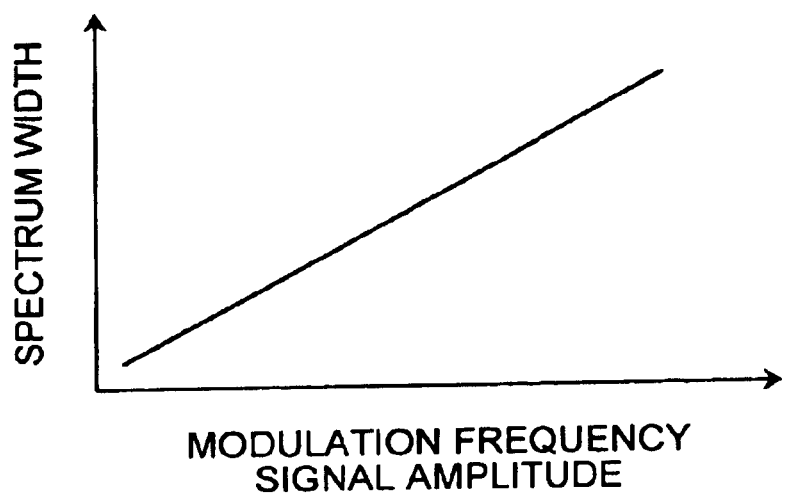
FIG. 43 is a graph that shows a change of a spectrum width with a change of amplitude of the modulation frequency signal.
Figure 44:
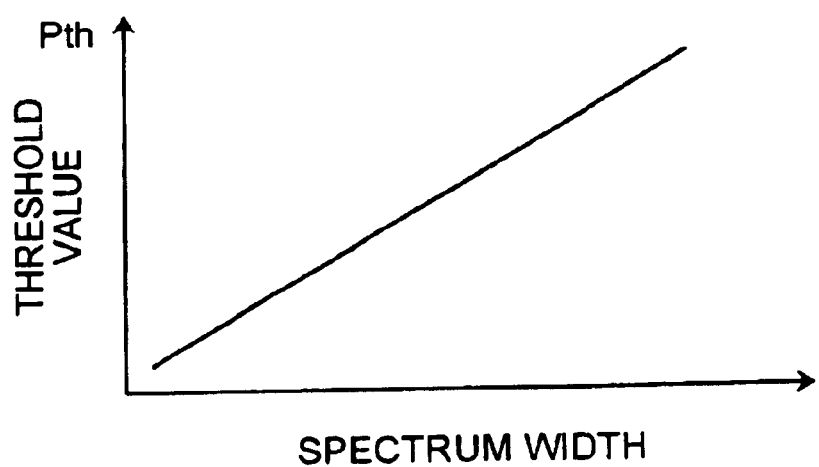
FIG. 44 is a graph that shows a change of the threshold value of the stimulated Brillouin scattering with the change of the spectrum width.

In general, as shown in FIG. 43, when the amplitude value of the modulation frequency signal is increased, the spectrum width of the longitudinal oscillation mode increases, and as shown in FIG. 44, when the spectrum width increases, the threshold value Pth of the stimulated Brillouin scattering increases with respect to the optical output. Therefore, the semiconductor laser device, which is capable of reducing the stimulated Brillouin scattering and which provides a stable and high optical output, can be realized.

The refractive index in semiconductor single crystal changes according to an electric current flowing in the single crystal. In general, when the flowing electric current is larger, the refractive index of the semiconductor single crystal becomes larger accordingly. Therefore, in the semiconductor laser device according to the first embodiment, the refractive index of the semiconductor single crystal composing the stripes 1015 and 1016 fluctuates due to the existence of the injection current at the time of the laser oscillation.

The eighth embodiment adopts the W-stripe structure. In a semiconductor laser device having a conventional W-stripe structure, physical lengths of the resonators in the respective stripes are equal with each other, and it is structured such that the injection current is injected uniformly into each stripe. For this reason, the wavelengths of the laser beams radiated from the respective stripes are completely equal with each other. Meanwhile, in the semiconductor laser device according to the eighth embodiment, as for the wavelengths of the laser beams radiated from the respective stripes 1015 and 1016, since the spectrum width is widened, a wavelength matching percentage is reduced, and an oscillation characteristic which is closer to the state in which independent semiconductor light emission elements are multiplexed can be obtained in comparison with the semiconductor laser device having the conventional W-stripe structure. Therefore, in the semiconductor laser device of the first embodiment, DOP is expected to be reduced unlike the semiconductor laser device having the conventional W-stripe structure.

Actually as a result of using the semiconductor laser device of the eighth embodiment as the excitation light source in the Raman amplifier, the inventors of the present invention have confirmed that a substantially constant amplified gain is obtained regardless of a polarization direction of a signal light. Therefore, the semiconductor laser device of the eighth embodiment is suitable for the excitation light source in the Raman amplifier.

Moreover, in the semiconductor laser device according to the eighth embodiment, the stripes 1015 and 1016 have the same structure. Therefore, the semiconductor laser device according to the first embodiment has an advantage of easy production. Moreover, it also has an advantage that it can be produced easily using a conventional producing apparatus.

Figure 45:
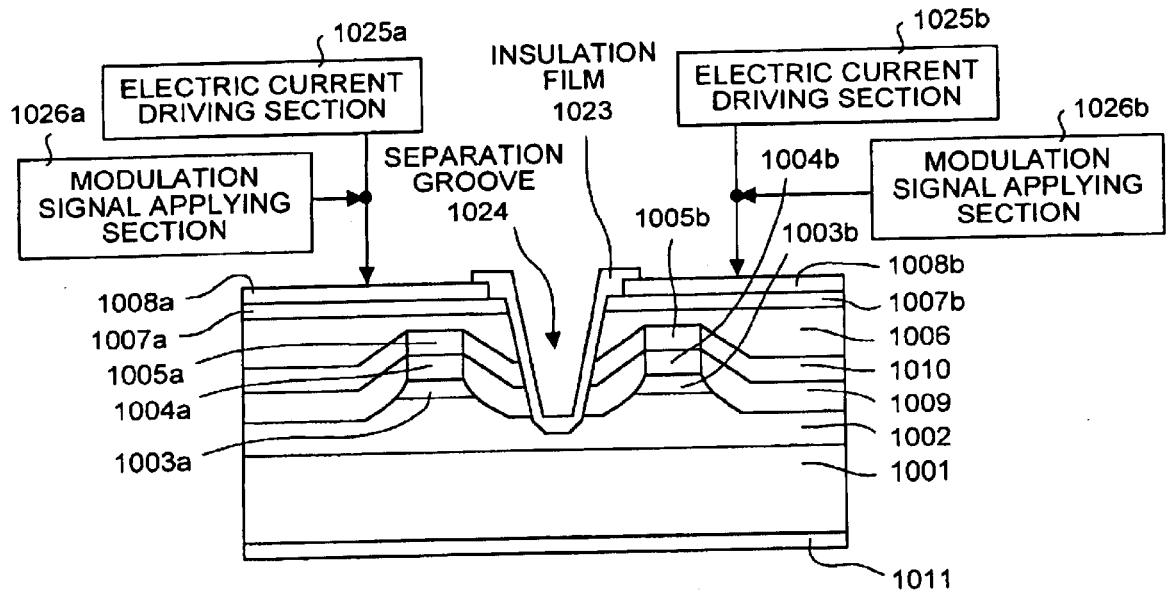
FIG. 45 is a longitudinal sectional view that shows a structure of a semiconductor laser device according to the ninth embodiment of the present invention.

The ninth embodiment of the present invention will be explained. FIG. 45 is a front sectional view in a longitudinal direction of the semiconductor laser device according to the ninth embodiment of the present invention. In this semiconductor laser device, a separation groove 1024, which goes down to a depth from the p-side electrode 8 to the n-InP cladding layer 1002, is formed between the stripes 1015 and 1016. The surface of the separation groove 1024 is covered by an insulating film 1023 so that the stripe 1015 is electrically separated from the stripe 1016.

Further, electric current driving sections 1025a and 1025b and modulation signal applying sections 1026a and 1026b, which are independent from the separated p-side electrodes 1008a and 1008b, are provided. The modulation signal applying sections 1026a and 1026b respectively output modulation frequency signals having different frequencies. The electric current driving sections 1025a and 1025b may be formed as one electric current driving section. As a result, phases of superposed signals to be applied to the stripes 1015 and 1016 are different from each other, and thus when such a semiconductor laser device is used as the excitation light source of the Raman amplifier, DOP of a polarization-multiplexed laser beam can be reduced more easily.

The modulation signal applying sections 1026a and 1026b may be made to output modulation frequency signals having opposite phases. When it is made so, the modulation signal applying section 1026b may serve as a phase shifter which uses a modulation frequency signal to be output by the modulation signal applying section 1026a, and which outputs a modulation frequency signal having an opposite phase to the former modulation frequency signal. As per the output of modulation frequency signal having opposite phases, the polarization of laser beam emitted from the stripes 1015 and 1016 becomes uniform and the laser beam of low noise is expected to be output finally.

In addition, the frequencies of the modulation frequency signals to be output by the modulation signal applying sections 1026a and 1026b can be made so as not be different but equal with each other, and so they may output modulation frequency signals having different phases.

The above-described embodiments eight and nine explained the Fabry-Perot semiconductor laser device, and the above structure can be applied to a semiconductor laser device having a wavelength selecting unit of DFB (Distributed Feedback) or DBR (Distributed Bragg Reflector). When such a semiconductor laser device is used as the excitation light source of the Raman amplifier, even when a fiber grating for wavelength selection is not used, an optical output in which the oscillation wavelength is stabilized can be obtained.

The semiconductor laser device according to a tenth embodiment of the present invention will be explained next. In the semiconductor laser device according to the tenth embodiment, the same reference numerals are assigned to the same components as those in the eighth embodiment.

Figure 46:
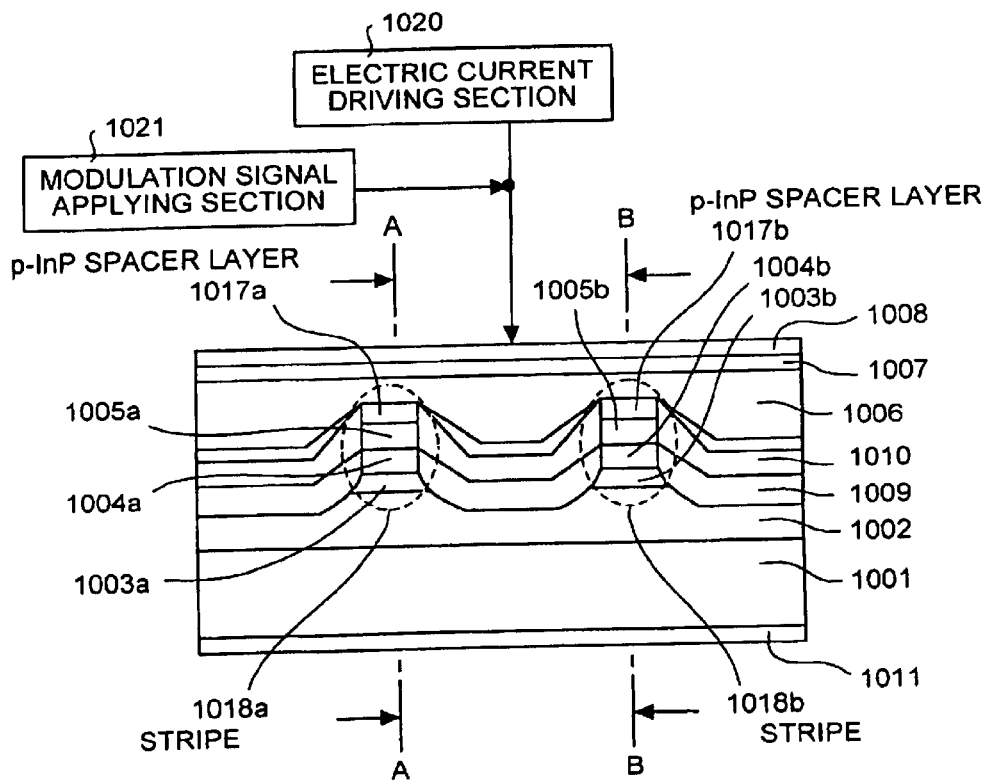
FIG. 46 is a longitudinal sectional view that shows a structure of a semiconductor laser device according to the tenth embodiment of the present invention.

FIG. 46 is a sectional view, which shows a structure in the longitudinal direction of the semiconductor device according to the tenth embodiment of the present invention. In FIG. 46, the semiconductor laser device has a structure that a p-InP spacer layer 1017a is laminated on the upper section of the GRIN-SCH layer 1005a in the stripe 1018a and a p-InP spacer layer 1017b is laminated on the upper section of the GRIN-SCH layer 1005b in the stripe 1018b.

Figure 47:
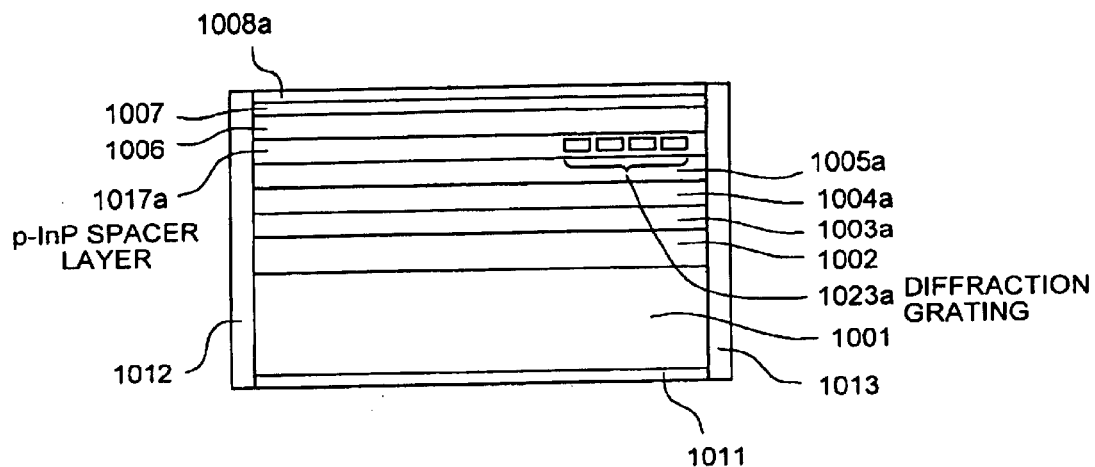
FIG. 47 is a sectional view of the semiconductor laser device shown in FIG. 46 taken along the line A—A.

FIG. 47 is a longitudinal sectional view of the semiconductor laser device shown in FIG. 46 taken along the line A—A. A section taken along the line B—B shown in FIG. 46 is the same as the section taken along the line A—A shown in FIG. 47. In FIG. 47, the semiconductor laser device has a structure that a diffraction grating 1023a is arranged on one area in the p-InP spacer layer 1017a. A diffraction grating 1023b corresponding to the diffraction grating 1023a is provided on the stripe 1018b side.

These diffraction gratings 1023a and 1023b are composed of p-InGaAsP and have a film thickness of 20 nm and a length of 50 μm in the laser emission direction (lateral direction in FIG. 47). Moreover, a period of the each of the diffraction gratings is 220 nm which is considered a constant pitch. For this reason, a laser beam having a plurality of longitudinal oscillation modes with a center wavelength of 1480 nm can be selected.

The characteristic owing to the provision of the diffraction gratings 1023a and 1023b will be explained with reference to FIG. 48, FIG. 49A, and FIG. 49B. Here, the explanation will be given on the assumption that an injection current is injected only into the stripe 1018a.

The semiconductor laser device in the tenth embodiment is based on a precondition that the device is used as an excitation light source of the Raman amplifier, and its oscillation wavelength $\lambda_0$ is 1100 nm to 1550 nm, and the resonator length L is between 800 μm and 3200 μm, both limits included. In general, a mode spacing $\Delta\lambda$ of a longitudinal mode generated by the resonator of the semiconductor laser device can be expressed in the following equation:

$$\Delta\lambda = \lambda_0^2/(2 \cdot n \cdot L)$$

where n is the effective refractive index. When the oscillation wavelength $\lambda_0$ is 1480 nm and the effective refractive index is 3.5, the mode spacing $\Delta\lambda$ is about 0.39 nm when the resonator length L is 800 μm, and it is about 0.1 nm when the resonator length L is 3200 μm. That is, as the resonator length L becomes longer, the mode distance $\Delta\lambda$ of the longitudinal mode becomes narrower, and the selection condition to oscillate the laser beam of a single longitudinal mode becomes strict.

On the other hand, in the tenth embodiment, the diffraction grating 1023a selects a longitudinal mode by a Bragg wavelength thereof. The selection wavelength characteristic of the diffraction grating 1023a is expressed as an oscillation wavelength spectrum 1030 shown in FIG. 48.

Figure 48:
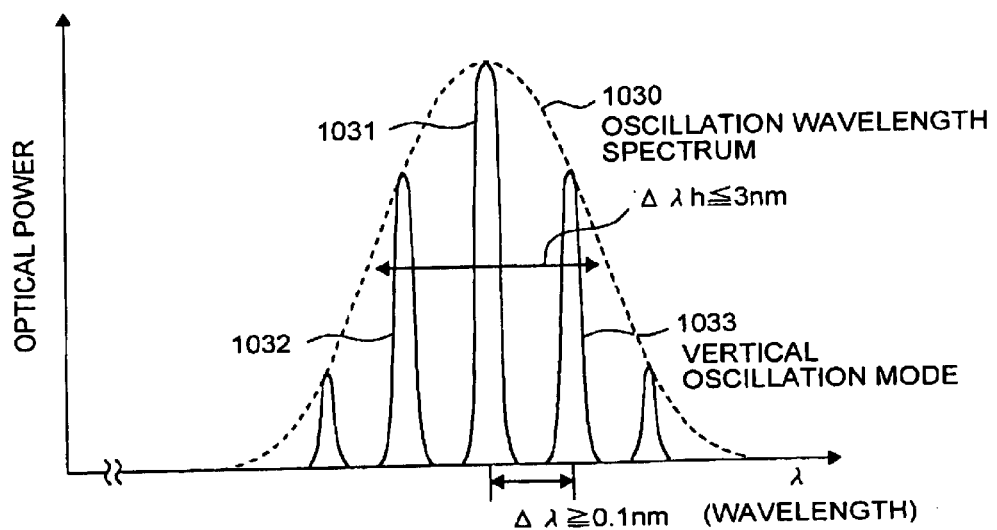
FIG. 48 is a graph that shows an oscillation wavelength spectrum having a plurality of longitudinal oscillation modes.
Figure 49A:
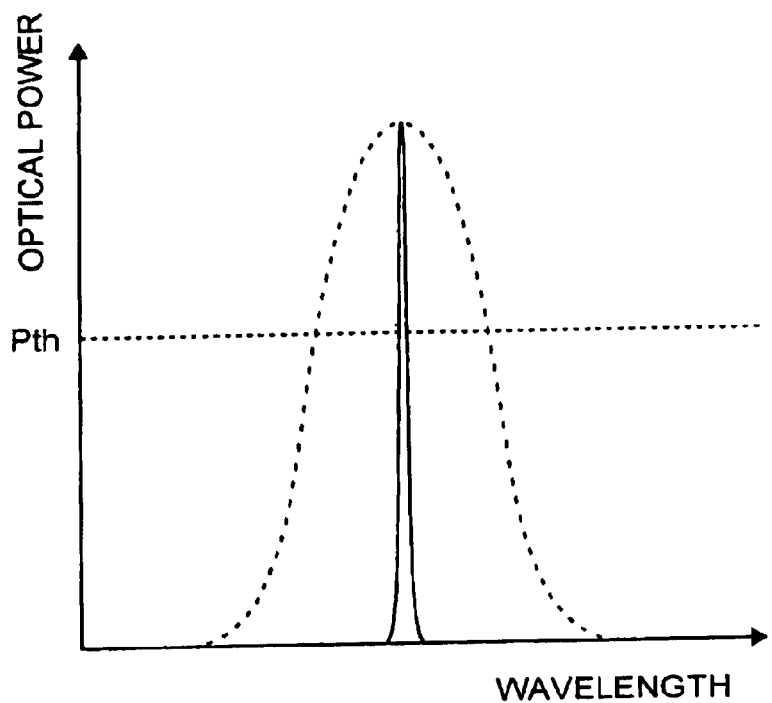
FIGS. 49A and 49B are graphs that show the relationship between multiple longitudinal oscillation modes and a single longitudinal oscillation mode and the relationship between the longitudinal oscillation modes and the stimulated Brillouin scattering in the tenth embodiment.
Figure 49B:
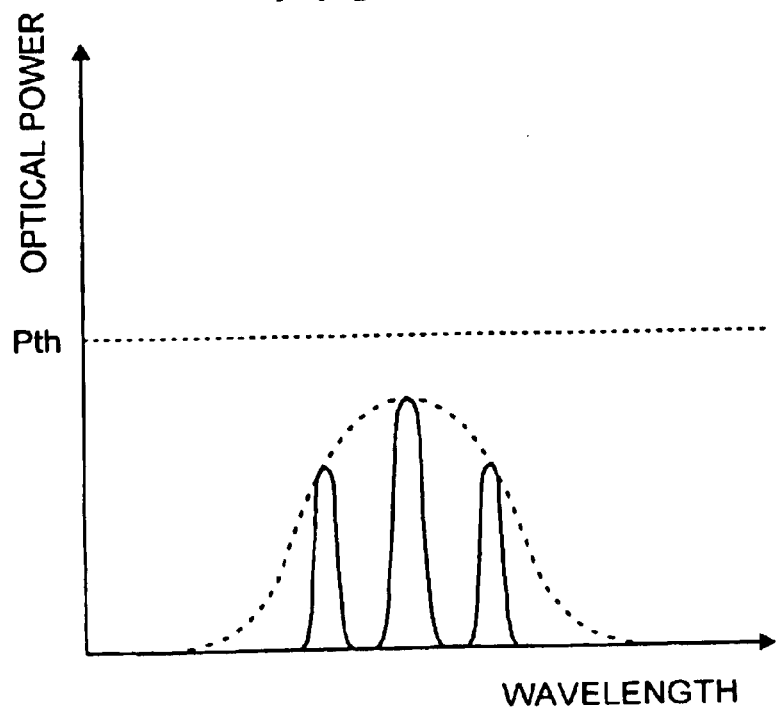

As shown in FIG. 48, in the tenth embodiment, a plurality of longitudinal oscillation modes are made to exist in a wavelength selection characteristic expressed by a half-width $\Delta\lambda$h of the oscillation wavelength spectrum 1030 by the semiconductor laser device having the diffraction grating. In the conventional DBR semiconductor laser device or the DFB semiconductor laser device, when the resonator length L is set to 800 μm or more, a single longitudinal mode oscillation is difficult to obtain so that a semiconductor laser device having such a resonator length L is not used. In the semiconductor laser device of the ninth embodiment, however, by positively setting the resonator length L to 800 μm or more, a laser beam is output while including a plurality of longitudinal oscillation modes in the half-width $\Delta\lambda$h of the oscillation wavelength spectrum. In FIG. 48, three longitudinal oscillation modes 1031 to 1033 are included in the half-width $\Delta\lambda$h of the oscillation wavelength spectrum.

When a laser beam having a plurality of longitudinal oscillation modes is used, it is possible to suppress a peak value of the laser output and to obtain a high laser output value as compared with when a laser beam of single longitudinal mode is used. For example, the semiconductor laser device shown in the tenth embodiment has a profile shown in FIG. 49B, and can obtain a high laser output with a low peak value. Whereas, FIG. 49A shows a profile of a semiconductor laser device having a single longitudinal mode oscillation when the same laser output is obtained, and has a high peak value. Further, as described in the eighth and ninth embodiments, since a modulation frequency signal is superposed on the bias current, the spectrum width of the respective longitudinal oscillation modes becomes wide, and thus a higher laser output can be obtained with a lower peak value.

As explained in the eighth embodiment, when the semiconductor laser device is used as an excitation light source for the Raman amplifier, it is preferable to increase an excitation optical output power in order to increase a Raman gain, but when the peak value is high, there is a problem in that stimulated Brillouin scattering occurs and noise increases. Occurrence of the stimulated Brillouin scattering has a threshold value Pth at which the stimulated Brillouin scattering occurs. When obtaining the same laser output power, as shown in FIG. 49B, its peak value is suppressed by providing a plurality of longitudinal oscillation modes and widening the spectrum width so that a high exciting optical output power can be obtained within the threshold value Pth of the stimulated Brillouin scattering. As a result, a stable and high Raman gain can be obtained.

The mode distance $\Delta\lambda$ between the longitudinal oscillation modes 1031 to 1033 is 0.1 nm or higher. This is because when the semiconductor laser device is used as an excitation light source for the Raman amplifier, when the mode distance $\Delta\lambda$ is 0.1 nm or less, the probability that the stimulated Brillouin scattering occurs becomes high. As a result, it is preferable that the resonator length L is 3200 μm or less.

From the above viewpoint, it is preferable that the number of longitudinal oscillation modes included in the half-width $\Delta\lambda$h of the oscillation wavelength spectrum 1030 is plural. In the Raman amplification, since the amplified gain has a polarization dependency, it is necessary to reduce the influence by a deviation between the polarization direction of the signal light and the polarization direction of the exciting light. There exists a method of depolarizing the exciting light. More specifically, there is a method in which the output lights from two semiconductor laser devices are multiplexed, and a method in which a polarization-maintaining fiber having a predetermined length is used as a depolarizer, to propagate the laser beam emitted from one semiconductor laser device. When the latter method is used, as the number of longitudinal oscillation modes increases, coherence of the laser beam becomes lower. Therefore, it is possible to shorten the length of the polarization-maintaining fiber required for depolarization. Especially, when the number of longitudinal oscillation mode is four or five, the required length of the polarization-maintaining fiber becomes remarkably short. Therefore, when a laser beam emitted from the semiconductor laser device is to be depolarized for use for the Raman amplifier, an emitted laser beam from one semiconductor laser device can be depolarized and utilized easily, without polarization multiplexing the emitted lights from two semiconductor laser devices for use. As a result, the number of parts used for the Raman amplifier can be reduced, and the Raman amplifier can be made compact.

When the oscillation wavelength spectrum width is excessively wide, the coupling loss by the wavelength multiplexing coupler becomes large, and noise and gain fluctuations occur due to the change of the wavelength in the oscillation wavelength spectrum width. Therefore, it is necessary to make the half-width $\Delta\lambda h$ of the oscillation wavelength spectrum 1030 to 3 nm or less, and ideally, 2 nm or less.

Further, since the conventional semiconductor laser device is used as a semiconductor laser module using a fiber grating, a relative intensity noise (RIN) increases due to the resonance between the fiber grating and the light reflection surface, and Raman amplification cannot be carried out stably. However, according to the semiconductor laser device shown in the tenth embodiment, since a laser beam emitted from the low reflection film 1013 is directly used as an excitation light source for the Raman amplifier, without using the fiber grating, the relative intensity noise is reduced and as a result, fluctuations in the Raman gain decrease, and the Raman amplification can be carried out stably.

Figure 50:
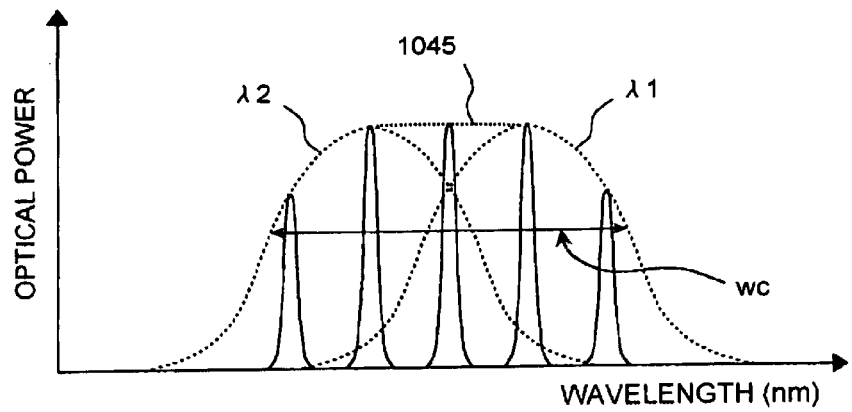
FIG. 50 is a graph that shows a compound oscillation frequency wavelength spectrum.

FIG. 50 is a diagram that shows the oscillation wavelength spectrum when the selection wavelength range of the diffraction grating 1023a is widened. In FIG. 50, a composite oscillation wavelength spectrum 1045, which is generated by widening the wavelength selection range of the diffraction grating 1023a, includes four to five longitudinal oscillation modes. As a result, more longitudinal oscillation modes can be selectively output easily as compared with when a plurality of longitudinal oscillation modes are formed based on a single center wavelength. Further, the stimulated Brillouin scattering is reduced and DOP is reduced, and an optical output can be increased.

Figure 51:
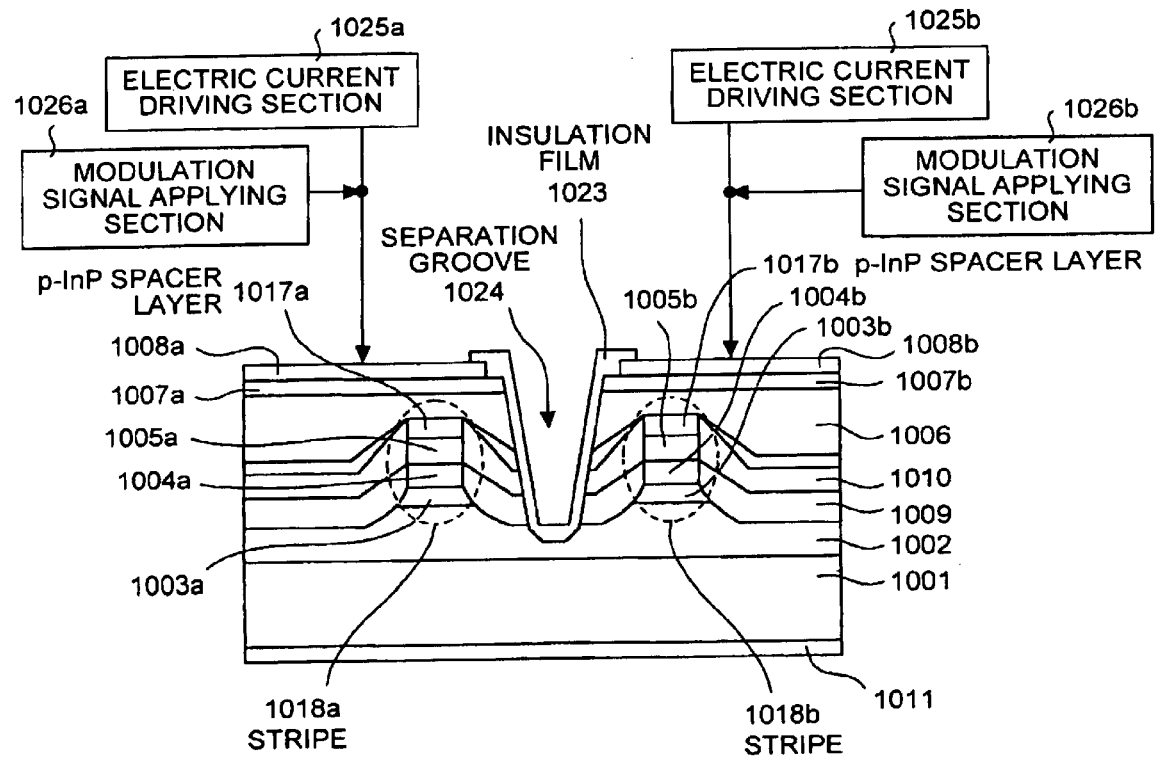
FIG. 51 is a longitudinal sectional view that shows a structure of a semiconductor laser device according to the eleventh embodiment of the present invention.

The eleventh embodiment of the present invention will be explained next. The semiconductor laser device according to the eleventh embodiment is a semiconductor device where the semiconductor layer device of the ninth embodiment is applied to the semiconductor laser device of the tenth embodiment. In other words, as shown is FIG. 51, the p-side electrodes 1008 of the respective stripes 1018a and 1018b are separated from each other by the separation groove 1024 and the insulating film 1023 so that the p-side electrode 1008a of the stripe 1018a is separated from the p-side electrode 1008b of the stripe 1018b.

In the eleventh embodiment, in addition to the operation and function of the tenth embodiment, similar to the second embodiment, different modulation frequency signals can be applied to the stripes 1018a and 1018b so that the DOP can be further reduced.

Figure 52:
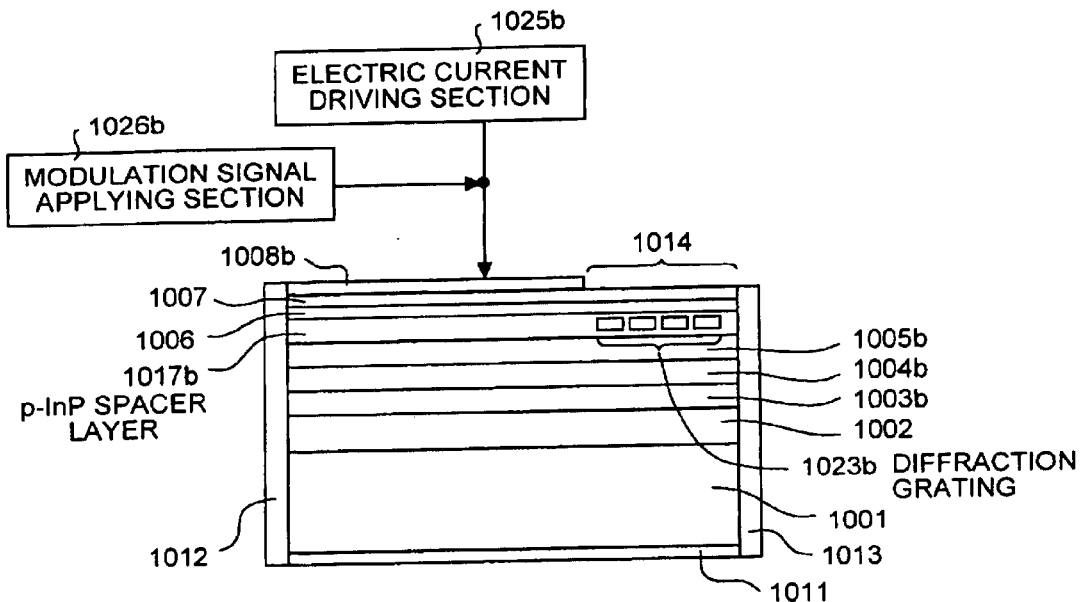
FIG. 52 shows a variation of the semiconductor laser device according to the eleventh embodiment of the present invention.

Within p-side electrode corresponding to either one of the stripe 1018a or 1018b, as shown in FIG. 52, p-side electrode 1008b occupies only the area other than the upper area of the diffraction grating 1023b so that a current non-injection area 1014 may be formed. In general, a refractive index of the semiconductor single crystal changes due to an electric current flowing therein. Since the p-side electrode 1008a is arranged along the entire surface of the stripe 1018a, the refractive index of the whole area changes. The diffraction grating 1023a is unexceptional and since the refractive index changes, an optical path length changes and effective period of the diffraction grating also changes. Therefore, the center wavelength and longitudinal mode to be selected by the diffraction grating 1023a actually obtain a value slightly deviated from 1480 nm.

Meanwhile, the stripe 1018b has the current non-injection area 1014 and its lower section is disposed with the diffraction grating 1023b. Therefore, since the injection current does not flow into the diffraction grating 1023b and the refractive index of the diffraction grating 1023b does not change, a laser beam having plural longitudinal oscillation modes to be selected by strip 1018a and a laser beam having plural longitudinal oscillation modes to be selected by the stripe 1018b have different center wavelengths and longitudinal mode spacing. As a result, it is the same as that in which independent semiconductor current non-injection area 1014 laser elements are provided for the respective stripes 1018a and 1018b, and thus the DOP can be reduced securely.

Further, stimulated Brillouin scattering is suppressed when semiconductor laser device having length of current non-injection area, 60 $\mu$m in longitudinal direction, length of diffraction grating 1023b, 50 $\mu$m, and having resonator length, 1500 $\mu$m, is modulated to change the amplitude value of optical output by 1%, using modulation frequency signal at 30 kHz sine wave.

Figure 53:
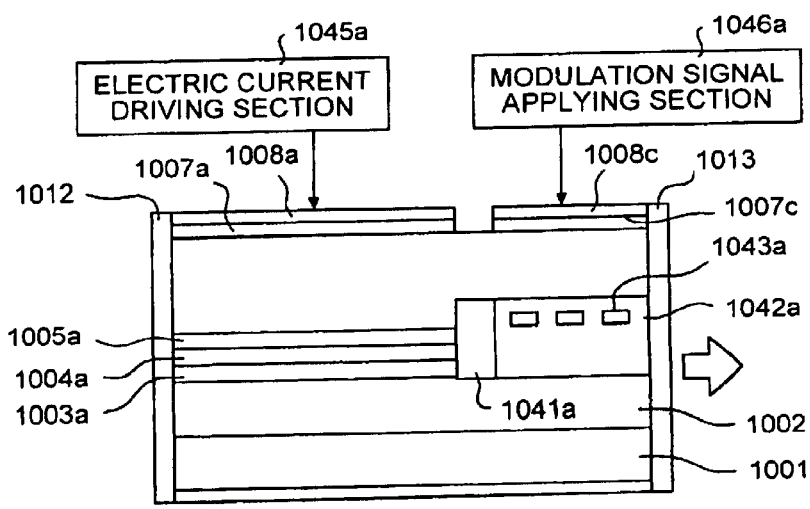
FIG. 53 shows a variation of the semiconductor laser device according to the eleventh embodiment of the present invention.

Further, as shown in FIG. 53, the present invention can be applied also to a structure in which the diffraction grating is not provided along the active layer 1004a but a diffraction grating 1043a is provided between the active layer 1004a and the low reflection film 1013. As shown in FIG. 53, optical waveguide paths 1041a and 1042a are provided to be adjacent to the active layer 1004a, and the diffraction grating 1043a is embadded in the optical waveguide path 1042a. A p-side electrode 1008c which is separated from the p-side electrode 1008a, which is provided above the active layer 1004a, is provided above the diffraction grating 1043a. An electric current driving section 1045a supplies a bias current to the p-side electrode 1008a. A modulation signal applying section 1046a applies a modulation frequency signal to the p-side electrode 1008c. As a result, the refractive index of the vicinity of the diffraction grating 1043a changes according to the modulation frequency signal, and the oscillation wavelength changes and the spectrum width of the longitudinal oscillation mode is widened so that the threshold value Pth of the stimulated Brillouin scattering is increased relatively. Moreover, the spectrum width of the longitudinal oscillation mode becomes wide and wavelengths output from the respective stripes 1018a and 1018b are different from each other so that the DOP can be reduced.

Figure 54:
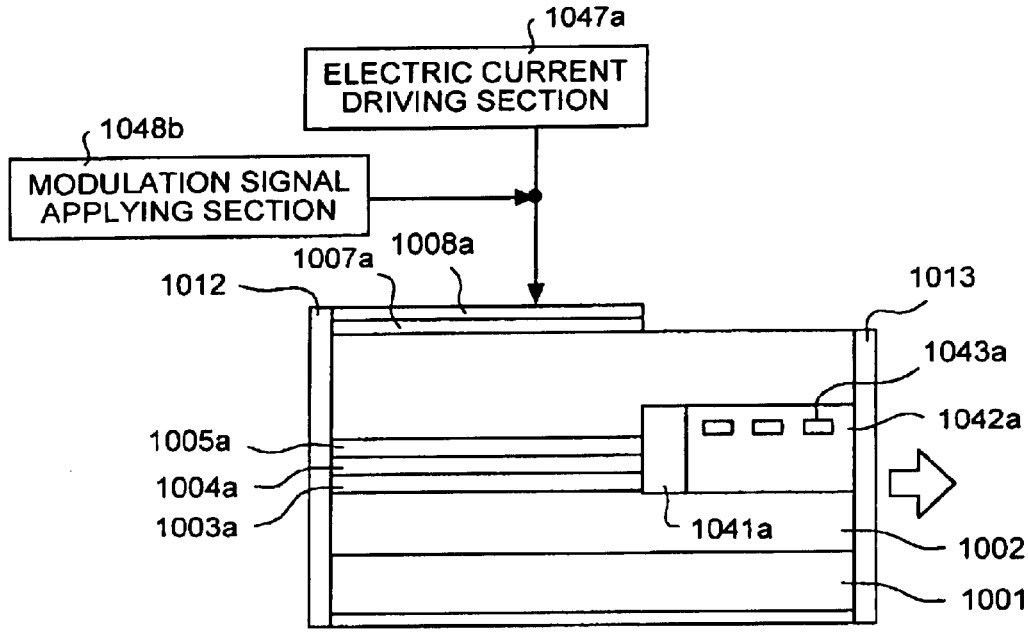
FIG. 54 shows a variation of the semiconductor laser device according to the eleventh embodiment of the present invention.

FIG. 54 shows a structure in which the p-side electrode 1008c provided above the diffraction grating 1043a in the structure shown in FIG. 53 is not provided. The modulation frequency signal output from a modulation signal applying section 1048a is superposed on the bias current output from an electric current driving section 1047a so that the superposed signal is applied to the p-side electrode 1008a. As a result, the refractive index near the active layer 1004a changes according to the modulation frequency signal and the oscillation wavelength changes and the spectrum width of the longitudinal oscillation mode becomes wide so that the threshold value Pth of the stimulated Brillouin scattering is increased relatively. Moreover, the spectrum width of the longitudinal oscillation mode becomes wide and the wavelengths output from the stripes 1018a and 1018b are different from each other so that the DOP can be reduced. The structures shown in FIGS. 53 and 54 can be applied also to the eighth embodiment in which the separation groove 1024 is not provided.

The twelfth embodiment of the present invention will be explained next. A semiconductor laser module according to the twelfth embodiment uses the semiconductor laser device of the eighth embodiment.

Figure 55:
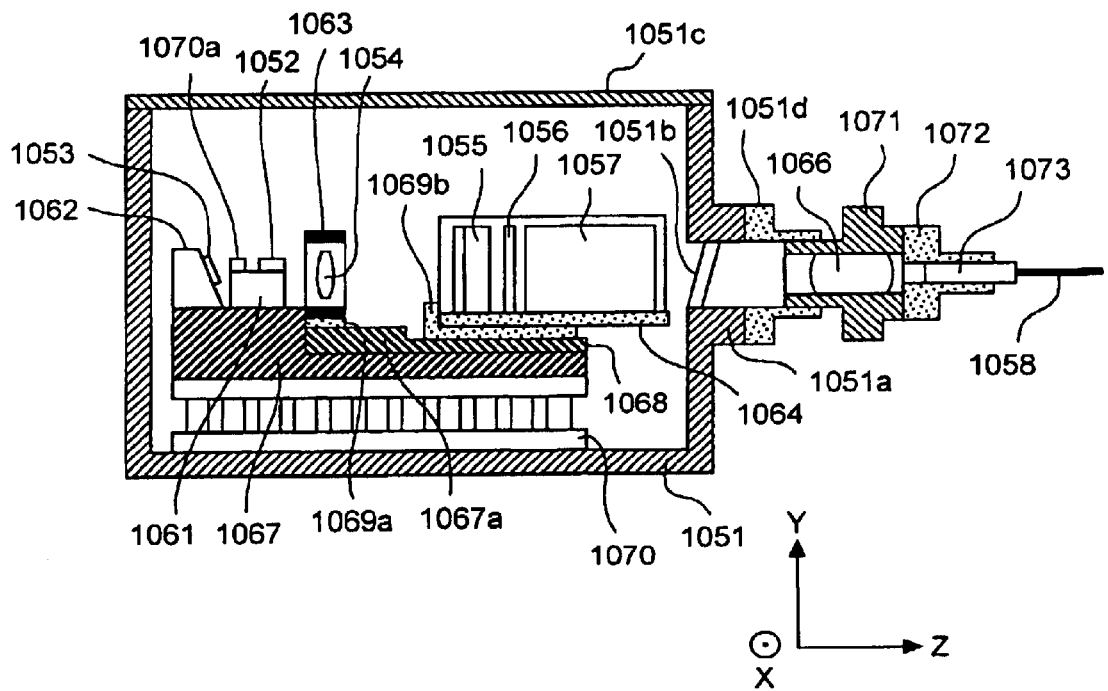
FIG. 55 is a longitudinal sectional view that shows a structure of a semiconductor laser device according to the twelfth embodiment of the present invention.
Figure 56:
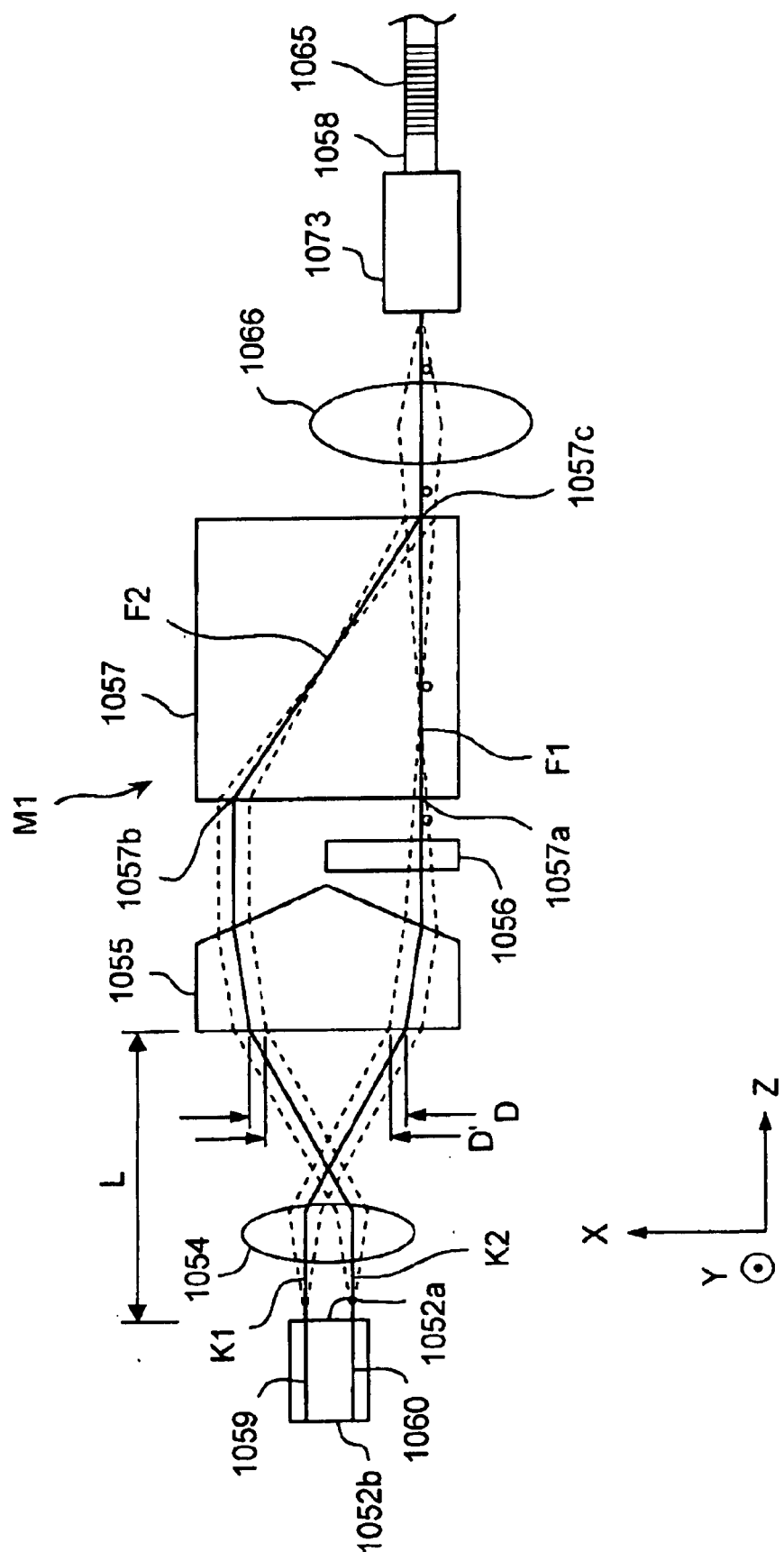
FIG. 56 is a view showing frame format of the structure of the semiconductor laser module according to the twelfth embodiment of the present invention.

FIG. 55 is sectional view that shows a structure of the semiconductor laser module of the twelfth embodiment. FIG. 56 is a frame format of the structure of a semiconductor laser module according to the twelfth embodiment of the present invention.

As shown in FIG. 55, the semiconductor laser module of the twelfth embodiment has a package 1051 inside of which is tightly sealed, a semiconductor laser device 1052 which is provided in the package 1051 and emits a laser beam, a photodiode 1053, a first lens 1054, a prism 1055, a half-wave plate (polarization rotating device) 1056, a polarization beam combiner (PBC) 1057 and an optical fiber 1058.

As shown in FIG. 56, the semiconductor laser device 1052 has stripes 1015 and 1016 that are formed in parallel on the same plane in the longitudinal direction and are separated. A first laser beam K1 and a second laser beam K2 are emitted respectively from end surfaces of the stripes 1015 and 1016. In reality, symbols K1 and K2 represent trajectories of the centers of the laser beams. As shown by broken lines, the beams propagate around the centers with a certain expanse. The distance between the stripes 1015 and 1016 is about 40 μm.

The semiconductor laser device 1052 is fixed and mounted onto a chip carrier 1061 (see FIG. 55). The semiconductor laser device 1052 may be mounted on a heat sink which, in turn, may be mounted on the chip carrier 1061.

The photodiode 1053 receives a laser beam for a monitor emitted from an end surface 1002b on the rear side (left side in FIG. 55) of the semiconductor laser device 1052. The photodiode 1053 is mounted on a photodiode carrier 1062.

The first laser beam K1 emitted from an end surface 1002a on the front side (right side in FIG. 55) of the semiconductor laser device 1052 and the second laser beam K2 enter the first lens 1054, and the first lens 1054 converges those beams to different focal positions (F1, F2) so as to widen the distance between the first laser beam K1 and the second laser beam K2.

The first lens 1054 is held by a first lens holding member 1063 (see FIG. 55). It is preferable that the first lens 1054 is located so that the optical axis of the first laser beam K1 emitted from the stripe 1015 and the optical axis of the second laser beam K2 emitted from the stripe 1016 are approximately symmetrical with respect to the center axis of the first lens 1054. As a result, since the first laser beam K1 and the second laser beam K2 pass near the center axis of the first lens 1054 as an area where aberration of those beams is small, disorder of the wave surface of the laser beams is eliminated, and thus optical coupling efficiency with the optical fiber 1058 becomes high. As a result, the semiconductor laser module with higher output can be obtained. In order to suppress the influence of spherical aberration, a non-spherical lens that has negligible spherical aberration and a high coupling efficiency with the optical fiber 1058 is preferably used as the first lens 1054.

The prism 1055 is provided between the first lens 1054 and the polarization beam combiner 1057. This prism 1055 makes the optical axes of the first laser beam K1 and the second laser beam K2 approximately parallel. The prism 1055 is made of optical glass such as BX7 (boro-silicated crown glass). Since the optical axes of the first and second laser beams K1 and K2 propagating from the first lens 1054 in an unparallel manner are made parallel to each other by refraction of the prism 1055, the polarization beam combiner 1057 arranged on the rear side of the prism 1055 can be easily produced, and the semiconductor laser module can be miniaturized by miniaturizing the polarization beam combiner 1057.

Figure 57A:
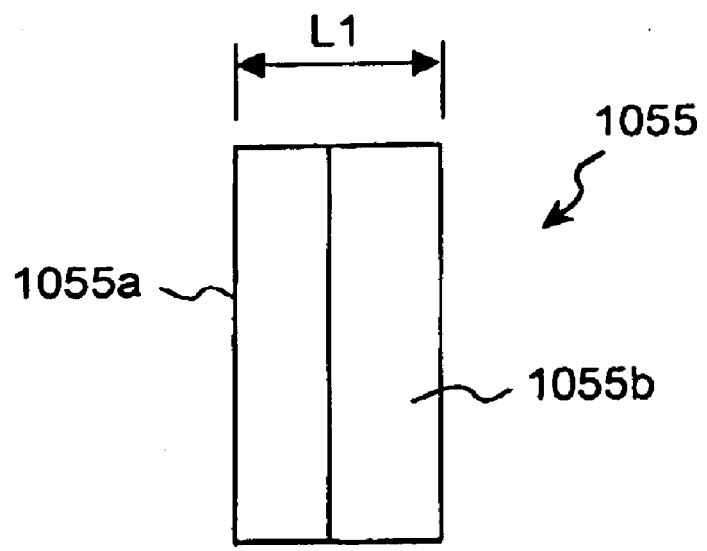
FIG. 57A is a side view that shows the structure of a prism.
Figure 57B:
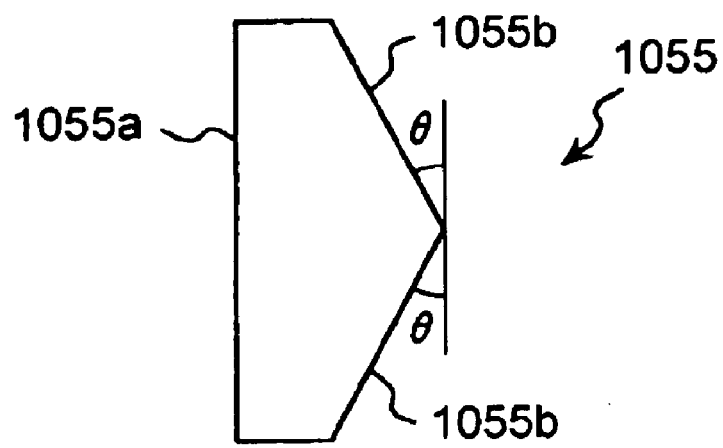
FIG. 57B is a plan view of FIG. 57A.

FIG. 57A is a side view that shows the structure of the prism 1055. FIG. 57B is a plan view of FIG. 57A. The length L1 of the prism is about 1.0 mm. The prism 1055 has an entrance face 1055a that is flat and an exit face 1055b that is tilted at a specific angle θ, where θ is 32.1°±0.1°

Of the first laser beam K1 and the second laser beam K2 that have passed through the prism 1055, only the first laser beam K1 enters the half-wave plate 1056. This half-wave plate 1056 rotates the plane of polarization of the first laser beam K1 by 90°.

The polarization beam combiner 1057 has a first port 1057a from which the first laser beam K1 enters, a second port 1057b from which the second laser beam K2 enters, and a third port 1057c. The first laser beam K1 entering from the first port 1057a and the second laser beam K2 entering from the second port 1057b are coupled and output from the third port 1057c. The polarization beam combiner 1057 is a birefringence element which propagates the first laser beam K1, for example, as an ordinary ray to the third port 1057c and propagates the second laser beam K2 as an extraordinary ray to the third port 1057c. When the polarization beam combiner 1057 is the birefringence element, it is made of $TiO_2$ (rutile), for example, so that its birefringence index is high and a separation width between the laser beams can be large.

Figure 58A:
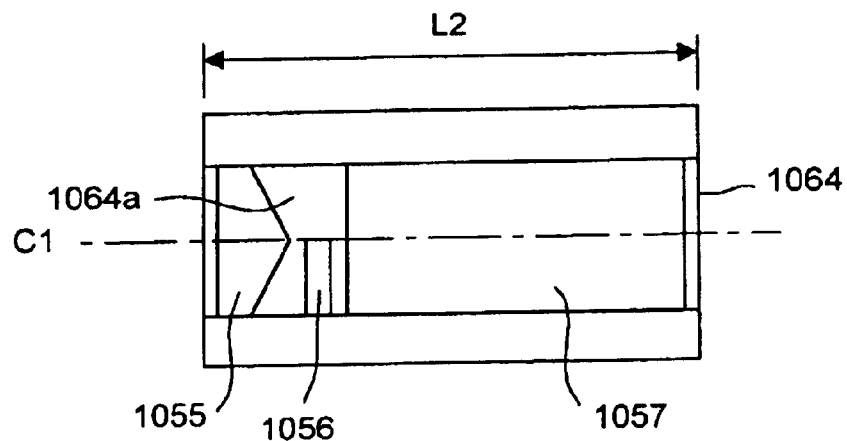
FIG. 58A is a plan view of a holder member which houses the prism, a half-wave plate, and a polarization beam combining member.
Figure 58B:
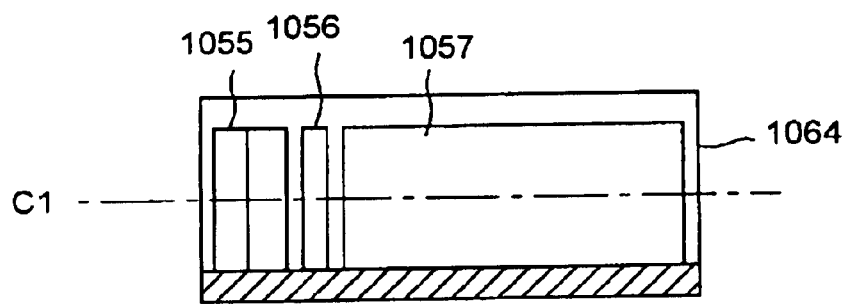
FIG. 58B is a side view of the holder.
Figure 58C:
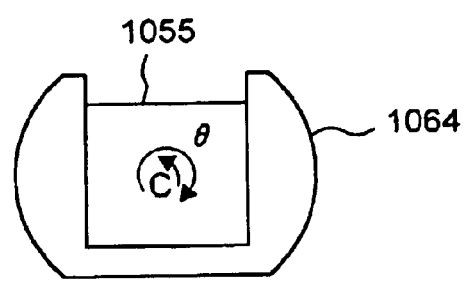
FIG. 58C is a front view of the holder.

In the twelfth embodiment, the prism 1055, the half-wave plate 1056, and the polarization beam combiner 1057 are fixed to the same holder member 1064. FIG. 58A is a plan view which shows the holder member 1064 which fixes the prism 1055, the half-wave plate 1056 and the polarization beam combiner 1057, and FIG. 58B is a side sectional view of FIG. 58A, and FIG. 58C is a front view of FIG. 58A. As shown in FIG. 58A, FIG. 58B, and FIG. 58C, the holder member 1064 is made of a material which can be YAG laser-welded (for example, SUS 403, 304 and the like), its entire length L2 is approximately 7.0 mm, and it is almost columnar. A housing section is formed in the holder member 1064. The prism 1055, the half-wave plate 1056, and the polarization beam combiner 1057 are fixed to the housing section. An upper section of the holder member 64 is opened, and its lower section is formed into a flat shape.

As a result, positions around a center axis Cl of the prism 1055 and the polarization beam combiner 1057 can be easily adjusted so that the first laser beam K1, which enters from the first port 1057a of the polarization beam combiner 1057 and the second laser beam K2, which enters from the second port 1057b are emitted from the third port 1057c.

The optical fiber 1058 receives the laser beam emitted from the third port 1057c of the polarization beam combiner 1057 and transmits it to the outside. As shown in FIG. 56, the optical fiber 1058 is provided with a light reflection section 1065 which reflects a beam of a predetermined wavelength band and is composed of a fiber grating. The beam of the predetermined wavelength is fed back to the semiconductor laser device 1052 by the light reflection section 1065, the oscillation wavelength of the semiconductor laser device 1052 is fixed, and the oscillation spectrum width can be narrowed. Therefore, when an output light from the semiconductor laser module is coupled by a wavelength multiplexing coupler (WDM) so as to be used as an excitation light source of an erbium doped optical fiber amplifier or a Raman amplifier, the loss of the wavelength multiplexing coupler is minimized and a coupled light with high output can be obtained. When it is used for a Raman amplifier, the gain fluctuation of a Raman amplification can be suppressed. The light reflection section 1065 is formed in such a manner that an ultraviolet light, which becomes interference fringes via a phase mask, for example, is emitted onto the core section of the optical fiber 1058 and thus the refractive index is changed periodically.

A second lens 1066, which optically couples the laser beam emitted from the third port 1057c of the polarization beam combiner 1057 with the optical fiber 1058, is provided between the polarization beam combiner 1057 and the optical fiber 1058. The first lens 1054 is located so that the first laser beam K1 and the second laser beam K2 form focal points (F1, F2) between the first lens 1054 and the second lens 1066. As a result, after the first laser beam K1 and the second laser beam K2 pass through the first lens 1054, a propagation distance L required for separation (a distance D' in FIG. 45 becomes sufficiently large value) becomes short, and thus the length of the semiconductor laser module in an optically axial direction can be shortened. This makes it possible to provide the semiconductor laser module with high reliability in which time stability of the optical coupling between the semiconductor laser device 1052 and the optical fiber 1058 is excellent under conditions of high temperature condition.

The chip carrier 1061 to which the semiconductor laser device 1052 is fixed and the photodiode carrier 1062 to which the photodiode 1053 is fixed are soldered and fixed to a first base pedestal 1067 that has an L-shaped section. The first base pedestal 1067 is preferably made of a CuW alloy or the like in order to improve the heat dissipation with respect to heat generation of the semiconductor laser device 1052.

The first lens holding member 1063 to which the first lens 1054 is fixed, and the holder member 1064 to which the prism 1055, the half-wave plate 1056, and the polarization beam combiner 1057 are fixed are fixed onto a second base pedestal 1068, respectively, via a first supporting member 1069a and a second supporting member 1069b by YAG laser welding. For this reason, the second base pedestal 1068 is preferably made of stainless steel or the like that is a good welding material. Moreover, the second base pedestal 1068 is silver-brazed to be fixed onto the flat section 1067a of the first base pedestal 1067.

A cooler 1070 composed of a Peltier element is provided below the first base pedestal 1067. A rise in the temperature due to the heat generation from the semiconductor laser device 1052 is detected by a temperature adjusting module 1070a provided on the chip carrier 1061. The cooler 1070 is controlled so that the temperature detected by the temperature adjusting module 1070a becomes constant. This makes it possible to heighten and stabilize the laser output of the semiconductor laser device 1052.

A window section 1051b in which the light that has passed through the polarization beam combiner 1057 enters is provided in a flange section 1051a formed on a side section of the package 1051, and an intermediate member 1051d is fixed to the end surface of the flange section 1051a. A second lens holding member 1071 which holds the second lens 1066 that condenses the laser beam is fixed into the intermediate member 1051d by YAG laser welding. A slide ring 1072 made of metal is fixed to the end section of the second lens holding member 1071 by YAG laser welding.

The optical fiber 1058 is held by a ferrule 1073, and the ferrule 1073 is fixed into the slide ring 1072 by YAG laser welding.

The operation of the semiconductor laser module of the twelfth embodiment will be explained. The first laser beam K1 and the second laser beam K2, which are emitted respectively from the front end surfaces 1002a of the stripe 1015 and the stripe 1016 of the semiconductor laser device 1052, pass through the first lens 1054 to cross each other, and the distance between the beams K1 and K2 is widened and the beams K1 and K2 enter the prism 1055. The distance (D) between the first laser beam K1 and the second laser beam K2 is approximately 460 μm when they enter the prism 1055. The first laser beam K1 and the second laser beam K2 are made to be parallel with each other by the prism 1055 so as to be emitted (their distance becomes approximately 500 μm). After the first laser beam K1 enters the half-wave plate 1056 so as to rotate the plane of polarization by 90°, it enters the first port 1057a of the polarization beam combiner 1057, and the second laser beam K2 enters the second port 1057b of the polarization beam combiner 1057.

In the polarization beam combiner 1057, the first laser beam K1, which enters from the first port 1057a and the second laser beam K2, which enters from the second port 1057b, are combined so that the multiplexed beam is emitted from the third port 1057c.

The laser beam emitted from the polarization beam combiner 1057 is condensed by the second lens 1066 and enters the end surface of the optical fiber 1058 held by the ferrule 1073 so as to be transmitted to the outside. Moreover, a part of the laser beam is reflected by the light reflection section 1065 of the optical fiber 1058, and the reflected light is fed back to the semiconductor laser device 1052 so that an external resonator is constituted between the semiconductor laser device 1052 and the light reflection section 1065. This makes laser oscillation possible in a wavelength band determined by the light reflection section 1065.

Meanwhile, the laser beam for monitoring emitted from the rear end surface 1002b of the semiconductor laser device 1052 is received by the photodiode 1053, and a light receiving quantity and the like of the photodiode 1053 is calculated so that an optical output and the like of the semiconductor laser device 1052 is adjusted.

According to the semiconductor laser module of the twelfth embodiment, the first laser beam K1 and the second laser beam K2 are emitted from the semiconductor laser device 1052, and the plane of polarization of the first laser beam K1 is rotated by 90° by the half-wave plate 1056, and the first laser beam K1 and the second laser beam K2 are polarization-multiplexed by the polarization beam combiner 1057. For this reason, a laser beam having a high output and a small degree of polarization can be output from the optical fiber 1058. Moreover, since the light reflection section 1065 composed of a fiber grating is formed on the optical fiber 1058, a laser beam that has a fixed wavelength can be output from the optical fiber 1058. Therefore, this semiconductor laser module can be applied as an excitation light source of the Erbium doped optical fiber amplifier requiring a high output or the Raman amplifier requiring low polarization dependency and wavelength stability.

In addition, since only one semiconductor laser device 1052 having two stripes emitting two laser beams is used, the time required for locating the semiconductor laser device 1052 is shortened. As a result, the time required to produce the semiconductor laser module can be shortened.

Further, since beams are emitted in completely different axial directions from two semiconductor laser devices conventionally, when a semiconductor laser module is not designed taking into consideration the warpage or the like of the package in the respective axial directions, fluctuation of the optical output due to the warpage of the package occurring due to a change of the ambient temperature cannot be suppressed. However, according to the structure of this embodiment, since two lights output from one semiconductor laser device are propagated in almost same direction, the influence of the warpage of the package is suppressed only in one direction so that the intensity of a light output from the optical fiber 1058 can be stabilized.

In addition, two lights are output from one semiconductor laser device so that the coupling efficiency of these two lights with the optical fiber 1058 fluctuates with respect to the warpage or the like of the package with the same tendency. Therefore, even when the temperature fluctuates, the degree of polarization of the light output from the optical fiber 1058 is stabilized.

In the twelfth embodiment, the semiconductor laser device according to the eighth embodiment is used so as to constitute the semiconductor laser module, but the module is not limited to this. The semiconductor laser device of the ninth embodiment may be used. For example, a semiconductor laser device having a wavelength selection device of the DFB or the DBR may be used, or the semiconductor laser device according to the tenth or eleventh embodiment may be used. Furthermore, it is preferable that such a semiconductor laser device is used because this has an advantage that a grating is not required when the optical fiber amplifier is used.

The thirteenth embodiment of the present invention will be explained. In the thirteenth embodiment, noise is reduced by applying reverse modulation frequency signal to each stripe of a semiconductor laser device according to ninth or eleventh embodiment in which the stripes are electrically separated. Further, laser beam emitted from each stripe is polarized multiplexed in the semiconductor laser module according to twelfth embodiment. By depolarizing the polarization multiplexed laser beam, the intensity modulation of each plane of polarization is averaged out. In addition, the stimulated Brillouin scattering is also reduced.

Figure 59:
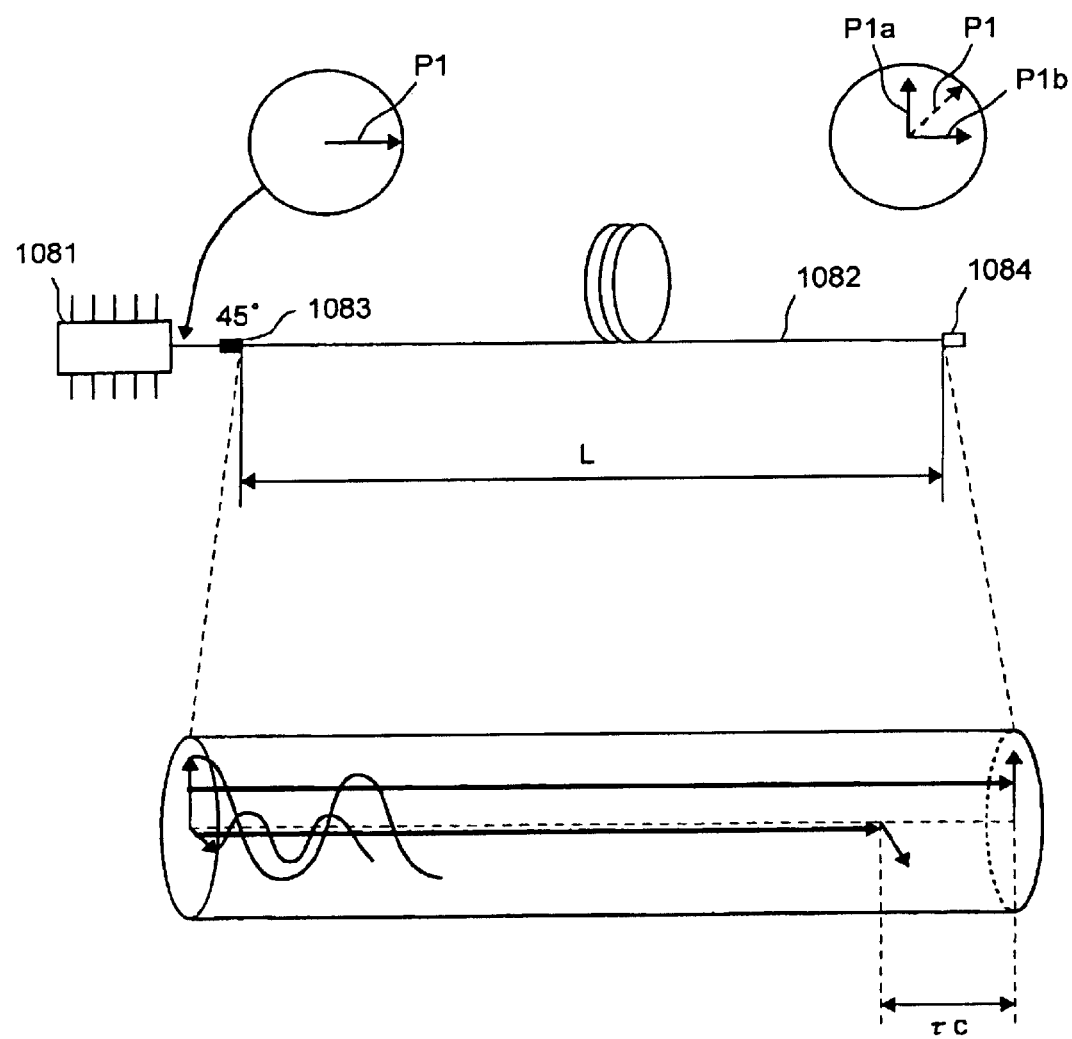
FIG. 59 explains a depolarizer used in the thirteenth embodiment of the present invention.

The depolarizer used in the thirteenth embodiment of the present invention will be explained. FIG. 59 shows a structure of the semiconductor laser device including the depolarizer used in the thirteenth embodiment of the present invention. In this semiconductor laser, a semiconductor laser element 1081 and a polarization-maintaining optical fiber 1082 are fused and connected by fuse 1083. The fuse 1083 is fused with the polarization-maintaining fiber 1082 in such a way that the laser beam P1 output from the semiconductor laser element 1081 enters the polarization-maintaining fiber 1082 with its polarization axis inclined at 45°.

Figure 60:
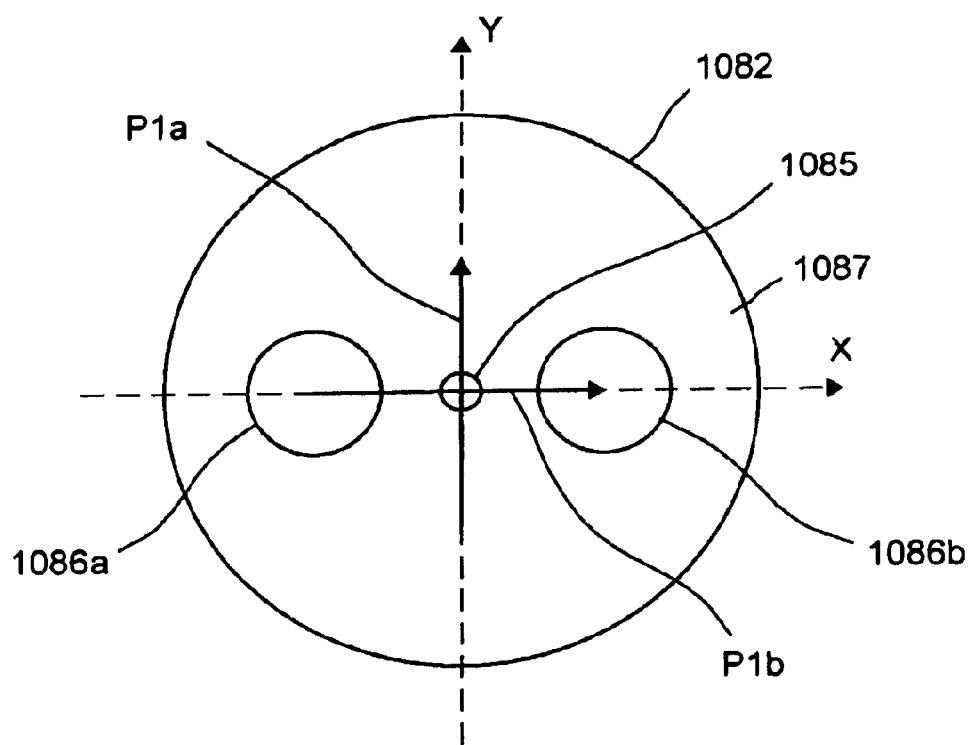
FIG. 60 shows a section of a polarization-maintaining fiber required for the depolarizer shown in FIG. 59.

The polarization-maintaining fiber 1082 functions as a depolarizer in that it depolarizes the entering laser beam and outputs it from the output end 1084. FIG. 60 shows a cross sectional view of the polarization-maintaining fiber (PMF) 1082. As can be seen in FIG. 60, there are two circular stress applicators 1086a and 1086b, one on either side of the core 1085. The PMF is a mapped single-mode parent material in which a hole for stress applicators is opened on either side of the core 1085. The inside of the hole is buffed at the same time as buffing of the outer surface of the quartz glass rod doped with $B_2O_3$, which is performed in order to increase the linear expansion coefficient. The buffed quartz glass rod is then inserted into the hole. Once the fiber is fabricated by mapping, in the cooling process that follows, the stress applicators 1086a and 1086b that have a large linear expansion coefficient as compared to the cladding section 1087, apply stress to the core 1085 due to the pulling.

In this PMF, a stretching stress occurs along the X direction and a compression stress occurs along the Y direction of the core 1085, according to the stress occurring in the stress applicators 1086a and 1086b. Birefringence is induced due to photo-electric effect. The beam propagation speeds in X and Y directions are different. In order for the PMF to function as a depolarizer it is necessary that the optical path difference should be more than the coherence length of each set of orthogonal light beam propagated in X and Y direction, and that the phase correlation between polarization beams should be eliminated. In other words, in order for the PMF to function as a depolarizer it is necessary that between polarization beams there should be a coherent time difference τc corresponding to the optical path difference that is more than the coherence length.

The semiconductor laser element 1081 outputs single mode laser beam of the DFB laser or the DBR laser. In the not shown optical fiber, the semiconductor laser element 1081 emits a laser beam the output terminal 1084 and is an excitation light source of the optical fiber amplifier which amplifies the signal light that is transmitted inside of this optical fiber. Further, the peak value of laser output of semiconductor laser element 1081 is more than the threshold value of stimulated Brillouin scattering in the optical fiber which is the output destination and is less than twice the threshold value.

The polarization axis of the polarization-maintaining optical fiber 1082 is inclined at 45° with respect to the polarization axis of laser beam that is output from the semiconductor laser element 1081 so that the output, in other words, the peak value of the laser beam that enters the polarization-maintaining fiber 1082 can be vectorially split into two. A time difference that is more than the coherent time difference τc arises between the polarization beams P1a and P1b when they are propagated through the polarization-maintaining optical fiber 1082 of length L and they are output as depolarized laser beams from the output terminal 1084.

Figure 61A:
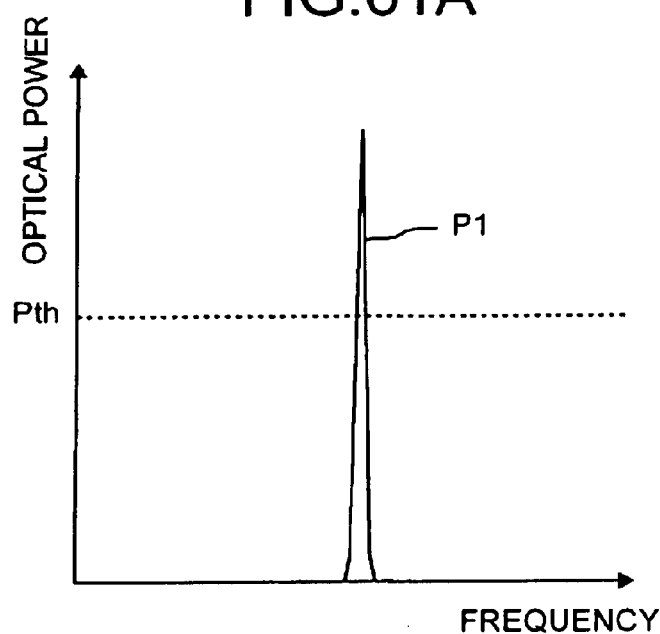
FIG. 61A and FIG. 61B are graphs that show the depolarization result of laser beam having a single longitudinal oscillation mode.
Figure 61B:
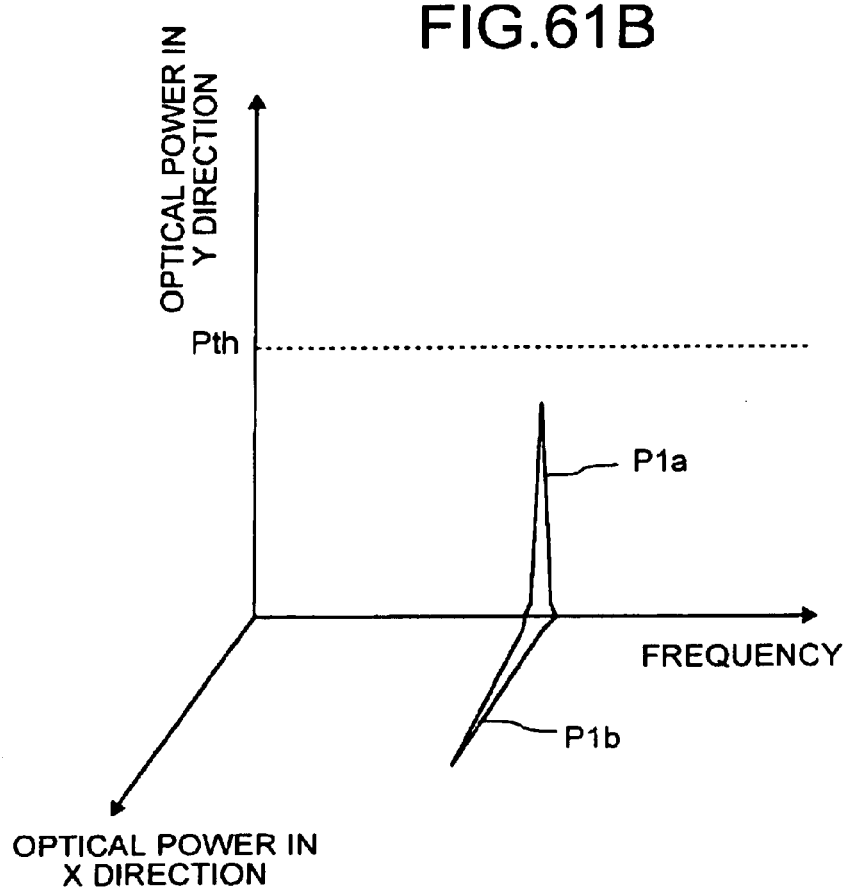

FIG. 61A shows the profile of the laser beam output from the semiconductor laser element 1081, and FIG. 61B shows the profiles of each of the polarization beams P1a and P1b output from the output terminal 1084. The peak value of laser beam P1 output from the semiconductor laser element 1081 is within the range of 1~2 times the threshold value Pth of stimulated Brillouin scattering, whereas the peak value of polarization beams P1a and P1b output from the output terminal 1084 is less than the threshold value Pth. As a result, the multiplexed output value of each polarization beam P1a and P1b output from output terminal 1084 is the same as the output value of the laser beam P1 output from the semiconductor laser element 1081. Further, since the peak value of the polarization beams P1a and P1b is half (½), the laser beam output from the output terminal is not affected by stimulated Brillouin scattering.

Figure 62:
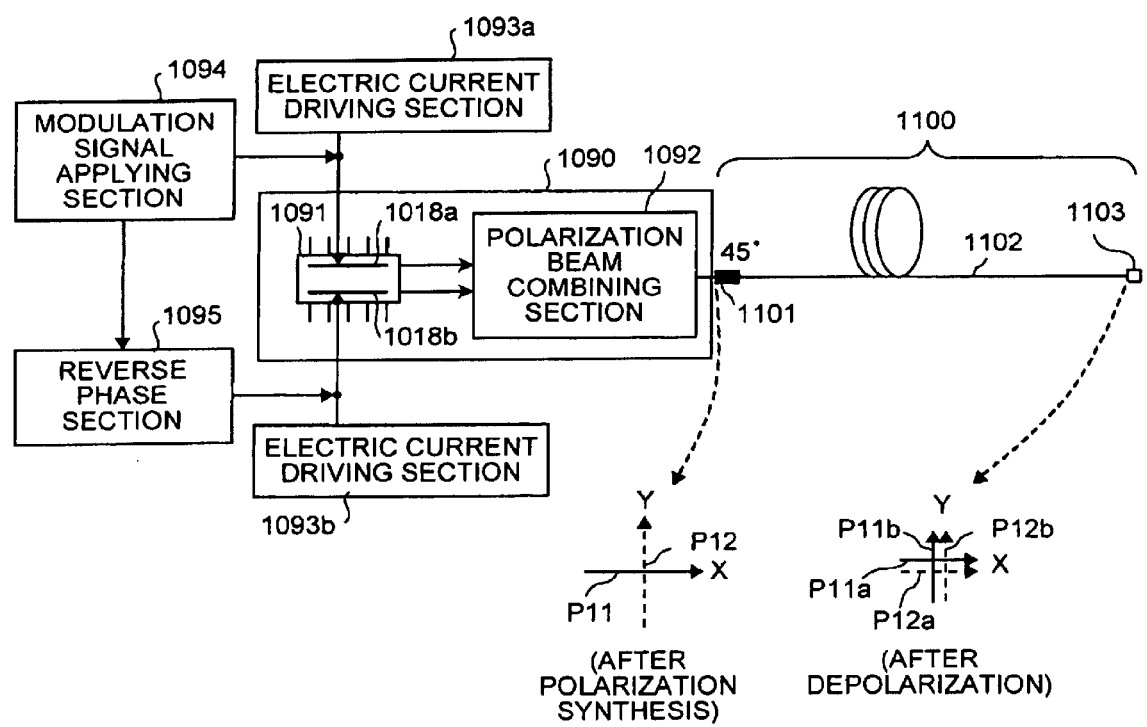
FIG. 62 shows a structure of a laser module according to the thirteenth embodiment of the present invention.

FIG. 62 is a block diagram of a semiconductor laser module according to the twelfth embodiment in which a semiconductor laser device according to the eleventh embodiment and a depolarizer shown in FIG. 59 are included. As shown in FIG. 62, the semiconductor laser module 1090 comprises a semiconductor laser device 1091 in which the stripes 1018a and 1018b of the eleventh embodiment that emit multiple longitudinal oscillation mode laser beams. The stripes 1018a and 1018b are electrically separated and are independently driven by electric current driving sections 1093a and 1093b, respectively. Modulation frequency signals for each stripe 1018a and 1018b are superposed and applied by modulation frequency applying section 1094. The modulation frequency signal applied to stripe 1018b is converted to a reverse phase by a reverse phase section and therefore has a phase that is opposite to the modulation frequency signal applied to stripe 1018a. The semiconductor laser module 1090 is compatible with the semiconductor laser module according to twelfth embodiment. Further, the electric current driving sections 1093a and 1093b may be integrated and made into one electric current driving section.

The laser beams P11 and P12 output from the stripes 1018a and 1018b, respectively, are made to be orthogonal to each other and then coupled in a polarization beam combining section 1092. Each coupled laser beam P11 and P12 is split orthogonally in the X, Y polarization direction by inclining its axis of polarization at 45° and the beam is propagated inside the polarization maintaining fiber 1102 in a split form. In other words, the X direction component P11*a* of the laser beam P11 and the X direction component P12*a* of the laser beam P12 are propagated inside the polarization maintaining fiber 1102. Similarly, the Y direction component P11*b* of the laser beam P11 and the Y direction component P12*b* of the laser beam P12 are propagated inside the polarization maintaining fiber 1102. The length of the polarization maintaining fiber is such that the time difference is greater than the coherent time difference τc between the X direction component and Y direction component of the laser beam. The laser beams P11*a*, P11*b*, P12*a* and P12*b* having half the peak value of the laser beams P11 and P12 are output from the output terminal 1103.

Figure 63:
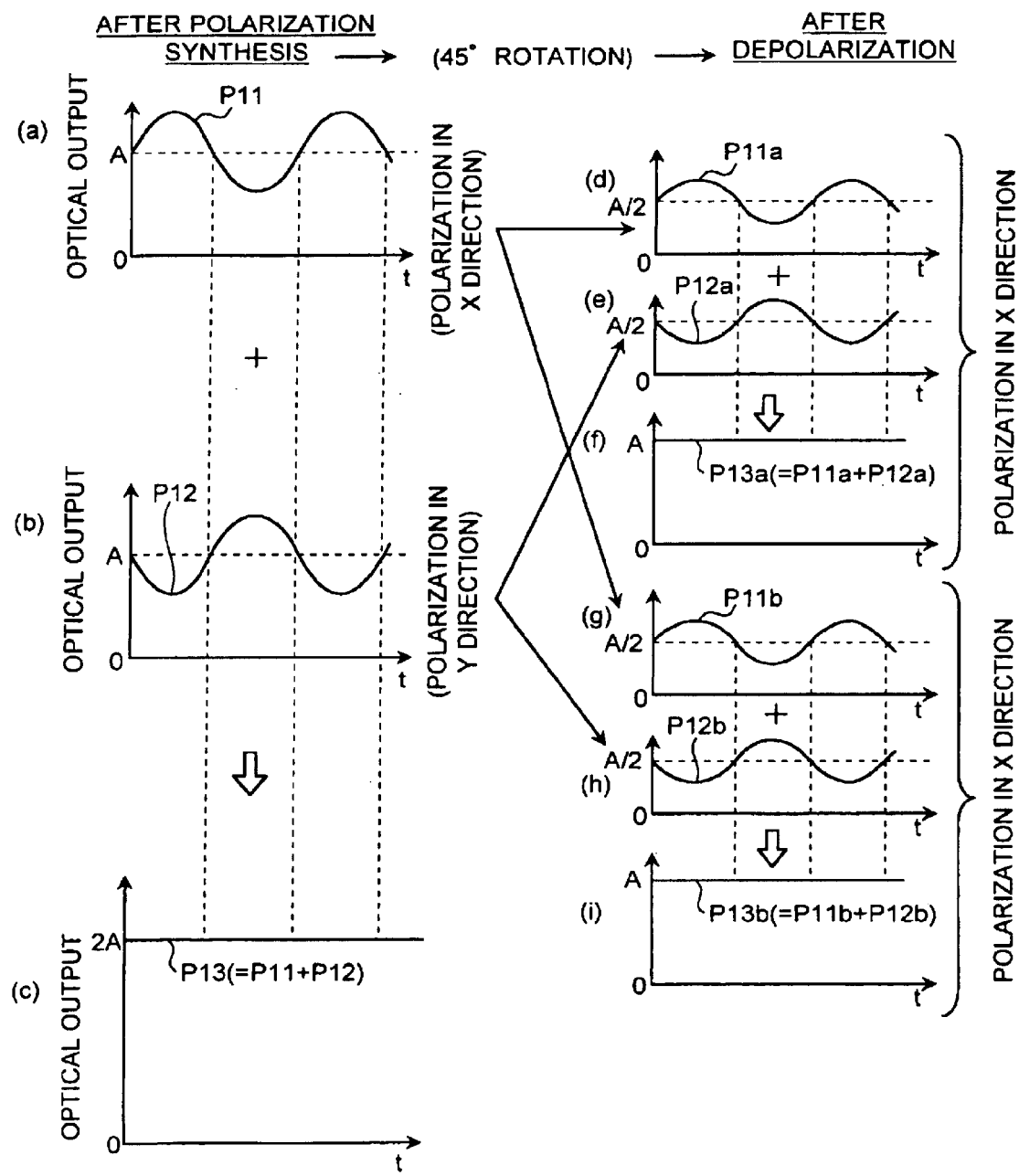
FIG. 63 shows the status of the laser beam on each plane of polarization after polarization multiplex and after depolarization in the laser module shown in FIG. 62.

Polarization multiplex and depolarizing of the laser beams P11 and P12 will be explained with reference to the FIG. 63. The laser beam P11 (see (a)), that has an average optical intensity A modulated by a modulation frequency signal is propagated along the X directional plane of polarization. On the other hand, as shown in FIG. 63B, the laser beam P12 (see (b)), that also has an average optical intensity A modulated by a modulation frequency signal of reverse phase to the one in P11, is propagated along Y directional plane of polarization. As a result of this the laser beam after polarization multiplex has an averaged out output and has an optical output of 2A (see (c)). However, the status of the modulation by modulation frequency signals for each plane of polarization is maintained.

Subsequently, the axes of polarization of the laser beams P11 and P12 is inclined at 45° by the fuse 101. Thereafter the laser beams P11 and P12 exit the polarization maintaining fiber 1102. Upon being depolarized by the depolarizer 100, the optical output of the laser beams output in X directional plane of polarization P11*a* and P12*a* is halved. The two laser beams P11*a* and P12*a* have phases that are reverse with respect to each other (see (d), (e), and (f)). However, since the laser beams P11*a* and P12*a* are on the same plane, the modulation frequency components having reverse phase relationship are offset and a constant optical output A is achieved in the X directional plane of polarization (see (f)). Similarly, the optical output of the laser beams output in Y directional plane of polarization P11*b* and P12*b* is halved. The two laser beams P11*b* and P12*b* have phases that are reverse with respect to each other (see (g) and (h)). However, since the laser beams P11*b* and P12*b* are on the same plane, the modulation frequency components having reverse phase relationship are offset and a constant optical output A is achieved in the Y directional plane of polarization (see (i)). As a result, the fluctuation of the optical output A in response to the modulation frequency signal and the noise due to modulation frequency are effectively eliminated, and a depolarized laser beam of an optical output 2A is output from the output terminal 1103. The waveforms (d), (e), (f), and (h) are the same waveforms on time axis but show different speeds of propagation inside the polarization maintaining fiber 1102 due to different refractive index inside the polarization maintaining fiber 1102.

The semiconductor laser device 1091 has multiple longitudinal oscillation modes. The optical spectrum becomes wider according to the modulations due to modulation frequency signals. This has the effect of eliminating stimulated Brillouin scattering. At the same time, the peak value of the optical output is reduced as the laser beam in each longitudinal oscillation mode is depolarized, thereby relatively increasing the threshold value of stimulated Brillouin scattering. Further, the modulation frequency signals have reverse phase relationship and the modulation frequency components are offset, because of which a laser beam with reduced noise component due to modulation frequency signals is output.

Figure 64A:
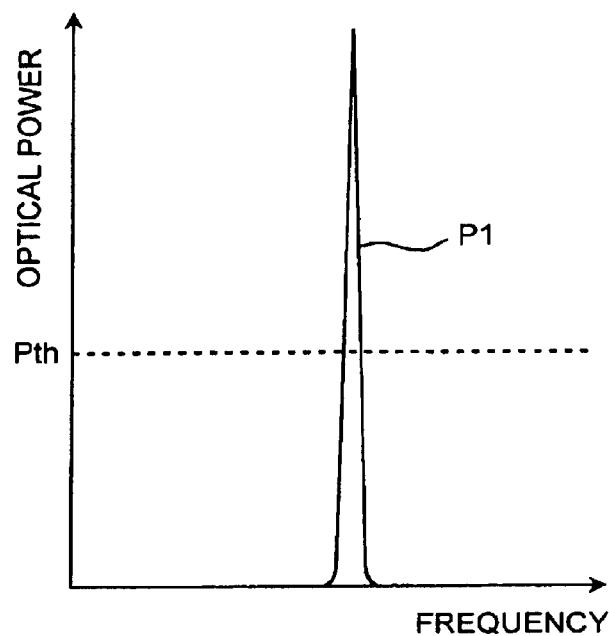
FIG. 64A and FIG. 64B are graphs that show polarization status and spectrum waveform in each longitudinal oscillation mode in the thirteenth embodiment of the present invention.
Figure 64B:
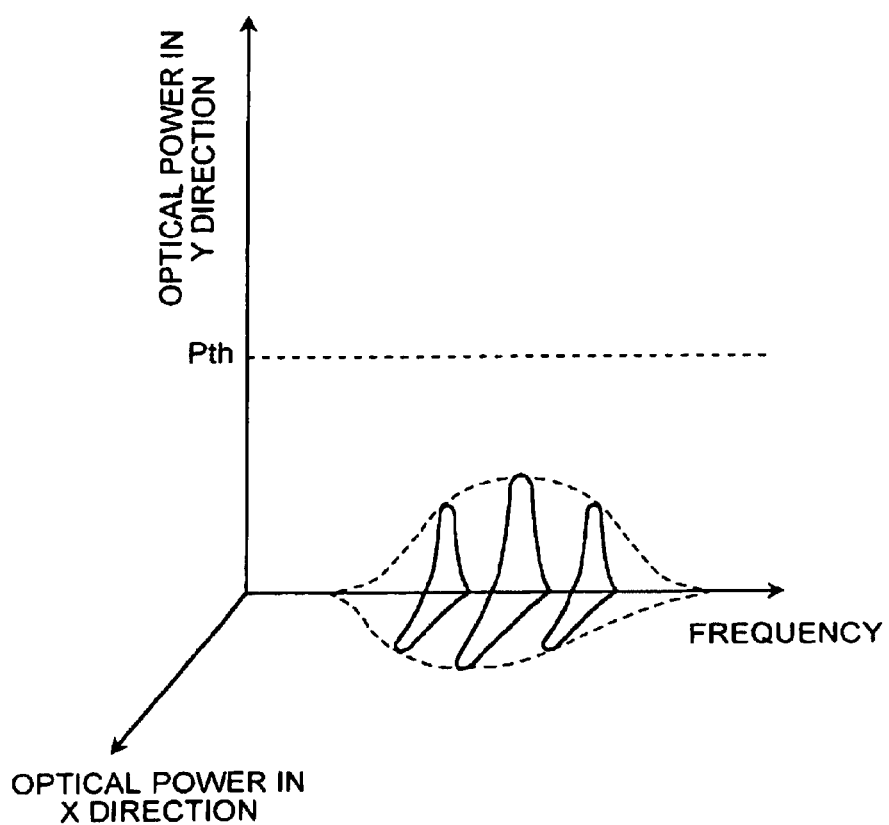

FIG. 64A and FIG. 64B show a case when the semiconductor laser device has three longitudinal oscillation modes. Since each longitudinal oscillation mode is depolarized in the two polarization directions, in effect, there are six longitudinal oscillation modes. In other words, the peak value of a single longitudinal oscillation mode in each of the stripes 1018*a* and 1018*b* can be reduced to ⅙. In other words, a single longitudinal oscillation mode laser beam having a peak value that is six times the threshold value of stimulated Brillouin scattering is obtained. Moreover, the spectrum line becomes wider because of modulation by modulation frequency signals, which decreases the peak value. Therefore a laser beam that is not affected by stimulated Brillouin scattering is realized. Further, as the modulation frequency signals applied to the two stripes 1018*a* and 1018*b* are of reverse phases, the modulation frequency components after depolarization, that takes place subsequent to polarizationmultiplex, are offset, the laser output obtained is constant and the noise is reduced.

According to the thirteenth embodiment explained above, the polarization beam combining section 1092 is realized by employing optical components. However, in the fourteenth embodiment, the polarization beam combining section 1092 is realized by employing an optical fiber type coupler.

Figure 65:
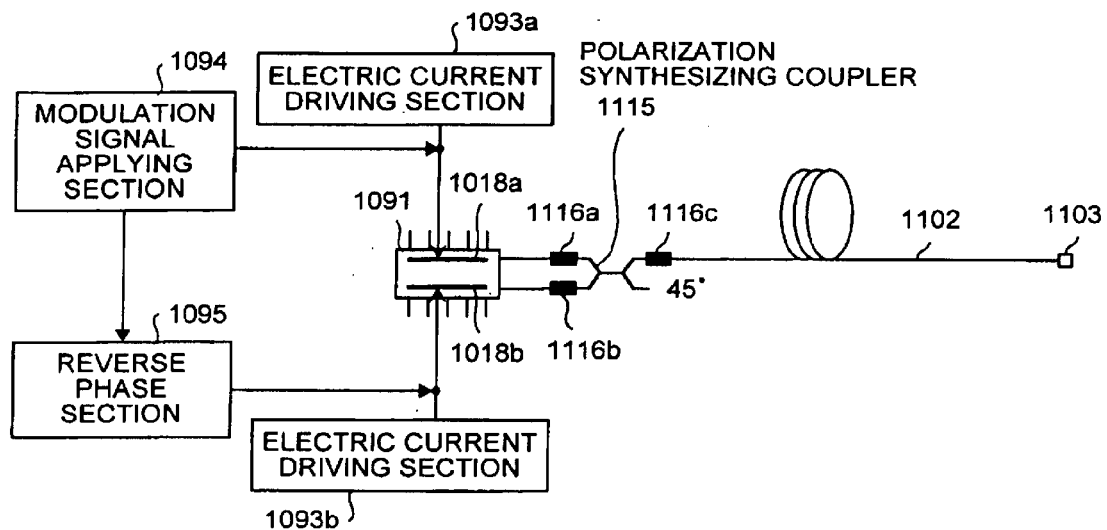
FIG. 65 shows a structure of a laser module according to the fourteenth embodiment of the present invention.

FIG. 65 shows the structure of a semiconductor laser module according to the fourteenth embodiment. As shown in FIG. 65, in this laser module, a polarization beam combiner 1115 is used, instead of the polarization beam combining section 1092 that is used in the thirteenth embodiment. The other components are identical to those in the thirteenth embodiment and are assigned with the same reference numerals.

Figure 66:
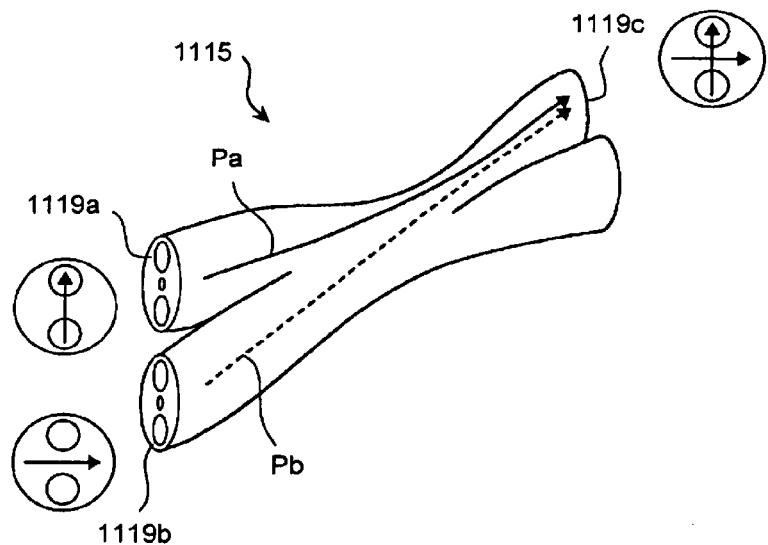
FIG. 66 is an oblique schematic view of a polarization beam combiner.

As shown in FIG. 66, the polarization beam combiner 1115 is fabricated by fusing two polarization maintaining fibers in such a way that their axes of polarization are parallel. A polarization beam Pa that has a plane of polarization in the direction of the stress applicators enters an input terminal 1119*a*. A polarization beam Pb that has a plane of polarization that is at right angles to the direction of the stress applicators enters an input terminal 1119*b*. The propagation speed of the polarization beam Pb is greater than that of the polarization beam Pa. The polarization beams Pa and Pb are polarizationmultiplexed at the output terminal 1119*c* by adjusting the propagation coefficient differential, that is, by adjusting the distance of the polarization beam Pb that is propagated at an angle, and the distance of the polarization beam Pa that is propagated in a straight line. Therefore, when the fuses 1116*a* to 1116*c* are fused with the input terminals 1119*a* to 1119*c*, the fuses 1116*a* and 1116*b* are fused in such a way that there is a 90° shift between their planes of polarization.

In the semiconductor laser module according to the fourteenth embodiment wherein fuses 1116*a* to 1116 are used, optical fibers can be employed in the entire length from the semiconductor laser device 91 up to the output terminal 1103. Hence the structure of the laser module can be simplified and made compact.

The fifteenth embodiment of the present invention will be explained. In the fifteenth embodiment depolarization is carried out using birefringence elements instead of birefringence index of the polarization-maintaining fiber.

Figure 67:
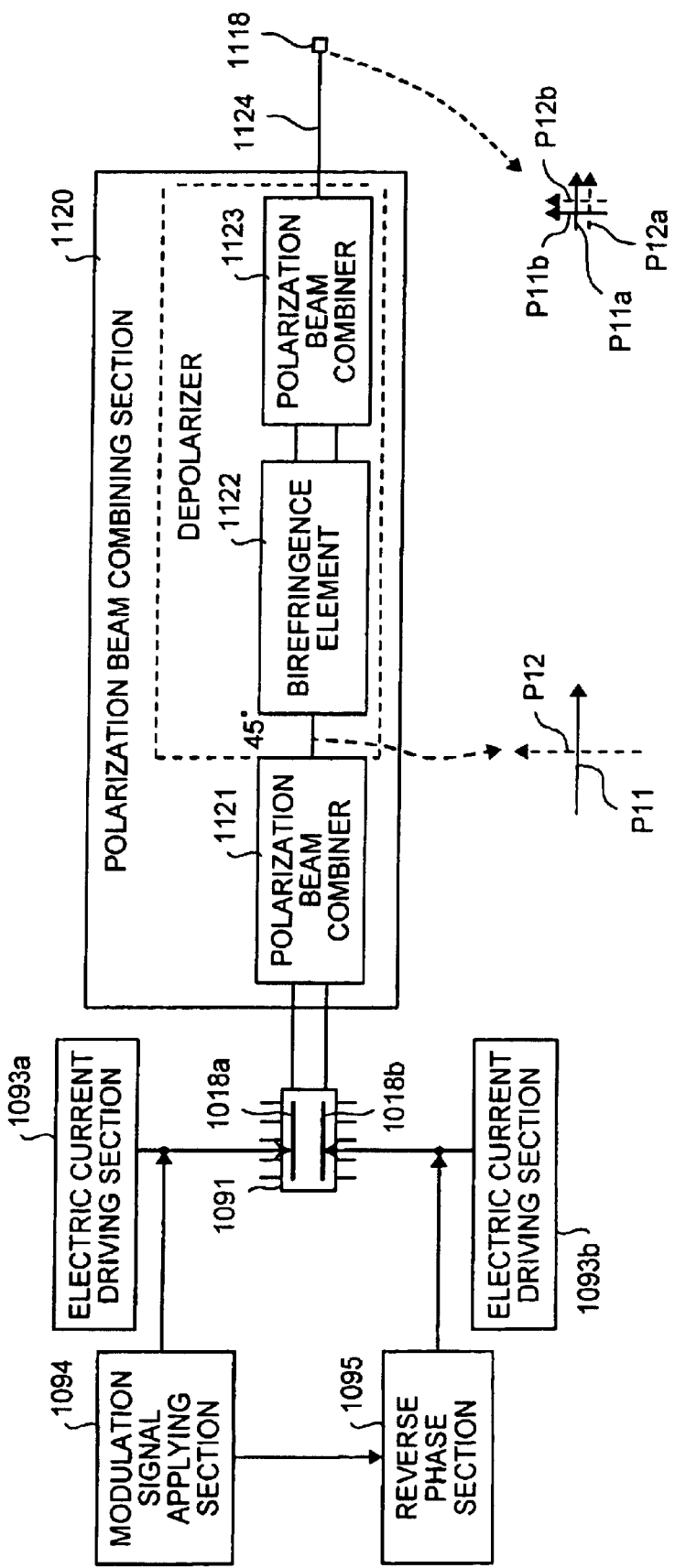
FIG. 67 shows a structure of a laser module according to the fifteenth embodiment of the present invention.

FIG. 67 shows the structure of a laser module according to the fifteenth embodiment. As shown in FIG. 67, a polarization beam combining section 1120 comprises polarization beam combiners 1121 and 1123, and a birefringence element 1122. The birefringence element 1122 and the polarization beam combiner 1123 function as depolarizers. The polarization beam combiner 1121 corresponds to the polarization beam combining section 1092, and polarization multiplexes the laser beams P11 and P12 output from the semiconductor laser device 1091 and outputs the laser beams to the birefringence element 1122 after tilting them by 45°.

A birefringence element is produced from rutile or monocrystalline quartz. The polarized beams P11 and P12 are accorded the time difference required for depolarization which is more than the coherent time difference τc and output to the polarization combiner 1123. The polarization combiner 1123 outputs the polarization multiplexed laser beams to the output terminal 1118 via the polarization-maintaining fiber 1124. Hence the same advantages as those of thirteenth and fourteenth embodiments can be obtained.

The sixteenth embodiment of the present invention will be explained next. In the thirteenth to fifteenth embodiments, the birefringence index of polarization-maintaining fiber 1102 is used for depolarization. However in the sixteenth embodiment depolarization takes place due to two optical fibers having different lengths such that the propagation time difference between the two optical fibers is greater than the coherent time difference τc.

Figure 68:
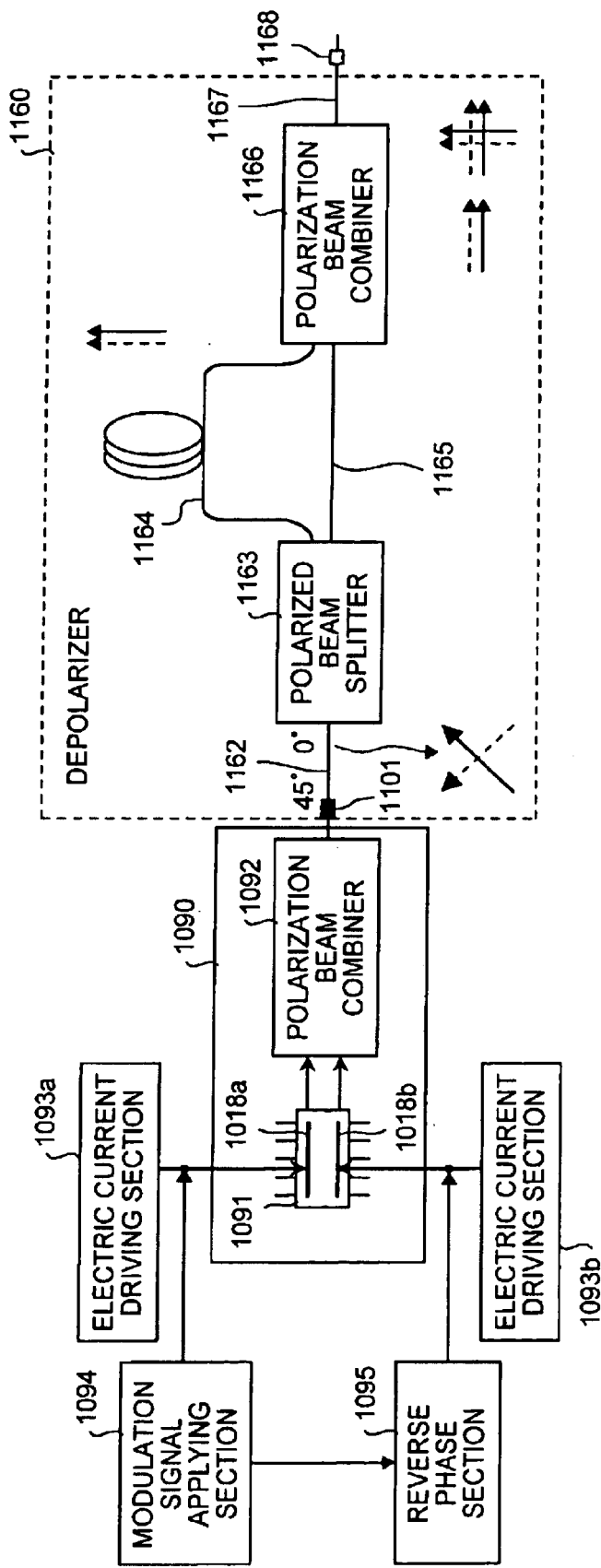
FIG. 68 shows a structure of a laser module according to the sixteenth embodiment of the present invention.

FIG. 68 shows a laser module according to the sixteenth embodiment where the depolarizer 1100 structure shown in FIG. 62 is replaced with another depolarizer 1160. As shown in FIG. 68, the laser beam polarization multiplexed by the semiconductor laser module 1090 enters a polarization-maintaining fiber 1162 at 45° with respect to its axis of polarization. This tilt to the laser beam is given by a fuse 1101. The laser beam propagated through the polarization-maintaining fiber 1162 enters a polarized beam splitter 1163 maintaining the same axis as the axis of polarization (0° tilt) and is split there. One of the polarized beams enters a polarization-maintaining fiber 1164 maintaining the same axis as the axis of polarization and the other split polarized beam enters another polarization-maintaining fiber 1165, again maintaining the same axis as the axis of polarization. A polarization beam combiner 1166 polarization multiplexes the polarization beams entering from the polarization-maintaining fibers 1165 and 1166. The polarization multiplexed beam passes through another polarization-maintaining fiber 1167 is output from an output terminal 1168.

The polarization-maintaining fiber 1164 is longer than the polarization-maintaining fiber 1165. The polarization beams propagated through the polarization-maintaining fiber 1164 and 1165 are depolarized owing to the fact that the time difference in their propagation is greater than the coherent time difference τc at the input terminal of the polarization beam combiner 1166.

The difference between the depolarization by the depolarizer 1100 and that by the depolarizer 1160 is explained. If the spectrum line width of the laser beam to be depolarized is taken as "Δf" then the coherent time difference τc can be calculated based on the expression (1).

$$\tau c = 1/\Delta f \quad (1)$$

Further, the if refractive index in the two polarization directions is n1 and n2 respectively, propagation time is T1 and distance is L for the polarization beam of refractive index n1, and the propagation time is T2 and the distance is L for the polarization beam of refractive index n2, and "c" is the velocity of light, then T1 and T2 can be calculated based on the expressions (2) and (3)

$$T1 = (L \times n1)/c \quad (2)$$

$$T2 = (L \times n2)/c \quad (3)$$

Therefore, as the condition for depolarization is that the time difference ΔT(=T1−T2) should be more than the coherent time difference τc, $$\Delta T = (L/c) \times (n1 - n2) \\ = (L/c) \times \Delta n > \tau c \quad (4)$$

As a result, length L of the polarization-maintaining fiber necessary for depolarization will be as follows:

$$L > (1/\Delta f) \times (c/\Delta n) \quad (5)$$

The refractive index difference for a polarization-maintaining fiber Δn is approximately $5 \times 10^{-4}$. If the spectrum line width Δf=20 MHz (wavelength width Δλ=0.15 nm), then from the expression (5), the length L of the polarization-maintaining fiber is more than $3 \times 10^4$ m. Therefore, if a time difference that is greater than the coherent time difference is obtained in the polarization-maintaining fiber, a very long polarization-maintaining fiber will be required, and in order to shorten the length, a polarization-maintaining fiber having a large refractive index Δn will be required.

On the contrary, in the depolarizer 1160, the propagation time difference depends on the lengths of the polarization-maintaining fibers and not on the difference in the refractive index and depolarization takes place on the condition that the propagation time is greater than the coherent time τc. In other words, from the expressions (2) and (3), If the lengths of the polarization-maintaining fibers 1164 and 1165 are L1 and L2, the polarization beam propagation time difference ΔT between the polarization-maintaining fibers 1164 and 1165 would be $$\Delta T = (n/c) \times (L1 - L2) \\ = (n/c) \times \Delta L > \tau c \quad (6)$$

Depolarization takes place if the expression (6) is satisfied.

If the refractive index n of the polarization-maintaining fibers 1164 and 1165 is taken as 1.5, and spectrum line width Δf=20 MHz, the difference in the lengths of the polarization-maintaining fibers 1164 and 1165 ΔL that is required for depolarization would be $$\Delta L > (1/\Delta f) \times (c/n) \quad (7),$$

Depolarization takes place if the difference ΔL is above 10 meters.

Particularly, if the spectrum line width Δf is 1 MHz and if refractive index is used, the difference in the lengths of the polarization-maintaining fibers that is required for depolarization would be 600 Km. However, if instead the difference in the lengths of the polarization-maintaining fibers ΔL is used, the difference in the lengths required for depolarization would be 200 m. If the length of one of the polarization-maintaining fibers is negligible, the length of the other polarization-maintaining fiber can be 200 m. Therefore, a depolarizer that functions based on the difference in the lengths of the polarization-maintaining fibers, like the depolarizer 1160, is lighter and more compact than the one that functions based on the refractive index, like the depolarizer 1100.

In the sixteenth embodiment described above, the fuse 1101 is provided at the side of the polarization beam combining section 1092 in such a way that the plane of polarization of the entering laser beam is rotated by 45°. A variation can be that the plane of polarization of the laser beam entering the polarization beam combining section 1092 is maintained as it (0°), and the plane of polarization of the laser beam coming out of the beam splitter 1163 is rotated by providing a fuse after the beam splitter 1163. Yet another variation can be that a 3 dB coupler is used in place of the beam splitter 1163. When the 3 dB coupler is used, the effects almost like that of the sixteenth embodiment of he present invention are obtained although the optical output corresponding to the plane of polarization is not split precisely into two.

The seventeenth embodiment of this invention will be explained next. In the thirteenth to sixteenth embodiments semiconductor laser module of W (double) stripe type according to the ninth or eleventh embodiment is used but in the seventeenth embodiment two semiconductor laser device of single stripe type are used instead.

Figure 69:
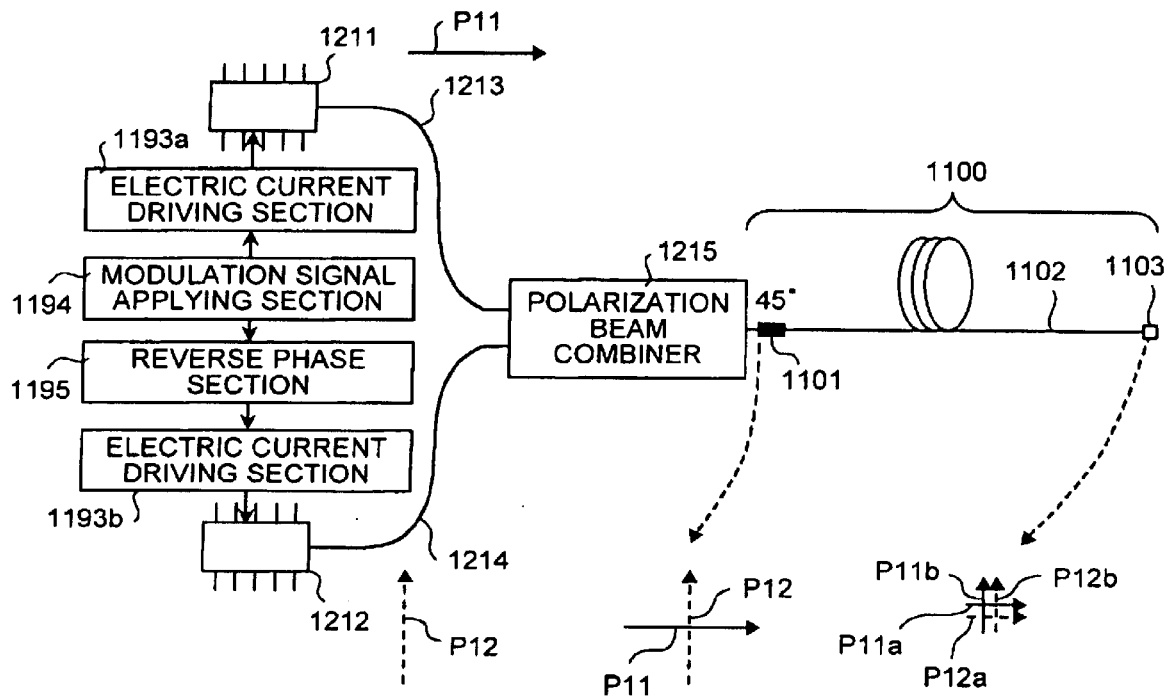
FIG. 69 shows a structure of a laser module according to the seventeenth embodiment of the present invention.

The structure of a laser module structure according the seventeenth embodiment is shown in FIG. 69. One semiconductor laser device 1091 is provided in the laser module shown in FIG. 62, whereas two semiconductor laser devices 1211 and 1212 are provided in the laser module shown in FIG. 69. In other words, the semiconductor laser device 1211 corresponds to stripe 1018a of the semiconductor laser device 1091 and the semiconductor laser device 1212 corresponds to stripe 1018b of the semiconductor laser device 1091. The electric current driving sections 1193a and 1193b, the modulation signal applying section 1194, the reverse phase section 1195, and the polarization beam combiner 1215 correspond respectively to the electric current driving sections 1093a and 1093b, the modulation signal applying section 1094, the reverse phase section 1095, and the polarization beam combining section 1092. The remaining components are common in both FIG. 62 and FIG. 69 and are assigned the same reference numerals.

Each of the semiconductor laser devices 1211 and 1212 emits a laser beam having a plurality of longitudinal oscillation modes with the same wavelength. The electric current driving sections 1193a and 1193b drive the semiconductor laser devices 1211 and 1212, respectively. The modulation signal applying section 1194 superposes and applies modulation frequency signal to the semiconductor laser devices 1211 and 1212. The reverse phase section 1195 reverses the phase of the modulation frequency signal applied to the semiconductor laser device 1212. Although two electric current driving sections 1193a and 1193b are shown in FIG. 69, one electric current driving section may be made to drive both the semiconductor laser devices 1211 and 1212.

Laser beams output from the semiconductor laser devices 1211 and 1212 are the same as laser beams output from the stripes 1018a and 1018b, respectively, of the semiconductor laser device 1091. Laser beams output from the semiconductor laser devices 1211 and 1212 are polarization multiplexed by a polarization beam combiner 1215 and depolarized by a depolarizer 1100. As a result, similar to the thirteenth embodiment, when the spectrum width of each longitudinal oscillation mode widens due to the modulation frequency signals, the threshold value of stimulated Brillouin scattering can be relatively increased. The threshold value of stimulated Brillouin scatterning increases further with the multiple longitudinal oscillation modes and even further due to depolarization. As a result a high output laser beam can be effectively realized. Further, the modulation frequency signals of opposite phases are offset as a result of depolarization, resulting in suppression of noise accompanying the modulation frequency signals.

Figure 70:
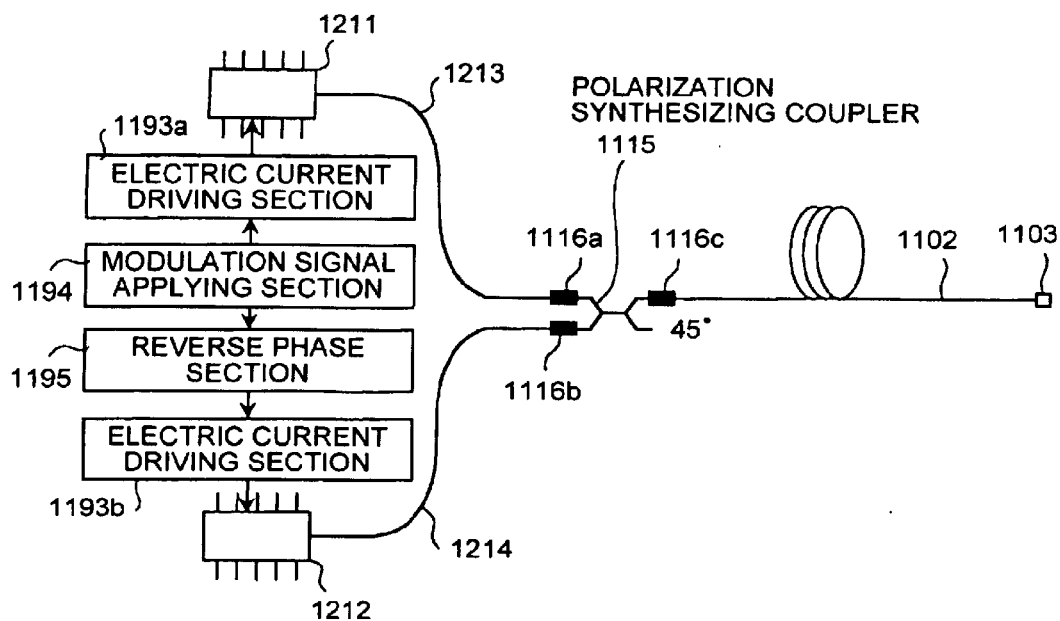
FIG. 70 shows the structure of a first variation of the laser module according to the seventeenth embodiment of the present invention.
Figure 71:
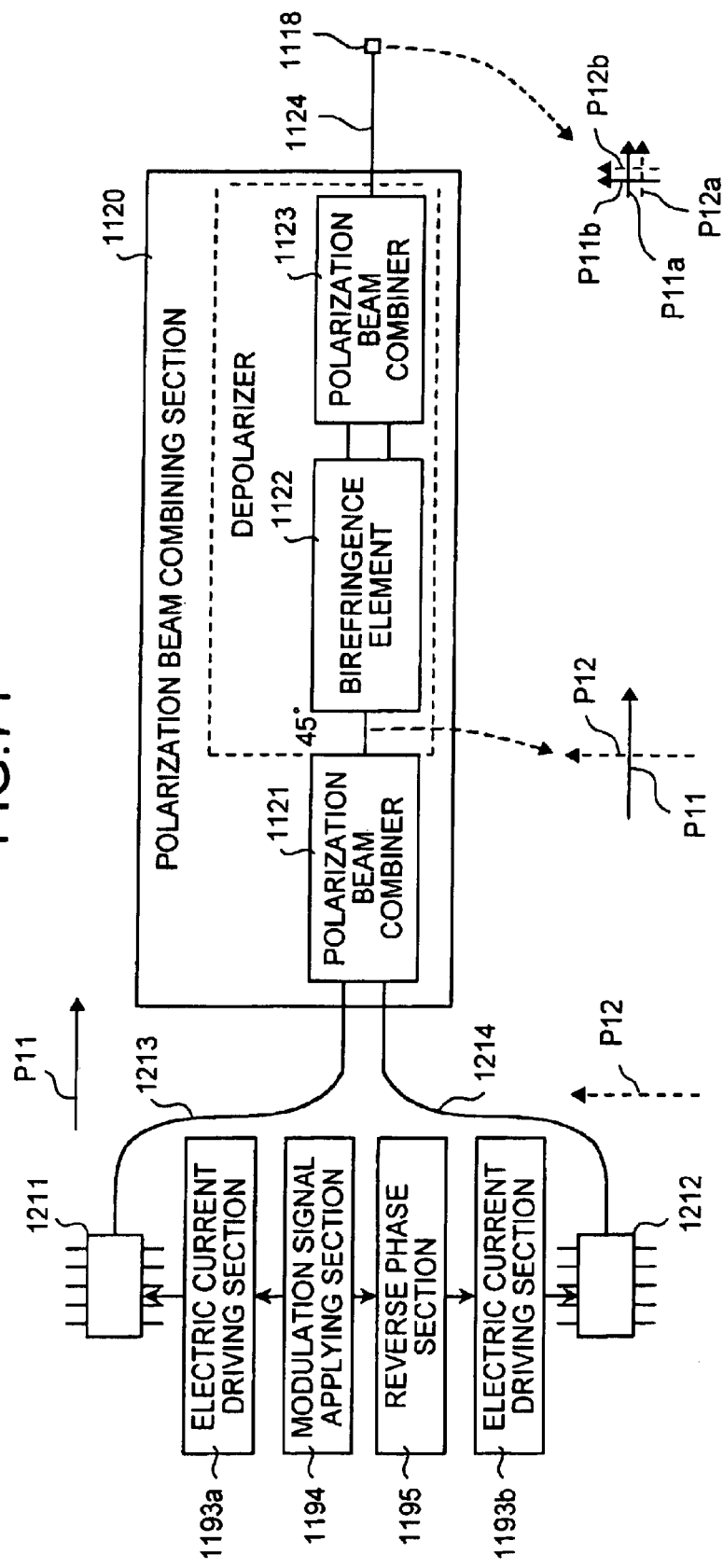
FIG. 71 shows the structure of a second variation of the laser module according to the seventeenth embodiment of the present invention.
Figure 72:
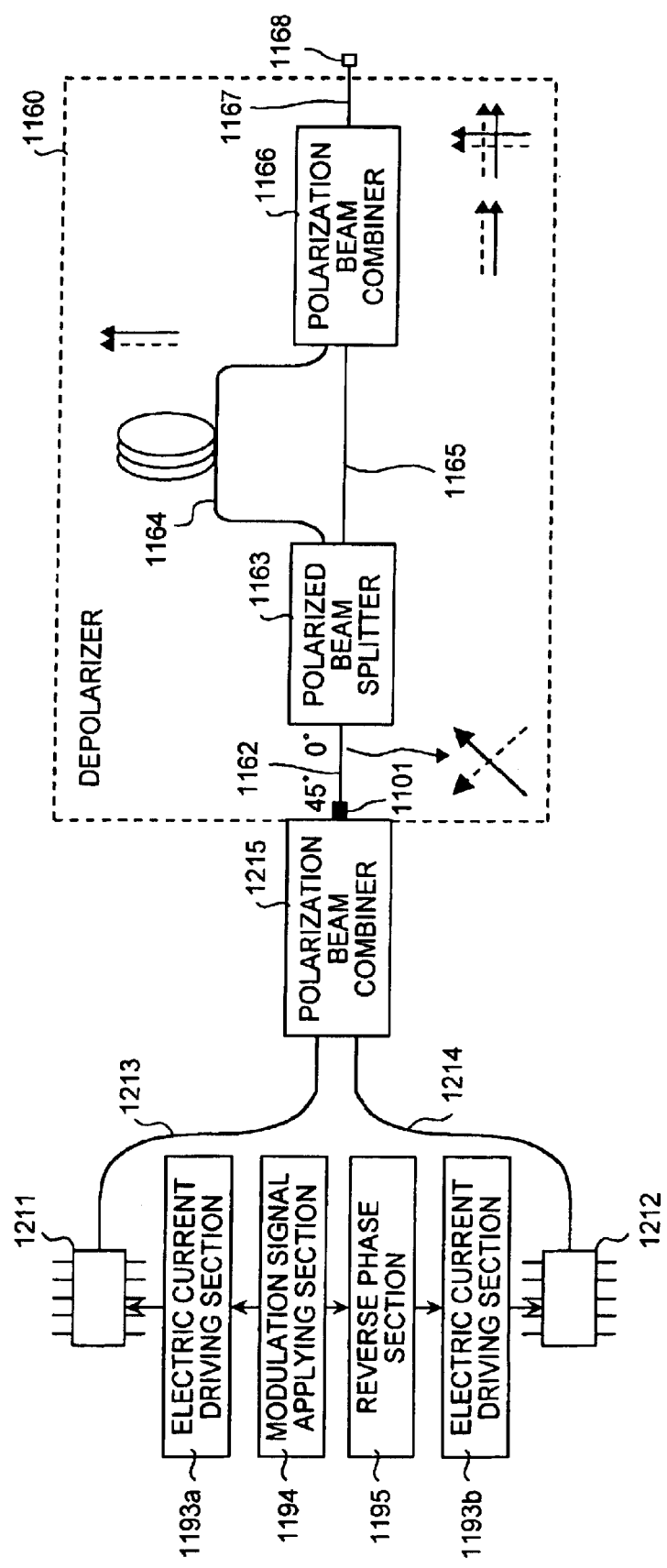
FIG. 72 shows the structure of a third variation of the laser module according to the seventeenth embodiment of the present invention.

The laser module shown in FIG. 70 is obtained by adapting the laser module according to the fourteenth embodiment to the seventeenth embodiment of the present invention, wherein a polarization beam combiner 1115 is provided. The laser module shown in FIG. 71 is obtained by adapting the laser module according to the fifteenth embodiment to the seventeenth embodiment of the present invention, wherein a birefringence element 1122 is provided in the polarization beam combining section 1120. The laser module shown in FIG. 72 is obtained by adapting the laser module according to the sixteenth embodiment to the seventeenth embodiment of the present invention, wherein a depolarizer 1160 is provided. Even though the structures shown in FIG. 70 to FIG. 72 are different, the action is identical to the laser module shown in FIG. 69.

Figure 73:
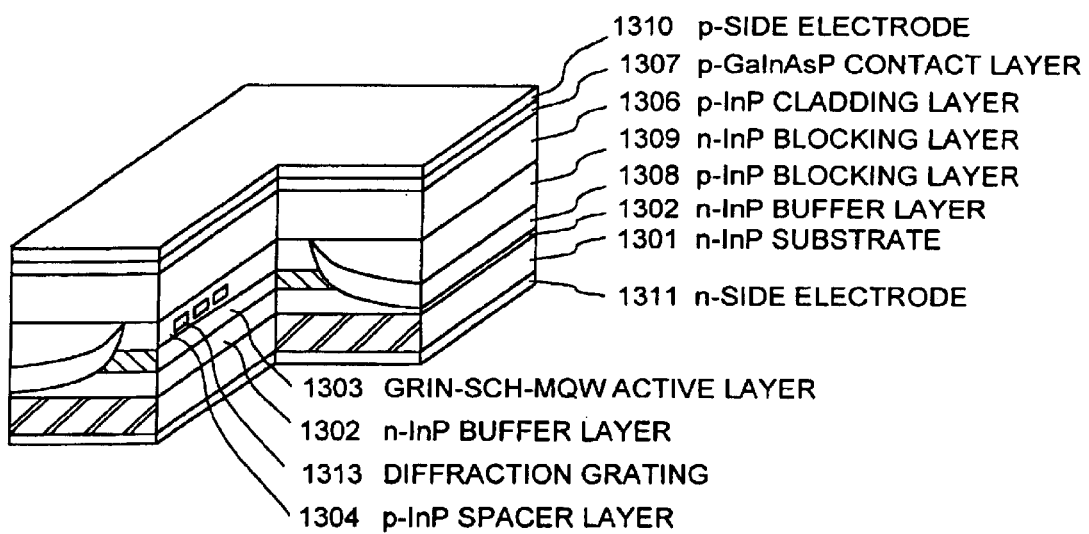
FIG. 73 is a cutaway view of a single stripe type semiconductor laser device that can output laser beam having a plurality of longitudinal oscillation modes.

FIG. 73 is a cutaway view of the semiconductor laser device 1211 or 1212. This semiconductor laser device comprises, from bottom up, an n-InP substrate 1301, an n-InP buffer layer 1302, a GRIN-SCH-MQW active layer 1303, and a p-InP spacer layer 1304. The upper section of the n-InP buffer layer 1302, the GRIN-SCH-MQW active layer 1303, and the p-InP spacer layer 1304 form a mesa stripe structure. This mesa stripe structure is oriented in the longitudinal direction of the direction of radiation. Adjacent to this structure a p-InP blocking layer 1308 and an n-InP blocking layer 1309 are arranged in order. A p-InP cladding layer 1306 and a p-GaInAsP contact layer 1307 are laminated on the p-InP blocking layer 1309 and the n-InP spacer layer 1304. Further, a p-side electrode 1310 is disposed on the p-GaInAsP contact layer 1307 and an n-side electrode 1311 is provided on the other surface of the n-InP substrate 1301. A diffraction grating 1313 is embedded in the p-InP spacer layer 1304. At the radiation end surface where the diffraction grating 1313 is embedded, a not shown low reflection film is disposed and at the reflection end surface opposite to the radiation end surface a not shown high reflection film is disposed. The n-InP buffer layer 1302 also functions as cladding layer.

GRIN-SCH-MQW active layer 1303 has a graded index-separate confinement hetero multi quantum well structure and it effectively confines carrier injected from the p-side electrode 1310 and the n-side electrode 1311. The GRIN-SCH-MQW active layer 1303 has multiple quantum well layers and shows a quantum confinement effect in each quantum well layer. High radiation efficiency of the light can be obtained by this confinement effect.

The p-GaInAsP contact layer 1307 allows ohmic contact between the p-InP cladding layer 1306 and the p-side electrode 1310. the p-GaInAsP contact layer 1307 is heavily doped with p-type impurities and by having high impurity density ohmic contact with the p-side electrode 1310 can be actualized.

The p-InP blocking layer 1308 and the n-InP blocking layer 1309 perform the function of preventing the injected electric current internally. As the p-side electrode functions as an anode, reverse bias is applied between the p-InP blocking layer 1309 and the n-InP blocking layer 1308 when voltage is applied. Therefore, the electric current does not flow from the n-InP blocking layer 1309 to the n-InP blocking layer 1308. The electric current injected from the p-side electrode is compressed and flows in the GRIN-SCH-MQW active layer 1303 effectively. Since the electric current flows effectively, the injected carrier becomes high in the GRIN-SCH-MQW active layer 1303 thereby making it possible to increase the radiation efficiency.

The high reflection film has a reflectivity which is greater than 80% and ideally, over 98%. On the other hand, the low reflection film prevents the reflection of laser beam at the radiation end surface. This low reflection film is composed of a film having a reflectivity of less than 5% or, ideally 1%. However, the low reflection film can have other reflectivity values as its reflectivity is optimized according to the resonator length.

The diffraction grating 1313 is composed of p-GaInAsP. Since it is composed of semiconductor material, which is different from the surrounding p-InP spacer layer 1304, among the laser beams generated from the GRIN-SCH-MQW active layer 1303, those that have a specific wavelength are reflected by the diffraction grating 1313.

The diffraction grating 1313 of length Lg=50 µm is provided from the low reflection end surface, where a not shown low reflection film of thickness 20 nm is provided, towards the high reflection end surface. The diffraction grating 1313 selects a laser beams that has a center wavelength of 1.48 µm that are issued periodically at a pitch of 220 nm. The linearity of driving current-optical output characteristics improves and a stable optical output obtained by keeping the product of the coupling factor κ of the diffraction grating 1313 and length Lg of the diffraction grating at 0.3 or less. See Patent No. 2000-134545 for details. When the resonator length L is 1300 µm, it is preferable to keep the length Lg of the diffraction grating to about 300 µm or less so that oscillation takes place in multiple longitudinal oscillation modes. The interval between the longitudinal oscillation modes changes proportionally with the resonator length L. Consequently, the length Lg of the diffraction grating will vary proportionally to the resonator length L. In other words, as the ratio of diffraction grating length Lg: resonator length L as 300:1300 is maintained, the relationship between Lg and L for obtaining multiple longitudinal modes by keeping the diffraction grating length Lg at 300 µm can be shown by the following expression $$Lg \times (1300(\mu m)/L) \leq 300(\mu m)$$

In other words, the diffraction grating length Lg varies proportionally to the resonator length L and is set such that it is 300/1300 times the resonator length L. See Patent No. 2000-134545 for details.

In the seventeenth embodiment, the semiconductor laser device need not be limited to the type that outputs multiple longitudinal oscillation mode laser beams. Even if the semiconductor laser device is of the Fabry-Perot type, multiple longitudinal oscillation mode laser beams are output. Further, the structures shown in FIG. 52 to FIG. 54 can be applied to the seventeenth embodiment.

Further, in the thirteenth to seventeenth embodiments, it is possible to include the depolarizer in the same chassis.

It is not necessary that the semiconductor laser devices 1211 and 1212 produce only the multiple longitudinal oscillation mode laser beams. For example, they may produce single mode laser beams as well. Irrespective of whether the semiconductor laser modules produce multiple mode or single mode laser beams, the resulting laser beams have a relatively high threshold value of stimulated Brillouin scattering as a result of widening of the spectrum line width due to modulation signal components. The threshold value of stimulated Brillouin scattering is further relatively pushed up by depolarization that occurs subsequent to polarization-multiplex. Also, the noise due to modulation frequency signals is reduced by offsetting the modulation frequency signals.

An optical fiber amplifier according to the eighteenth embodiment of the present invention will be explained. In the eighteenth embodiment, the semiconductor laser devices and laser modules according to the eighth to seventeenth embodiments are adapted to the Raman amplifier.

Figure 74:
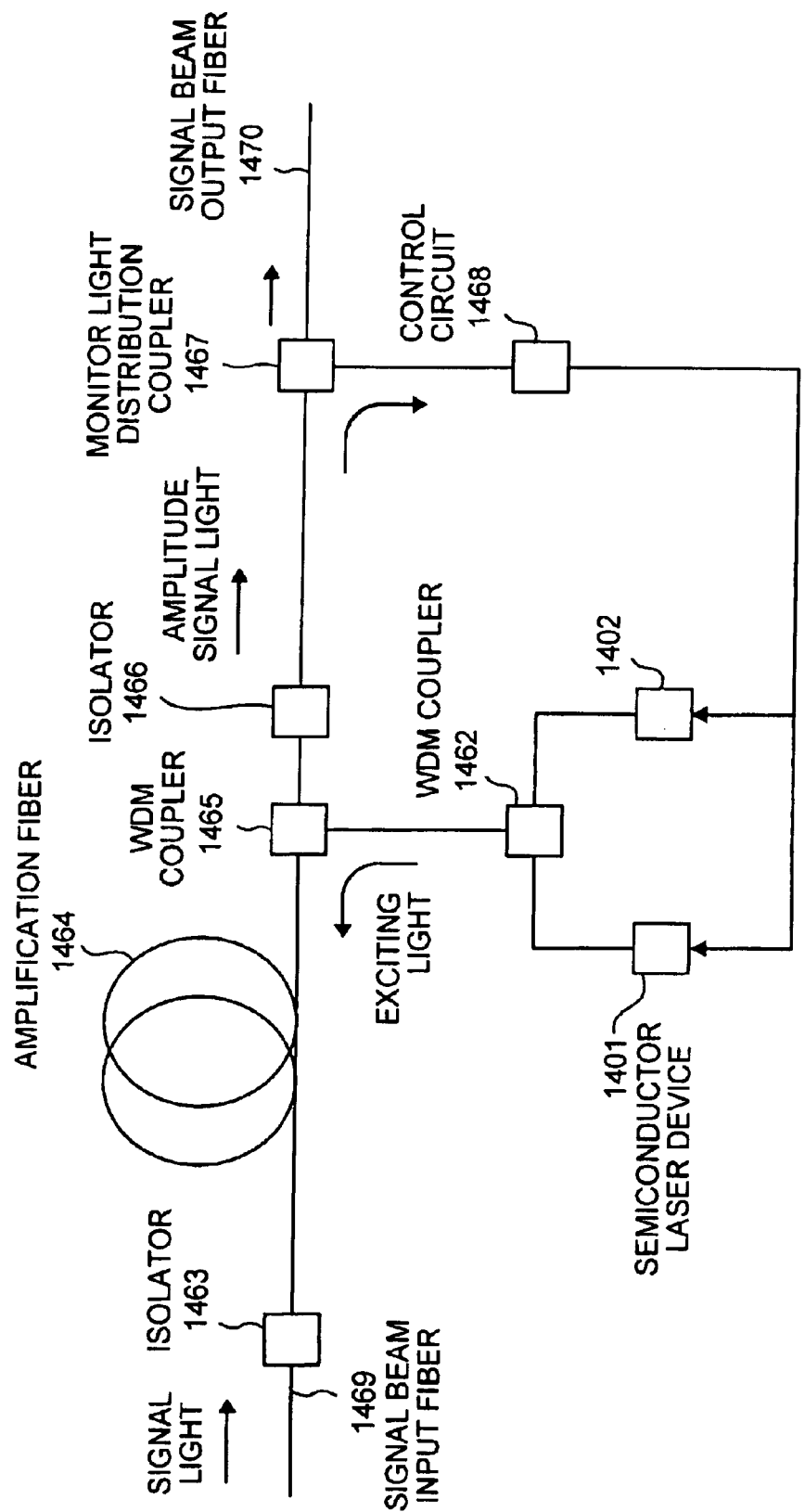
FIG. 74 shows an example of a Raman amplifier.

FIG. 74 is a block diagram of a Raman amplifier of the eighteenth embodiment of the present invention. This Raman amplifier is used in WDM communication system. The Raman amplifier shown in FIG. 74 includes semiconductor laser devices 1401 and 1402 that are structurally same as the semiconductor laser device, the semiconductor module or the laser module according to any of the eighth to seventeenth embodiments.

The laser beams output from the semiconductor laser devices 1401 and 1402 and subsequently depolarized have different wavelengths. The two depolarized laser beams are then coupled in a WDM coupler 1462. The coupled laser beam then enters another WDM coupler 1465 from which it is output to an amplification fiber 1465 as an exciting light. Signal light that is to be amplified enters the amplification fiber 1464 in which the exciting light has already entered and is Raman amplified.

The Raman amplified signal line (amplified signal light) first enters the WDM coupler 1465, then an isolator 1466, and then a monitor light distribution coupler 1467. The monitor light distribution coupler 1467 outputs one part of the amplified signal light to a control circuit 1468 and the remaining part to the signal light output fiber 1470 as an output laser beam.

The control circuit 1468 controls the intensity of the optical output by the semiconductor laser devices 1401 and 1402 based on the partial amplified signal light that enters the control circuit and by a feedback mechanism maintains a high-gain Raman amplification of the output laser beam.

As the semiconductor laser devices 1401 and 1402 are designed to output laser beams that are modulated by modulation frequency signals and further depolarized, the peak values of the longitudinal oscillation modes of the laser beams are minimized. As a result stimulated Brillouin scattering is eliminated due to which high exciting light output can be obtained. Consequently a stable and high-gain Raman amplification is achieved. Also, when reverse phase modulation frequency signals are applied, the modulation frequency signal components can be offset by depolarization that takes place after polarizationmultiplex. Hence an excitation light source that has reduced noise can be offered.

In the Raman amplifier shown in FIG. 74 the exciting light is excited backward. However, if stable exciting light is output, as output from the semiconductor laser devices 1401 and 1402, irrespective of whether it is forward-directed pumped, backward-directed pumped or bi-directional pumped, stable Raman amplification can be achieved.

Figure 75:
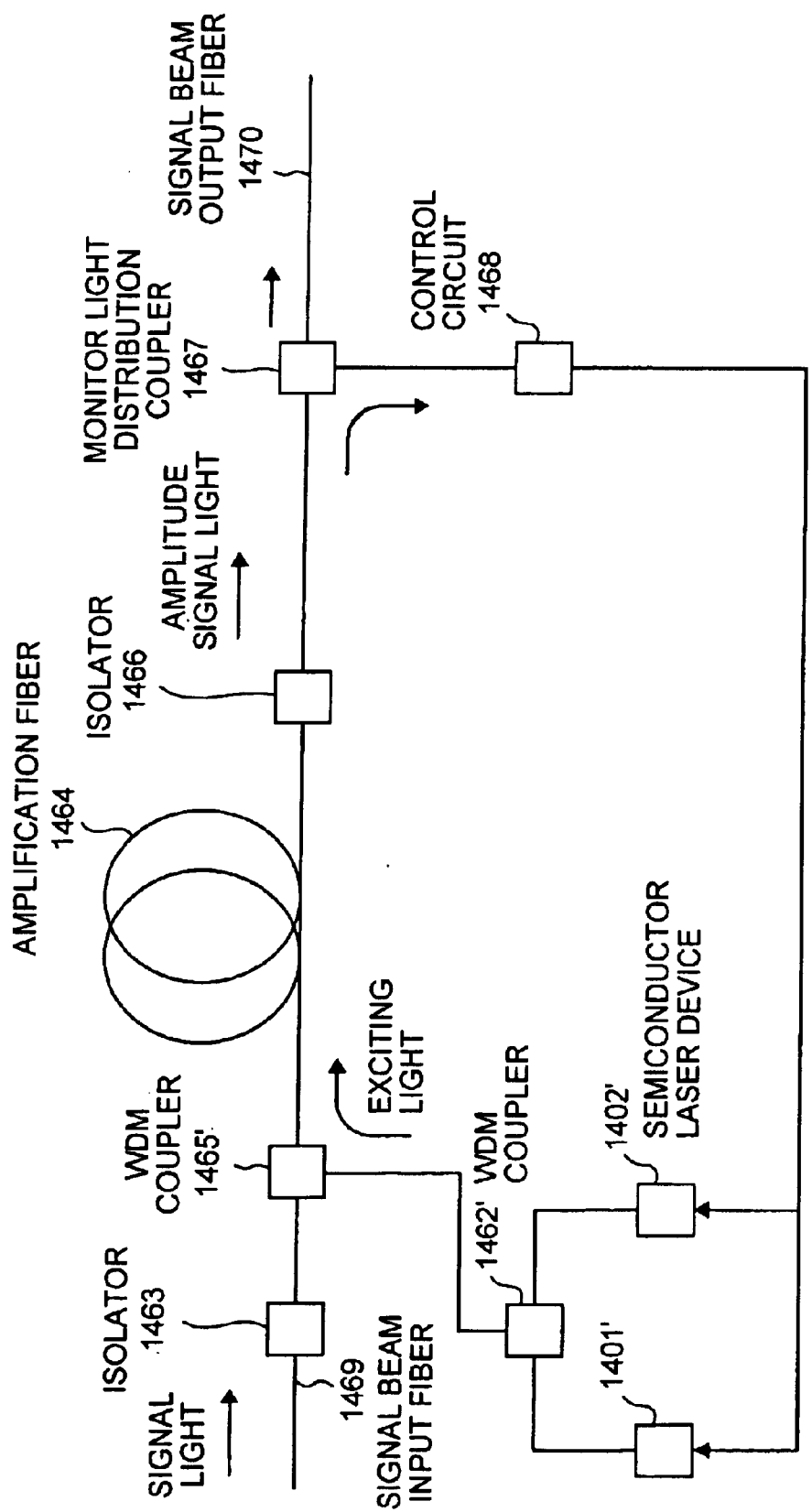
FIG. 75 shows another example of a Raman amplifier.

FIG. 75 is a block diagram of a Raman amplifier in which the exciting light is forward-directed. This Raman amplifier is exactly like the one shown in FIG. 74 except for the fact that the WDM coupler 1465' is provided next to the isolator 1463. The WDM coupler 1465' is connected to two semiconductor laser devices 1401' and 1402' that correspond to the semiconductor laser devices 1401 and 1402 in FIG. 74, and a WDM coupler 1462' that corresponds to the WDM coupler 1462 in FIG. 74. The exciting light that is output from the WDM coupler 1462' is in the same direction as the signal light. In other words, the exciting light is forward-directed.

Figure 76:
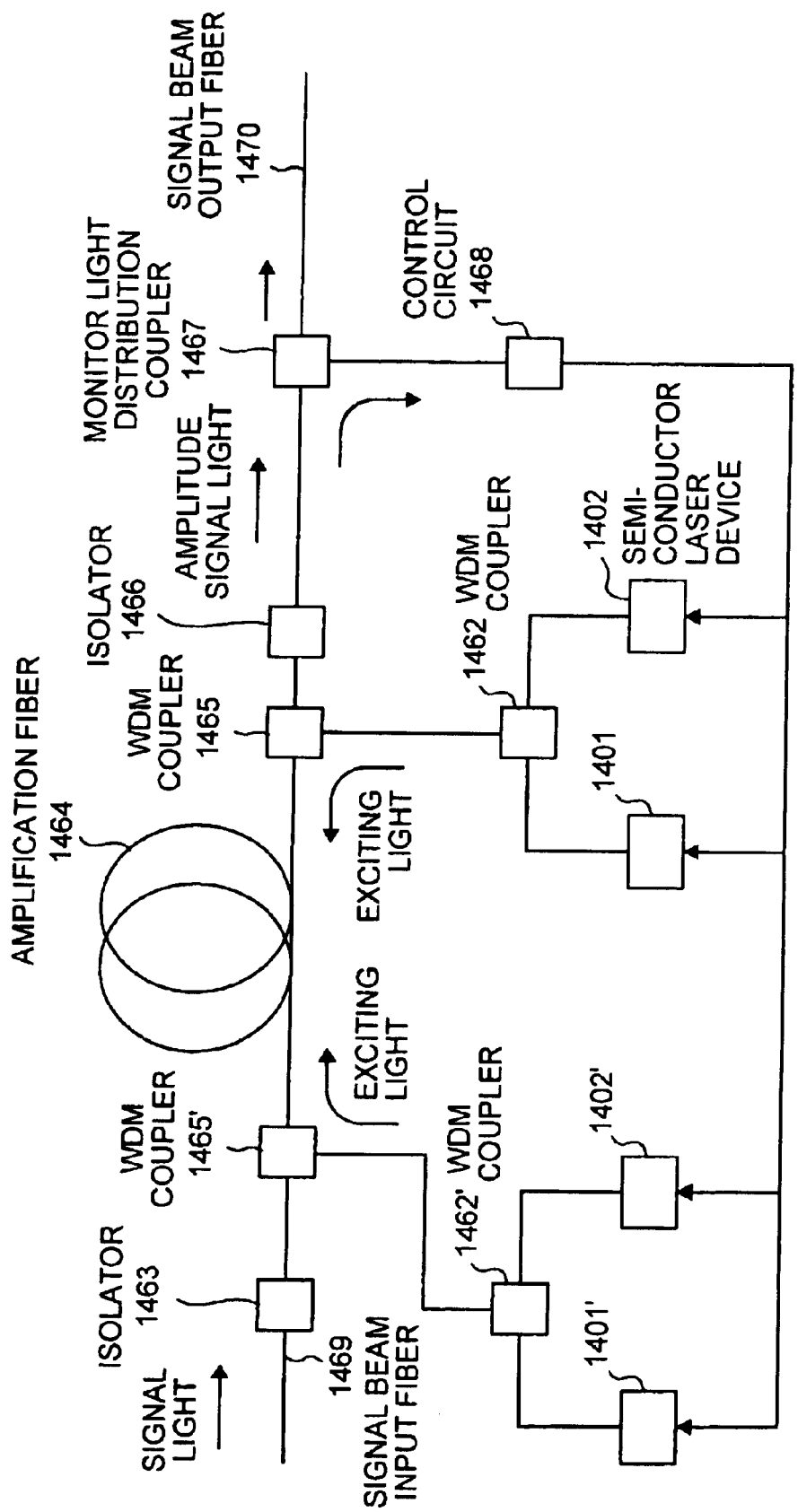
FIG. 76 shows still another example of a Raman amplifier.

FIG. 76 is a block diagram of a Raman amplifier in which the exciting light is bi-directional. This Raman amplifier has the structure of the Raman amplifier shown in FIG. 74 to which the WDM coupler 1465' and the two semiconductor laser devices 1401' and 1402' shown in FIG. 75 are provided additionally. Bi-directional exciting light is achieved thereby.

Figure 77:
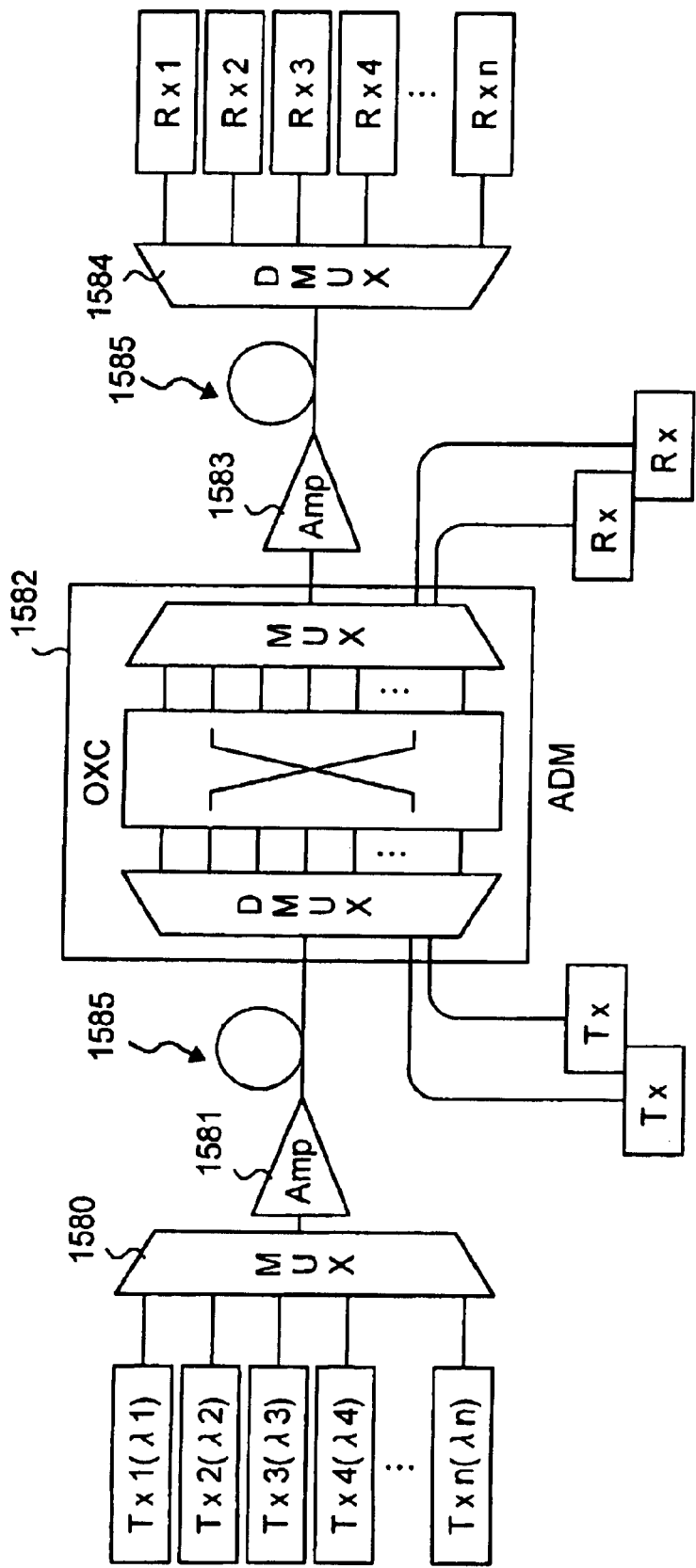
FIG. 77 is a schematic drawing of a WDM communication system.

It is acceptable even if, of the exciting lights in the two directions, the resonator length L of the exciting light in the forward direction may be less than 800 μm. Ordinarily, if the resonator length L is less than 800 μm, the interval Δλ between the longitudinal oscillation modes will become narrow, resulting in fewer longitudinal oscillation modes and consequently less optical output. However, in this case, since the forward directed exciting light has a comparatively lower output than the backward-directed exciting light, the resonator length L need not necessarily be 800 μm or greater. The Raman amplifiers shown in FIG. 74 to FIG. 76 can be adapted to the WDM communication system. FIG. 77 is a block diagram that shows a WDM communication system in which the Raman amplifiers according to FIG. 74 to FIG. 76 are adapted.

In FIG. 77, the light signals of wavelengths $\lambda_1$ to $\lambda_n$ that are transmitted from a plurality of transmitters Tx1 to Txn are coupled in a beam coupler 1580 and are integrated in one optical fiber 1585. A plurality of Raman amplifiers 1581 and 1583 shown in FIG. 74 to FIG. 76 that amplify week light signals are arranged in the transmission path of the optical fiber 1585 based on the distance and these amplifiers amplify the decaying signals. The light signal transmitted along the optical fiber 1585 is split into a plurality of light signals of wavelengths $\lambda_1$ to $\lambda_n$ by a beam branching filter 1584. The split light signals are received by a plurality of receivers Rx1 to Rxn. The optical fiber 1585 may be provided with an Add/Drop Multiplexer (ADM) with which light signals of any wavelength can be added or removed.

In the eighteenth embodiment described above, the semiconductor laser device, semiconductor laser module or laser module according to the eighth to the seventeenth embodiments have been used as an excitation light source for Raman amplification. However, apart from these, the EDFA of 0.98 μm may also be used. Particularly, in the EDFA in which the transmission distance of the exciting light up to the EDF is a few kilometers to a few dozen kilometers, the loss of amplification gain owing to stimulated Brillouin scattering occurring during transmission can be effectively suppressed. Besides, when using reverse phase modulation frequency signals, the modulation frequency signal components can also be suppressed. It is preferable to use modulation frequency signals that are far faster than the erbium ion transition time. For example, if the transition time of erbium ion is around 10 ms, EDFA system remains unaffected if modulation frequency signals of over 1 kHz are used.

According to the present invention, the semiconductor laser device has two types of diffraction gratings. As a result, the semiconductor laser can produce multiple longitudinal oscillation mode laser beams having two different center wavelengths.

According to the present invention, the semiconductor laser device has two types of diffraction gratings below the active layer. As a result, the semiconductor laser device can produce multiple longitudinal oscillation mode laser beams having two different center wavelengths is provided.

According to the present invention, the first diffraction grating and the second diffraction grating are embedded in different spacer layers. In other words, the first diffraction grating and the second diffraction grating are not embedded in one layer. Therefore, the possibility of formation of a composite resonator is eliminated According to the present invention, as current flow in the first and the second diffraction gratings is blocked by providing a current non-injection layer, change of refractive index of the gratings can be avoided, whereby change in the radiation wavelength can be prevented.

According to the present invention, by providing diffraction gratings under respective active layers in two stripe structures, multiple longitudinal oscillation mode laser beams having different center wavelengths can be realized.

According to the present invention, because the first electrode and the second electrode are electrically connected, equal amount of electricity is injected in the first stripe structure and the second stripe structure.

According to the present invention, an optical wave guide path layer is provided and one diffraction grating is embedded in the optical wave guide path layer. In this structure, the diffraction grating can be made independent of the active layer. This gives more flexibility in designing and manufacturing of a semiconductor laser device.

According to the present invention, it is ensured that two entirely independent laser beams with two distinctly different center wavelengths are emitted by setting the difference between the center wavelengths of the two laser beams as 3 nm or greater.

According to the present invention, effective amplification of signal light to exciting light is accomplished using an erbium-doped optical fiber amplifier by setting an upper and lower limit for the center wavelength.

According to the present invention, when the semiconductor laser device is used as an excitation light source, the sum of the absorption coefficients of the laser beams with the first center wave and the second center wave can be made constant by setting the first center wave less than the wavelength at which the absorption coefficient of the amplification optical fiber is maximum, and the second center wavelength is greater than the wavelength at which absorption coefficient of amplification optical fiber is maximum.

According to the present invention, the semiconductor laser device is able to emit laser beams without kinks as the product of coupling factor and diffraction grating length of the first diffraction grating and the second diffraction grating is 0.3 or less.

According to the present invention, the wavelength selection can be done easily because the radiation end surface section of at least one of the first diffraction grating and the second diffraction grating is in contact with the emission surface.

According to the present invention, the manufacturing process is simplified, the cost of manufacturing of the semiconductor laser module is reduced substantially, and high yield is obtained because of obviating the need for a temperature adjusting module and a temperature monitor in the semiconductor laser module.

According to the present invention, entry of reflected beam from the optical fiber back into the semiconductor laser device is suppressed due to the provision of an isolator.

According to the present invention, two laser beams having two different center wavelengths emitted from a semiconductor laser device having two stripe structures are multiplexed in a laser beam combining unit that has three ports.

According to the present invention, the wavelength of the laser beam obtained as a result of coupling two laser beams with different center wavelengths can be controlled because of the provision of a polarization rotating unit.

According to the present invention, an optical fiber amplifier in which the sum of the absorption coefficients of the laser beams with two different wavelengths that are used as exciting light is constant is presented.

According to the present invention, the change of wavelength with respect to the change in temperature is minimized by using a semiconductor laser device that emits two multiple longitudinal oscillation laser beams having different center wavelengths. Also, the amplification gain of the optical fiber amplifier with respect to change in temperature is stabilized by using two laser beams as exciting light.

According to the present invention, laser beams having oscillation wavelengths in the region of 980 nm or 1480 nm are effectively used as excitation light source by employing erbium-doped amplification optical fiber.

According to the present invention, in the semiconductor laser device having a W-stripe structure, since a modulation signal generated by the modulation unit is superposed on a bias current, an optical change of the resonator length occurs with the change of the refractive index of the active layer, the spectrum width of the longitudinal oscillation modes between the first laser beam and the second laser beam is widened, and the threshold value of the stimulated Brillouin scattering is heightened relatively with respect to the laser beam output. As a result, the stimulated Brillouin scattering can be suppressed and momentary emission wavelengths of the first laser beam and the second laser beam can be made different by the widening of the spectrum width.

According to the present invention, the semiconductor laser device having a W-stripe structure has a predetermined center wavelength due to provision of the diffraction grating and can select a laser beam having a plurality of longitudinal oscillation modes. Thus, the threshold value of the stimulated Brillouin scattering is heightened relatively with respect to the laser beam output. Moreover, since the modulation signal generated by the modulation unit is superposed on the bias current, an optical change of the resonator length occurs with the change of the refractive index of the active layer, the spectrum width of the longitudinal oscillation modes between the first laser beam and the second laser beam is widened, the threshold value of the stimulated Brillouin scattering is further heightened relatively with respect to the laser beam output, the stimulated Brillouin scattering can be suppressed, and momentary emission wavelengths of the first laser beam and the second laser beam can be made different by the widening of the spectrum width.

According to the present invention, since different electrodes are provided respectively to the active layers of the first stripe structure and the second stripe structure, different modulation signals can be superposed on the respective active layers, matching of a degree of polarization is avoided further, and DOP can be reduced.

According to the present invention, since a modulation signal is a sine-wave signal, widening of the noise component can be suppressed.

According to the present invention, the modulation signal generated by the modulation unit has electrical amplitude of 0.5–10% of the electrical amplitude of the bias current value, and hence the spectrum width of the laser beam can be set to any desired value.

According to the present invention, the modulation signal generated by the modulation unit has optical amplitude of 0.5–10% of the optical amplitude of the bias current value, and hence the spectrum width of the laser beam can be set to any desired value.

According to the present invention, the modulation signals generated by the first modulation unit and the second modulation unit have different frequencies, and this further eliminates matching of the degree of polarization of the respective laser beams, and hence the DOP can be reduced securely.

According to the present invention, the modulation signals generated by the first modulation unit and the second modulation unit have different phases, and this further eliminates matching of the degree of polarization of the respective laser beams, and hence the DOP can be reduced securely.

According to the present invention, the electrode or the first electrode is formed on the current non-injection area other than one section on the upper surface of the first stripe structure, and this makes the refractive index on the first stripe structure and the second stripe structure more distinct so that matching of the degree of polarization of the respective laser beams is eliminated securely, and hence the DOP can be reduced securely.

According to the present invention, the first laser beam and the second laser beam emitted from the semiconductor laser device are polarization-multiplexed so as to be output to the optical fiber so that the stimulated Brillouin scattering can be suppressed, and hence a laser beam having reduced DOP can be emitted.

According to the present invention, a depolarizer is provided to depolarize the output laser beam because of which the peak value of the optical output decreases. Further, the stimulated Brillouin scattering is suppressed. When the modulation signals superposed on the bias current injected into the first stripe structure and the second stripe structure have mutually reverse phase, the noise of the laser beam can be reduced because the modulation signal components are offset for each plane of polarization.

According to the present invention, the semiconductor laser module comprises a first semiconductor laser device that has a first active layer laminated on a semiconductor substrate and that emits a first laser beam, a second semiconductor laser device that has a second active layer laminated on the semiconductor substrate and that emits a second laser beam, an electric current bias unit that injects a bias current into the first active layer and the second active layer, a first modulation unit that generates a first modulation signal which modulates the bias current injected into the first active layer and superposes the first modulation signal on the bias current, a second modulation unit that generates a second modulation signal by dephasing the first modulation signal produced by the first modulation unit by 180° and superposes the second modulation signal on the bias current, a polarization beam combining unit that combines the first laser beam output from the first semiconductor laser device and the second laser beam output from the second semiconductor laser device, and a depolarizer that depolarizes the polarized laser beam output from the polarization beam combining unit. Hence during depolarization, the noise of the laser beam can be reduced because the modulation signal components are offset for each plane of polarization.

According to the present invention, the semiconductor laser module comprises a first semiconductor laser device that has a first active layer laminated on a semiconductor substrate and that emits a first laser beam, a second semiconductor laser device that has a second active layer laminated on the semiconductor substrate and that emits a second laser beam, an electric current bias unit that injects a bias current into the first active layer and the second active layer, a first modulation unit that generates a first modulation signal which modulates the bias current injected into the first active layer and superposes the first modulation signal on the bias current, a second modulation unit that generates a second modulation signal by dephasing the first modulation signal produced by the first modulation unit by 180° and superposes the second modulation signal on the bias current, a polarization beam combining unit that combines the first laser beam output from the first semiconductor laser device and the second laser beam output from the second semiconductor laser device, and a depolarizer that depolarizes the polarized laser beam output from the polarization beam combining unit. Hence during depolarization, the noise of the laser beam can be reduced because the modulation signal components are offset for each plane of polarization.

According to the present invention, the first modulation signal and the second modulation signal are sine-wave signals. Hence the noise component is restrained.

According to the present invention, the modulation signals generated by the first modulation unit and the second modulation unit have an electrical amplitude of 0.5–10% of the electrical amplitude of the bias current value, and hence the spectrum width of the laser beam can be set to any desired value.

According to the present invention, the modulation signals generated by the first modulation unit and the second modulation unit have an optical amplitude of 0.5–10% of the optical amplitude of the bias current value, and hence the spectrum width of the laser beam can be set to any desired value.

According to the present invention, a current non-injection area that suppresses the injected current is disposed in one area of the first active layer and the second active layer. Besides, the current non-injection area is above the first diffraction grating and the second diffraction grating. Hence the change in refractive index of the diffraction gratings can be suppressed and laser beams having desired oscillation wavelength can be obtained.

According to the present invention, the depolarizer is a polarization-maintaining optical fiber, and the input end of the polarization-maintaining optical fiber is connected in such a way that the axis of polarization of the polarization-maintaining optical fiber is rotated by 45° with respect to the axis of polarization of the laser beam output from the polarization beam combining unit. As a result, using a simple structure, stimulated Brillouin scattering and the noise in modulation signal components can be suppressed.

According to this invention, the polarizer uses a birefringence element that divides the input laser beam into two with two orthogonal planes of polarization and depolarizes the laser beam according to the difference in the refractive index; and a post-deflection polarization beam combiner that combines the laser beams output from the birefringence element. Hence the entire semiconductor module can be made compact.

According to the present invention, a polarization beam splitter that rotates the axis of polarization of the input laser beam by 45° and splits the polarization beam into two and the lengths of the polarization-maintaining fibers are such that the difference in the propagation times of the split laser beams in the two is greater than the coherent time. Therefore, even if the laser beam has a narrow spectrum line width, stimulated Brillouin scattering is suppressed and high output achieved.

According to the present invention, the laser beam has a spectrum of plurality of longitudinal oscillation modes, with the coherent time corresponding to the line width of each longitudinal oscillation mode. Therefore stimulated Brillouin scattering is suppressed and high output achieved.

According to the present invention, the polarization combining unit is a polarization beam combiner whose input and output terminals are fused in such a way as to maintain the polarization axes of the two polarization-maintaining fibers. Because of this, the structures other than the semiconductor laser device can be made from optical fibers. As a result, the entire structure can be miniaturized and made lightweight.

According to the present invention, the polarization beam combining unit and the depolarizer are housed in one chassis. As a result, the entire structure can be miniaturized and made lightweight.

According to the present invention, the polarization beam splitter is a 3 dB coupler. As a result, the structure can be simplified, stimulated Brillouin scattering suppressed and high output obtained.

According to the present invention, the optical fiber amplifier includes the semiconductor laser device according to claim 20 to 29 or the semiconductor laser module according to claim 30 to 44, an amplification optical fiber, and a coupler that combines the exciting light output from the semiconductor laser device or the semiconductor laser module and the signal light propagated inside the amplification optical fiber. As a result, stimulated Brillouin scattering is suppressed, the noise in modulation signal component is reduced and high output signal light can be obtained.

According to the present invention, the optical fiber amplifier amplifies the signal light by means of Raman amplifier. As a result a stable and high-gain amplification is achieved.

According to the present invention, the amplification optical fiber is an erbium-doped fiber, and the semiconductor laser device or the semiconductor laser module and the amplification optical fiber are disposed apart from each other. As a result, in EDFA in which remote pumping system is adopted, signal light can be sent over long distances without any reduction in the amplification gain.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device comprising:
a first conductive-type semiconductor substrate;
a first conductive-type semiconductor buffer layer laminated on the semiconductor substrate;
an active layer laminated on the semiconductor buffer layer;
a first electrode laminated above the active layer;
a second electrode disposed on the bottom surface of the semiconductor substrate;
a second conductive-type spacer layer laminated between the active layer and the first electrode;
a first diffraction grating embedded in one area in the second conductive-type spacer layer and possessing the ability to select a wavelength of a laser beam having a first center wavelength; and
a second diffraction grating embedded in another area in the second conductive-type spacer layer and possessing the ability to select a wavelength of a laser beam having a second center wavelength,
wherein the laser beam having the first center wavelength and the laser beam having the second center wavelength have a plurality of longitudinal oscillation modes.

2. The semiconductor laser device according to claims 1, wherein a current non-injection layer is disposed between the first diffraction grating and the first electrode, and the second diffraction grating and the first electrode.

3. The semiconductor laser device according to claim 1, wherein the difference between the first center wavelength and the second center wavelength is 3 nm or greater.

4. The semiconductor laser device according to claim 1, wherein the difference between the first center wavelength and the second center wavelength during laser oscillation is between 940 nm and 1020 nm.

5. The semiconductor laser device according to claim 1, wherein, during laser oscillation, the first center wavelength is less than the wavelength at which absorption coefficient of amplification optical fiber is maximum, and the second center wavelength is greater than the wavelength at which absorption coefficient of amplification optical fiber is maximum.

6. The semiconductor laser device according to claim 1, wherein the product of coupling factor and diffraction grating length of the first diffraction grating and the second diffraction grating is 0.3 or less.

7. The semiconductor laser device according to claim 1, wherein the radiation end surface section of at least one of the first diffraction grating and the second diffraction grating is in contact with the emission surface.

8. A semiconductor laser device comprising:
a first conductive-type semiconductor substrate;
a first conductive-type semiconductor buffer layer laminated on the semiconductor substrate;
an active layer laminated on the semiconductor buffer layer, a first electrode laminated above the active layer;
a second electrode disposed on the bottom surface of the semiconductor substrate;
a first conductive-type spacer layer laminated between the semiconductor buffer layer and the active layer;
a first diffraction grating embedded in one area in the first conductive-type spacer layer and possessing the ability to select a wavelength of a laser beam having a first center wavelength; and
a second diffraction grating embedded in another area in the first conductive-type spacer layer and possessing the ability to select a wavelength of a laser beam having a second center wavelength,
wherein the laser beam having the first center wavelength and the laser beam having the second center wavelength have a plurality of longitudinal oscillation modes.

9. The semiconductor laser device according to claims 8, wherein a current non-injection layer is disposed between the first diffraction grating and the first electrode, and the second diffraction grating and the first electrode.

10. The semiconductor laser device according to claim 8, wherein the difference between the first center wavelength and the second center wavelength is 3 nm or greater.

11. The semiconductor laser device according to claim 8, wherein the difference between the first center wavelength and the second center wavelength during laser oscillation is between 940 nm and 1020 nm.

12. The semiconductor laser device according to claim 8, wherein, during laser oscillation, the first center wavelength is less than the wavelength at which absorption coefficient of amplification optical fiber is maximum, and the second center wavelength is greater than the wavelength at which absorption coefficient of amplification optical fiber is maximum.

13. The semiconductor laser device according to claim 8, wherein the product of coupling factor and diffraction grating length of the first diffraction grating and the second diffraction grating is 0.3 or less.

14. The semiconductor laser device according to claim 8, wherein the radiation end surface section of at least one of the first diffraction grating and the second diffraction grating is in contact with the emission surface.

15. A semiconductor laser device comprising:
a first conductive-type semiconductor substrate;
a first conductive-type semiconductor buffer layer laminated on the semiconductor substrate;
an active layer laminated on the semiconductor buffer layer;
a first electrode laminated above the active layer;
a second electrode disposed on the bottom surface of the semiconductor substrate;
a first conductive-type spacer layer laminated between the semiconductor buffer layer and the active layer;
a first diffraction grating embedded in one area in the first conductive-type spacer layer and possessing the ability to select a wavelength of a laser beam having a first center wavelength; and
a second conductive-type spacer layer laminated between the active layer and the first electrode; and
a second diffraction grating embedded in one area in the second conductive-type spacer layer and possessing the ability to select a wavelength of a laser beam having a second center wavelength,
wherein the laser beam having the first center wavelength and the laser beam having the second center wavelength have a plurality of longitudinal oscillation modes.

16. The semiconductor laser device according to claims 15, wherein a current non-injection layer is disposed between the first diffraction grating and the first electrode, and the second diffraction grating and the first electrode.

17. The semiconductor laser device according to claim 15, wherein the difference between the first center wavelength and the second center wavelength is 3 nm or greater.

18. The semiconductor laser device according to claim 15, wherein the difference between the first center wavelength and the second center wavelength during laser oscillation is between 940 nm and 1020 nm.

19. The semiconductor laser device according to claim 15, wherein, during laser oscillation, the first center wavelength is less than the wavelength at which absorption coefficient of amplification optical fiber is maximum, and the second center wavelength is greater than the wavelength at which absorption coefficient of amplification optical fiber is maximum.

20. The semiconductor laser device according to claim 15, wherein the product of coupling factor and diffraction grating length of the first diffraction grating and the second diffraction grating is 0.3 or less.

21. The semiconductor laser device according to claim 15, wherein the radiation end surface section of at least one of the first diffraction grating and the second diffraction grating is in contact with the emission surface.

22. A semiconductor laser device comprising:
a first stripe structure comprising:
a first spacer layer laminated on one area of a semiconductor substrate;
a first diffraction grating embedded in one area in the first spacer layer, the first diffraction grating possessing the ability to select a wavelength of a first laser beam having a first center wavelength;
a first active layer configured to radiate light;
a first electrode disposed above the first active layer; and
a second stripe structure comprising:
a second spacer layer laminated on another area of the semiconductor substrate;

a second diffraction grating embedded in one area in the second spacer layer, the diffraction grating possessing the ability to select a wavelength of a second laser beam having a second center wavelength;

a second active layer configured to radiate light; and a second electrode disposed above the second active layer, wherein the first laser beam and the second laser beam have a plurality of longitudinal oscillation modes.

23. The semiconductor laser device according to claim 22, wherein the first electrode and the second electrode are electrically connected, and an approximately equal amount of electric current is injected in the first active layer and the second active layer.

24. The semiconductor laser device according to claim 22, wherein the difference between the first center wavelength and the second center wavelength is 3 nm or greater.

25. The semiconductor laser device according to claim 22, wherein the difference between the first center wavelength and the second center wavelength during laser oscillation is between 940 nm and 1020 nm.

26. The semiconductor laser device according to claim 22, wherein, during laser oscillation, the first center wavelength is less than the wavelength at which absorption coefficient of amplification optical fiber is maximum, and the second center wavelength is greater than the wavelength at which absorption coefficient of amplification optical fiber is maximum.

27. The semiconductor laser device according to claim 22, wherein the product of coupling factor and diffraction grating length of the first diffraction grating and the second diffraction grating is 0.3 or less.

28. The semiconductor laser device according to claim 22, wherein the radiation end surface section of at least one of the first diffraction grating and the second diffraction grating is in contact with the emission surface.

\* \* \* \* \*